(12) United States Patent
Karhade et al.

(10) Patent No.: US 11,373,972 B2
(45) Date of Patent: Jun. 28, 2022

(54) MICROELECTRONIC STRUCTURES INCLUDING BRIDGES

(71) Applicant: Intel Corporation, Santa Clara, CA (US)

(72) Inventors: Omkar G. Karhade, Chandler, AZ (US); Nitin A. Deshpande, Chandler, AZ (US); Mohit Bhatia, Chandler, AZ (US); Anurag Tripathi, Gilbert, AZ (US); Takeshi Nakazawa, Phoenix, AZ (US); Steve Cho, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 16/902,887

(22) Filed: Jun. 16, 2020

(65) Prior Publication Data

US 2021/0391294 A1 Dec. 16, 2021

(51) Int. Cl.
*H01L 23/538* (2006.01)
*H01L 23/00* (2006.01)

(52) U.S. Cl.
CPC .......... *H01L 24/30* (2013.01); *H01L 23/5384* (2013.01); *H01L 24/17* (2013.01); *H01L 2224/1703* (2013.01)

(58) Field of Classification Search
None
See application file for complete search history.

(56) References Cited

U.S. PATENT DOCUMENTS

| 10,535,608 | B1* | 1/2020 | Rubin | ...................... H01L 23/12 |
| 11,094,637 | B2* | 8/2021 | Rubin | .................. H01L 21/481 |
| 2010/0013092 | A1* | 1/2010 | Eda | ......................... H01L 24/13 |
| | | | | 257/737 |
| 2011/0177311 | A1* | 7/2011 | Manabe | .................. C08K 5/20 |
| | | | | 428/213 |
| 2020/0035603 | A1* | 1/2020 | Rubin | ...................... H01L 23/04 |
| 2021/0134728 | A1* | 5/2021 | Rubin | ................ H01L 23/5385 |
| 2021/0265275 | A1* | 8/2021 | Rubin | ................ H01L 23/5381 |

OTHER PUBLICATIONS

U.S. Appl. No. 16/902,768, filed Jun. 16, 2020, Microelectronic Structures Including Bridges.
U.S. Appl. No. 16/902,927, filed Jun. 16, 2020, Microelectronic Structures Including Bridges.
U.S. Appl. No. 16/902,910, filed Jun. 16, 2020, Microelectronic Structures Including Bridges.
U.S. Appl. No. 16/902,777, filed Jun. 16, 2020, Multichip Semiconductor Package Including a Bridge Die Disposed in a Cavity Having Non-Planar Interconnects (Title Amended).
U.S. Appl. No. 16/902,958, filed Jun. 16, 2020, Microelectronic Structures Including Bridges.
U.S. Appl. No. 16/902,959, filed Jun. 16, 2020, Microelectronic Structures Including Bridges.

\* cited by examiner

*Primary Examiner* — Bo B Jang
(74) *Attorney, Agent, or Firm* — Patent Capital Group

(57) ABSTRACT

Disclosed herein are microelectronic structures including bridges, as well as related assemblies and methods. In some embodiments, a microelectronic structure may include a substrate and a bridge.

18 Claims, 25 Drawing Sheets

MICROELECTRONIC STRUCTURES INCLUDING BRIDGES

BACKGROUND

In conventional microelectronic packages, a die may be attached to an organic package substrate by solder. Such a package may be limited in the achievable interconnect density between the package substrate and the die, the achievable speed of signal transfer, and the achievable miniaturization, for example.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
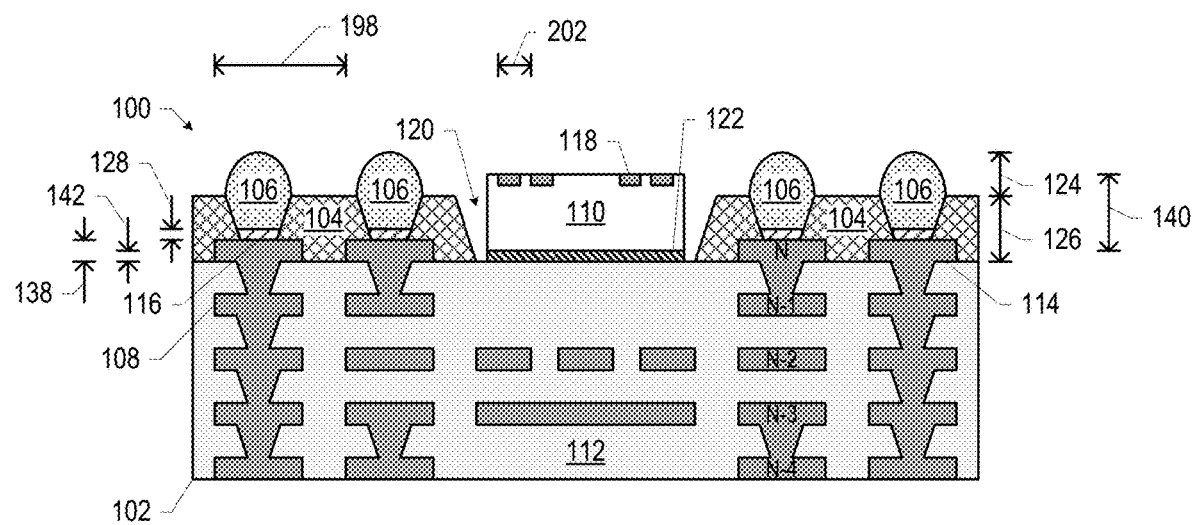
FIG. 1 is a side, cross-sectional view of an example microelectronic structure, in accordance with various embodiments.

Disclosed herein are microelectronic structures including bridges, as well as related assemblies and methods. In some embodiments, a microelectronic structure may include a substrate and a bridge in a cavity of the substrate. Microelectronic components may be coupled to both the substrate and the bridge.

To achieve high interconnect density in a microelectronics package, some conventional approaches require costly manufacturing operations, such as fine-pitch via formation and first-level interconnect plating in substrate layers over an embedded bridge, done at panel scale. The microelectronic structures and assemblies disclosed herein may achieve interconnect densities as high or higher than conventional approaches without the expense of conventional costly manufacturing operations. Further, the microelectronic structures and assemblies disclosed herein offer new flexibility to electronics designers and manufacturers, allowing them to select an architecture that achieves their device goals without excess cost or manufacturing complexity.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

FIG. 1 is a side, cross-sectional view of an example microelectronic structure 100. The microelectronic structure 100 may include a substrate 102 and a bridge component 110 in a cavity 120 at a "top" face of the substrate 102. The substrate 102 may include a dielectric material 112 and conductive material 108, with the conductive material 108 arranged in the dielectric material 112 (e.g., in lines and vias, as shown) to provide conductive pathways through the substrate 102. In some embodiments, the dielectric material 112 may include an organic material, such as an organic buildup film. In some embodiments, the dielectric material 112 may include a ceramic, an epoxy film having filler particles therein, glass, an inorganic material, or combinations of organic and inorganic materials, for example. In some embodiments, the conductive material 108 may include a metal (e.g., copper). In some embodiments, the substrate 102 may include layers of dielectric material 112/conductive material 108, with lines of conductive material 108 in one layer electrically coupled to lines of conductive material 108 in an adjacent layer by vias of the conductive material 108. A substrate 102 including such layers may be formed using a printed circuit board (PCB) fabrication technique, for example. A substrate 102 may include N such layers, where N is an integer greater than or equal to one; in the accompanying drawings, the layers are labeled in descending order from the face of the substrate 102 closest to the cavity 120 (e.g., layer N, layer N-1, layer N-2, etc.). Although a particular number and arrangement of layers of dielectric material 112/conductive material 108 are shown in various ones of the accompanying figures, these particular numbers and arrangements are simply illustrative, and any desired number and arrangement of dielectric material 112/conductive material 108 may be used. For example, although FIG. 1 and others of the accompanying drawings do not illustrate conductive material 108 in layer N-1 under the bridge component 110, conductive material 108 may be present in layer N-1 under the bridge component 110. Further, although a particular number of layers are shown in the substrate 102 (e.g., five layers), these layers may represent only a portion of the substrate 102, and further layers may be present (e.g., layers N-5, N-6, etc.).

As noted above, a microelectronic structure 100 may include a cavity 120 at the "top" face of the substrate 102. In the embodiment of FIG. 1, the cavity 120 extends through a surface insulation material 104 at the "top" face, and the bottom of the cavity is provided by the "topmost" dielectric material 112. The surface insulation material 104 may include a solder resist and/or other dielectric materials that may provide surface electrical insulation and may be compatible with solder-based or non-solder based interconnects, as appropriate. In other embodiments, a cavity 120 in a substrate 102 may extend into the dielectric material 112, as discussed further below. The cavity 120 may have a tapered shape, as shown in FIG. 1, narrowing towards the bottom of the cavity 120. The substrate 102 may include conductive contacts 114 at the "top" face that are coupled to conductive pathways formed by the conductive material 108 through the dielectric material 112, allowing components electrically coupled to the conductive contacts 114 (not shown in FIG. 1, but discussed below with reference to FIG. 2) to circuitry within the substrate 102 and/or to other components electrically coupled to the substrate 102. The conductive contacts 114 may include a surface finish 116, which may protect the underlying material of the conductive contact from corrosion. In some embodiments, the surface finish 116 may include nickel, palladium, gold, or a combination thereof. The conductive contacts 114 may be located at the "top" face and outside the cavity 120; as shown, the surface insulation material 104 may include openings at the bottom of which the surface finishes 116 of the conductive contacts 114 are exposed. In FIG. 1, solder 106 (e.g., a solder ball) may be disposed in the openings, and in conductive contact with the conductive contacts 114. As shown in FIG. 1 and others of the accompanying drawings, these openings in the surface insulation material 104 may be tapered, narrowing towards the conductive contacts 114. In some embodiments, the solder 106 on the conductive contacts 114 may be first-level interconnects, while in other embodiments, non-solder first-level interconnects may be used to electrically couple the conductive contacts 114 to another component. As used herein, a "conductive contact" may refer to a portion of conductive material (e.g., one or more metals) serving as part of an interface between different components; although some of the conductive contacts discussed herein are illustrated in a particular manner in various ones of the accompanying drawings, any conductive contacts may be recessed in, flush with, or extending away from a surface of a component, and may take any suitable form (e.g., a conductive pad or socket).

A bridge component 110 may be disposed in the cavity 120, and may be coupled to the substrate 102. This coupling may include electrical interconnects or may not include electrical interconnects; in the embodiment of FIG. 1, the bridge component 110 is mechanically coupled to the dielectric material 112 of the substrate 102 by an adhesive 122 (e.g., a die-attach film (DAF)) between the "bottom" face of the bridge component 110 and the substrate 102, while other types of couplings are described elsewhere herein. The bridge component 110 may include conductive contacts 118 at its "top" face; as discussed below with reference to FIG. 2, these conductive contacts 118 may be used to electrically couple the bridge component 110 to one or more other microelectronic components. The bridge component 110 may include conductive pathways (e.g., including lines and vias, as discussed below with reference to FIG. 59) to the conductive contacts 118 (and/or to other circuitry included in the bridge component 110 and/or to other conductive contacts of the bridge component 110, as discussed below). In some embodiments, the bridge component 110 may include a semiconductor material (e.g., silicon); for example, the bridge component 110 may be a die 1502, as discussed below with reference to FIG. 58, and may include an integrated circuit (IC) device 1600, as discussed below with reference to FIG. 59. In some embodiments, the bridge component 110 may be an "active" component in that it may contain one or more active devices (e.g., transistors), while in other embodiments, the bridge component 110 may be a "passive" component in that it does not contain one or more active devices. The bridge component 110 may be manufactured so as to permit a greater density of interconnects than the substrate 102. Consequently, the pitch 202 of the conductive contacts 118 of the bridge component 110 may be less than the pitch 198 of the conductive contacts 114 of the substrate 102. When multiple microelectronic components are coupled to the bridge component 110 (e.g., as discussed below with reference to FIG. 2), these microelectronic components may use the electrical pathways through the bridge component 110 (and may use other circuitry within the bridge component 110, when present) to achieve a higher density interconnection between them, relative to interconnections made via the conductive contacts 114 of the substrate 102.

The dimensions of the elements of a microelectronic structure 100 may take any suitable values. For example, in some embodiments, the thickness 138 of the metal lines of the conductive contacts 114 may be between 5 microns and 25 microns. In some embodiments, the thickness 128 of the surface finish 116 may be between 5 microns and 10 microns (e.g., 7 microns of nickel and less than 100 nanometers of each of palladium and gold). In some embodiments, the thickness 142 of the adhesive 122 may be between 2 microns and 10 microns. In some embodiments, the pitch 202 of the conductive contacts 118 of the bridge component 110 may be less than 70 microns (e.g., between 25 microns and 70 microns, between 25 microns and 65 microns, between 40 microns and 70 microns, or less than 65 microns). In some embodiments, the pitch 198 of the conductive contacts 114 may be greater than 70 microns (e.g., between 90 microns and 150 microns). In some embodiments, the thickness 126 of the surface insulation material 104 may be between 25 microns and 50 microns. In some embodiments, the height 124 of the solder 106 above the surface insulation material 104 may be between 25 microns and 50 microns. In some embodiments, the thickness 140 of the bridge component 110 may be between 30 microns and 200 microns. In some embodiments, a microelectronic structure 100 may have a footprint that is less than 100 square millimeters (e.g., between 4 square millimeters and 80 square millimeters).

Figure 2:
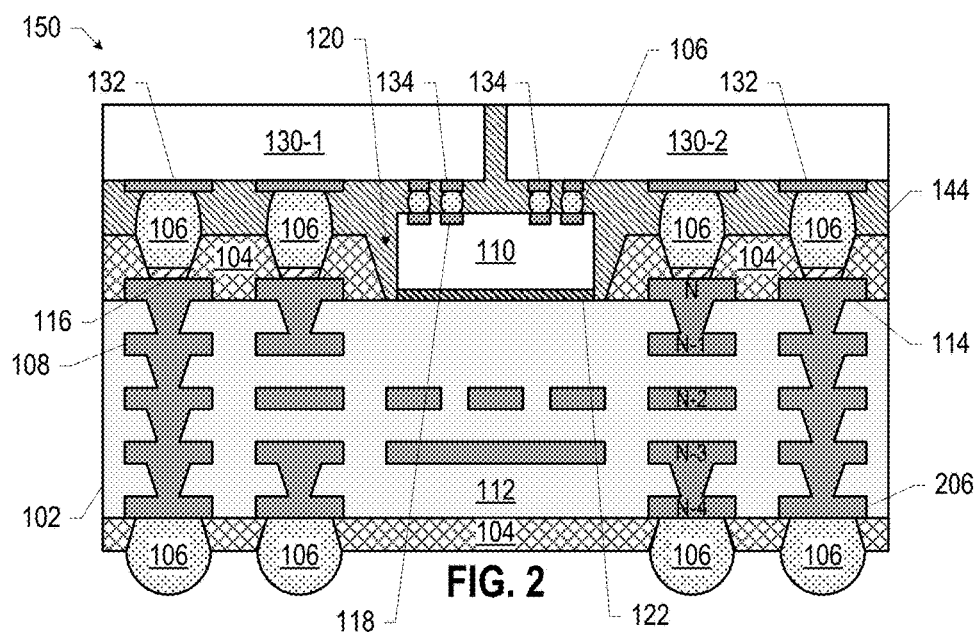
FIG. 2 is a side, cross-sectional view of an example microelectronic assembly including the microelectronic structure of FIG. 1, in accordance with various embodiments.

A microelectronic structure 100, like that of FIG. 1 and others of the accompanying drawings, may be included in a larger microelectronic assembly. FIG. 2 illustrates an example of such a microelectronic assembly 150, which may include one or more microelectronic components 130 having conductive contacts 134 coupled to the conductive contacts 118 of the bridge component 110 (e.g., by solder 106 or another interconnect structure) and conductive contacts 132 coupled to the conductive contacts 114 of the substrate 102 (e.g., by solder 106 or another interconnect structure, as discussed above). FIG. 2 illustrates two microelectronic components 130 (the microelectronic components 130-1 and 130-2), but a microelectronic assembly 150 may include more or fewer microelectronic components 130. Although FIG. 2 depicts the microelectronic components 130-1/130-2 as substantially "covering" the proximate surface of the microelectronic structure 100, this is simply an illustration, and need not be the case. Further, although FIGS. 1 and 2 (and others of the accompanying drawings) depict microelectronic structures 100/microelectronic assemblies 150 that include a single bridge component 110 in a substrate 102, this is simply for ease of illustration, and a microelectronic structure 100/microelectronic assembly 150 may include multiple bridge components 110 in a substrate 102.

The microelectronic components 130 may include conductive pathways (e.g., including lines and vias, as discussed below with reference to FIG. 59) to the conductive contacts 132/134 (and/or to other circuitry included in the microelectronic component 130 and/or to other conductive contacts of the microelectronic component 130, not shown). In some embodiments, a microelectronic component 130 may include a semiconductor material (e.g., silicon); for example, a microelectronic component 130 may be a die 1502, as discussed below with reference to FIG. 58, and may include an IC device 1600, as discussed below with reference to FIG. 59. In some embodiments, the microelectronic component 130 may be an "active" component in that it may contain one or more active devices (e.g., transistors), while in other embodiments, the microelectronic component 130 may be a "passive" component in that it does not contain one or more active devices. In some embodiments, for example, a microelectronic component 130 may be a logic die. More generally, the microelectronic components 130 may include circuitry to perform any desired functionality. For example, one or more of the microelectronic components 130 may be logic dies (e.g., silicon-based dies), and one or more of the microelectronic components 130 may be memory dies (e.g., high bandwidth memory). As discussed above with reference to FIG. 1, when multiple microelectronic components 130 are coupled to the bridge component 110 (e.g., as shown in FIG. 2), these microelectronic components 130 may use the electrical pathways through the bridge component 110 (and may use other circuitry within the bridge component 110, when present) to achieve a higher density interconnection between them, relative to interconnections made via the conductive contacts 114 of the substrate 102.

As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, a mold material 144 may be disposed between the microelectronic structure 100 and the microelectronic components 130, and may also be between the microelectronic components 130 and above the microelectronic components 130 (not shown). In some embodiments, the mold material 144 may include multiple different types of mold materials, including an underfill material between the microelectronic components 130 and the microelectronic structure 100 and a different material disposed above and at side faces of the microelectronic components 130. Example materials that may be used for the mold material 144 include epoxy materials, as suitable.

The microelectronic assembly 150 also illustrates a surface insulation material 104 at the "bottom" face of the substrate 102 (opposite to the "top" face), with tapered openings in the surface insulation material 104 at the bottoms of which conductive contacts 206 are disposed. Solder 106 may be disposed in these openings, in conductive contact with the conductive contacts 206. The conductive contacts 206 may also include a surface finish (not shown). In some embodiments, the solder 106 on the conductive contacts 206 may be second-level interconnects (e.g., solder balls for a ball grid array arrangement), while in other embodiments, non-solder second-level interconnects (e.g., a pin grid array arrangement or a land grid array arrangement) may be used to electrically couple the conductive contacts 206 to another component. The conductive contacts 206/solder 106 (or other second-level interconnects) may be used to couple the substrate 102 to another component, such as a circuit board (e.g., a motherboard), an interposer, or another IC package, as known in the art and as discussed below with reference to FIG. 60. In embodiments in which the microelectronic assembly 150 includes multiple microelectronic components 130, the microelectronic assembly 150 may be referred to as a multi-chip package (MCP). A microelectronic assembly 150 may include additional components, such as passive components (e.g., surface-mount resistors, capacitors, and inductors disposed at the "top" face or the "bottom" face of the substrate 102), active components, or other components.

FIGS. 3-10 are side, cross-sectional views of various stages in an example process for the manufacture of the microelectronic assembly 150 of FIG. 2, in accordance with various embodiments. Although the operations of the process of FIGS. 3-10 (and the processes of others of the accompanying drawings, discussed below) may be illustrated with reference to particular embodiments of the microelectronic structures 100/microelectronic assemblies 150 disclosed herein, the method 1000 may be used to form any suitable microelectronic structures 100/microelectronic assemblies 150. Operations are illustrated once each and in a particular order in FIGS. 3-10, but the operations may be reordered and/or repeated as desired (e.g., with different operations performed in parallel when manufacturing multiple microelectronic structures 100/microelectronic assemblies 150).

Figure 3:
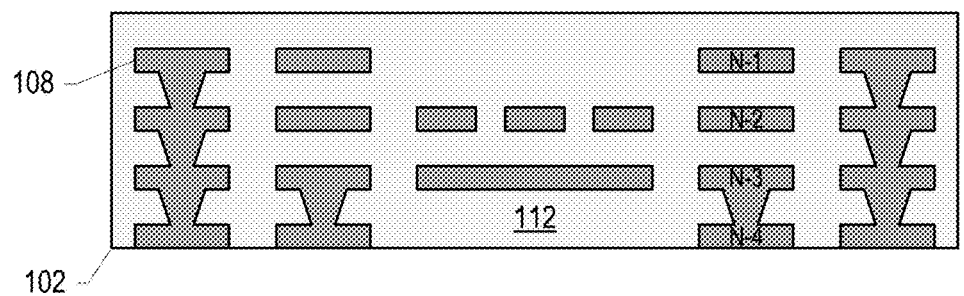
FIGS. 3-10 are side, cross-sectional views of various stages in an example process for the manufacture of the microelectronic assembly of FIG. 2, in accordance with various embodiments.

FIG. 3 illustrates an assembly that includes a preliminary substrate 102 including dielectric material 112 and patterned conductive material 108. The assembly of FIG. 3 may be manufactured using conventional package substrate manufacturing techniques (e.g., lamination of layers of the dielectric material 112, etc.), and may include layers up to N–1.

Figure 4:
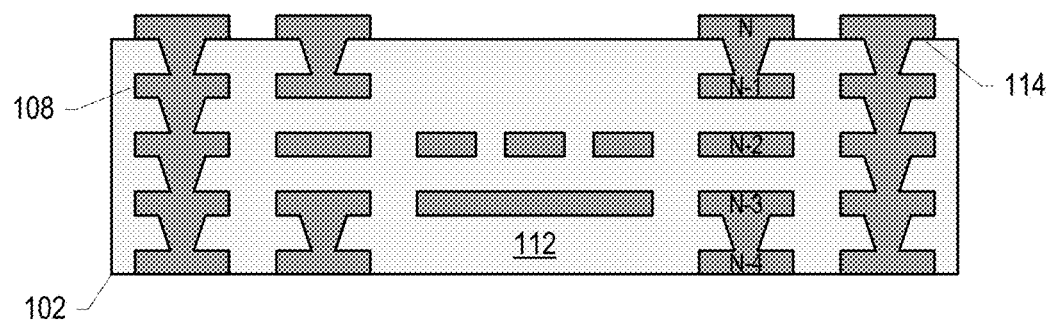

FIG. 4 illustrates an assembly subsequent to fabricating an additional Nth layer for the preliminary substrate 102 of FIG. 4. The assembly of FIG. 4 includes the underlying metal of the conductive contacts 114. The assembly of FIG. 4 may be manufactured using conventional package substrate manufacturing techniques.

Figure 5:
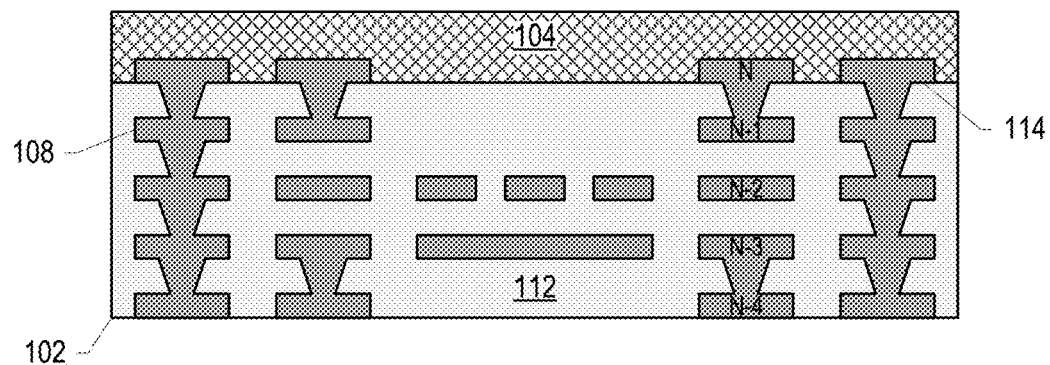

FIG. 5 illustrates an assembly subsequent to former a layer of surface insulation material 104 on the assembly of FIG. 4.

Figure 6:
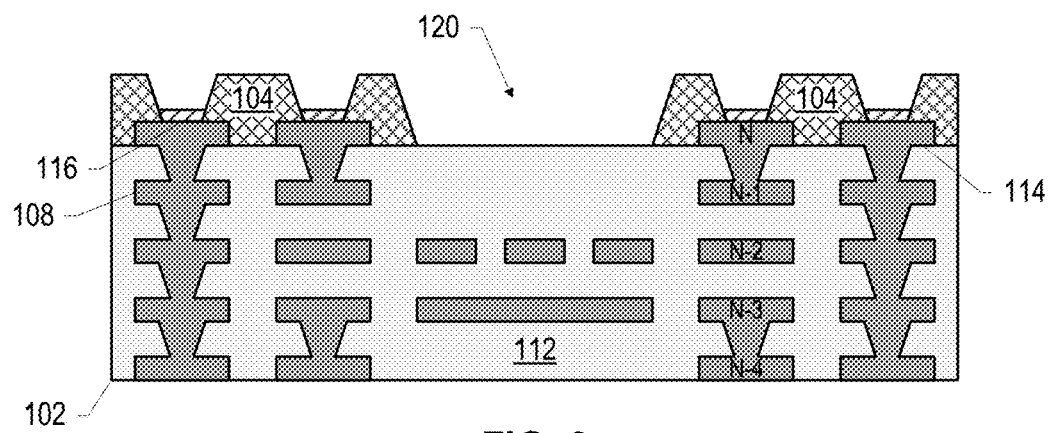

FIG. 6 illustrates an assembly subsequent to patterning openings in the surface insulation material 104 of the assembly of FIG. 5 to expose the underlying metal of the conductive contacts 114, forming the surface finish 116 of the conductive contacts 114, and forming the cavity 120. In some embodiments, the openings in the surface insulation material 104 (including the cavity 120) may be formed by mechanical patterning, laser patterning, dry etch patterning, or lithographic patterning techniques. When a laser or mechanical patterning technique is used to form the cavity 120, the bottom of the cavity 120 may include undulations having an amplitude between 1 micron and 10 microns; when a lithographic patterning technique is used to form the cavity 120, the bottom of the cavity 120 may include undulations having an amplitude that is less than 1 micron. In some embodiments in which the cavity 120 is laser-patterned, some edge roughness due to laser beam overlap may be present (e.g., with an amplitude between 1 micron and 25 microns).

Figure 7:
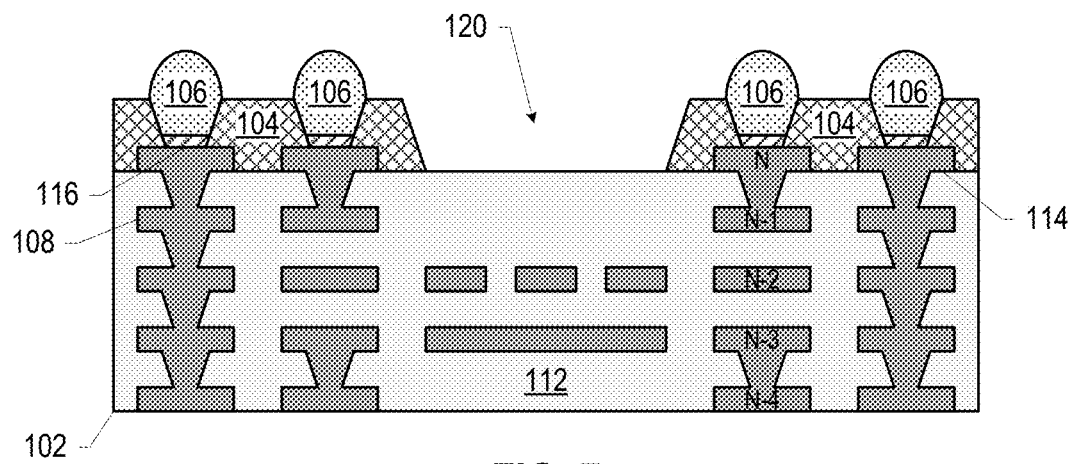

FIG. 7 illustrates an assembly subsequent to performing a clean operation on the assembly of FIG. 6, and forming the solder 106 (e.g., microballs) on the conductive contacts 114.

Figure 8:
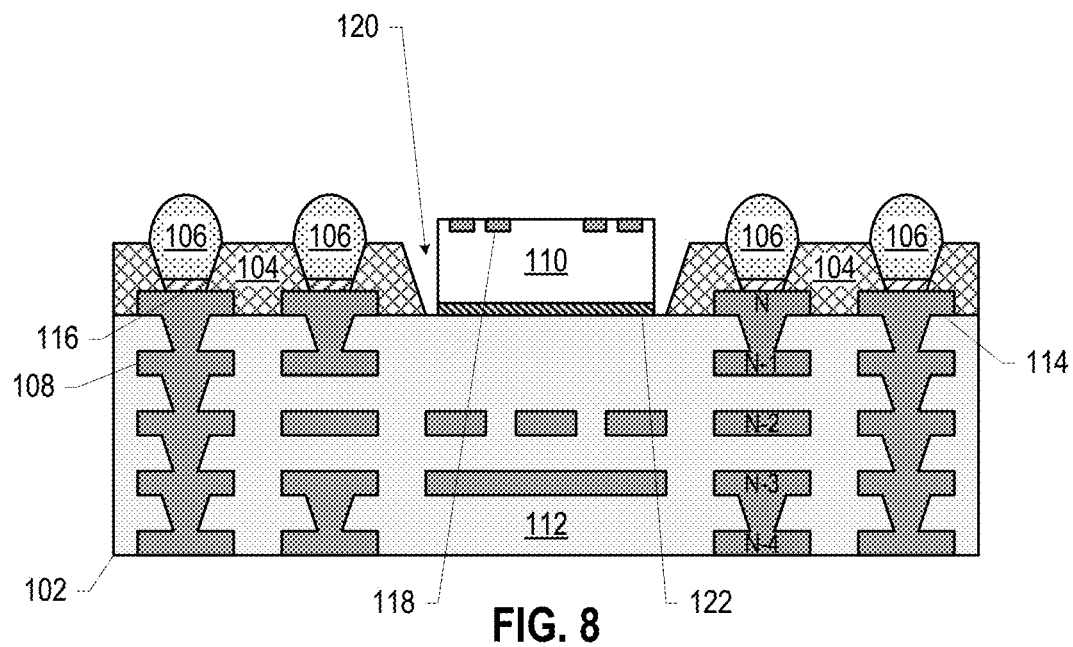

FIG. 8 illustrates an assembly subsequent to attaching the bridge component 110 to the exposed dielectric material 112 of the cavity 120 of the assembly of FIG. 7, using the adhesive 122. In some embodiments, the adhesive 122 may be a DAF, and attaching the bridge component 110 may include performing a film cure operation. The assembly of FIG. 8 may take the form of the microelectronic structure 100 of FIG. 1.

Figure 9:
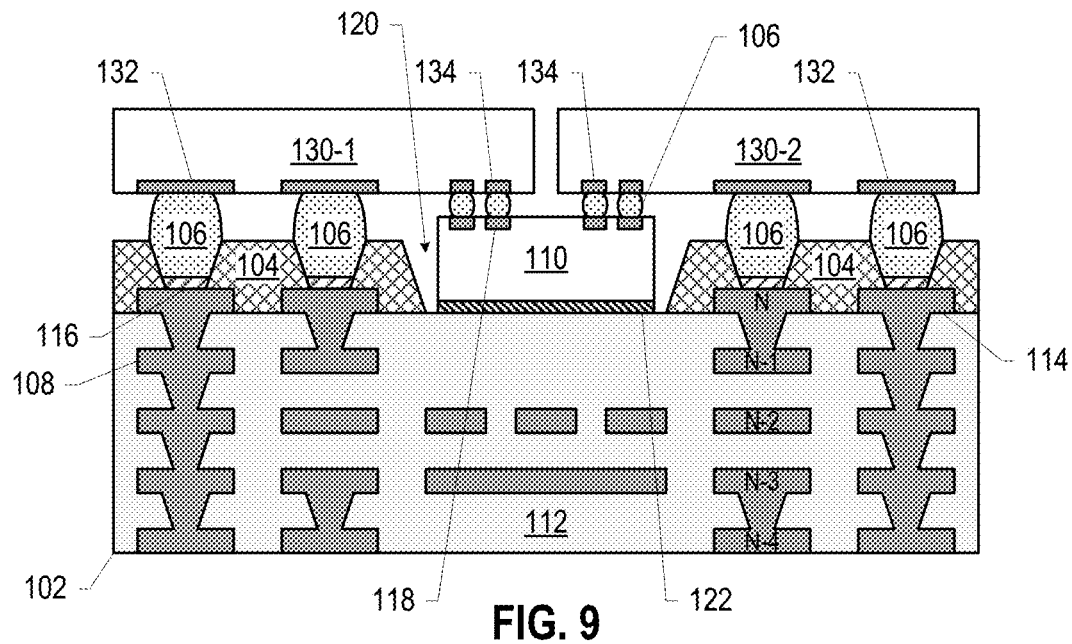

FIG. 9 illustrates an assembly subsequent to attaching the microelectronic components 130 to the assembly of FIG. 8.

In some embodiments, this attachment may include a thermocompression bonding (TCB) operation. In some embodiments, additional solder may be provided on the conductive contacts 118, the conductive contacts 132, and/or the conductive contacts 134 before the TCB operation.

Figure 10:
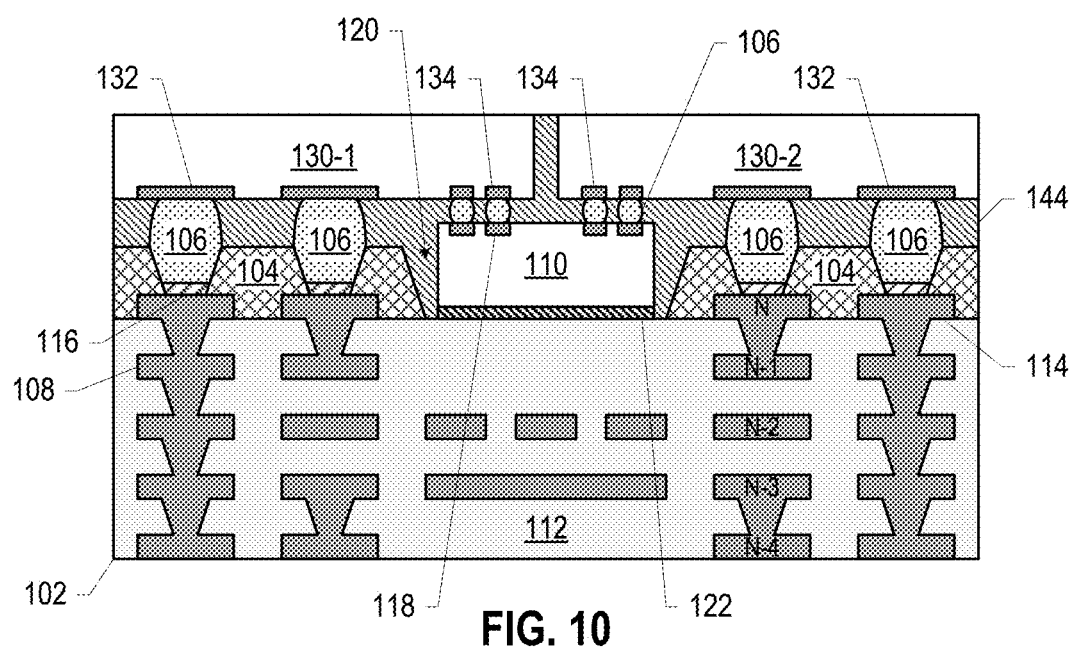

FIG. 10 illustrates an assembly subsequent to providing the mold material 144 to the assembly of FIG. 9. As noted above, in some embodiments, the mold material 144 of FIG. 10 may include multiple different materials (e.g., a capillary underfill material between the microelectronic components 130 and the microelectronic structure 100, and a different material over the microelectronic components 130). The assembly of FIG. 10 may take the form of the microelectronic assembly 150 of FIG. 2. As discussed above, the mold material 144 may include an underfill material (e.g., a capillary underfill material).

Figure 57:
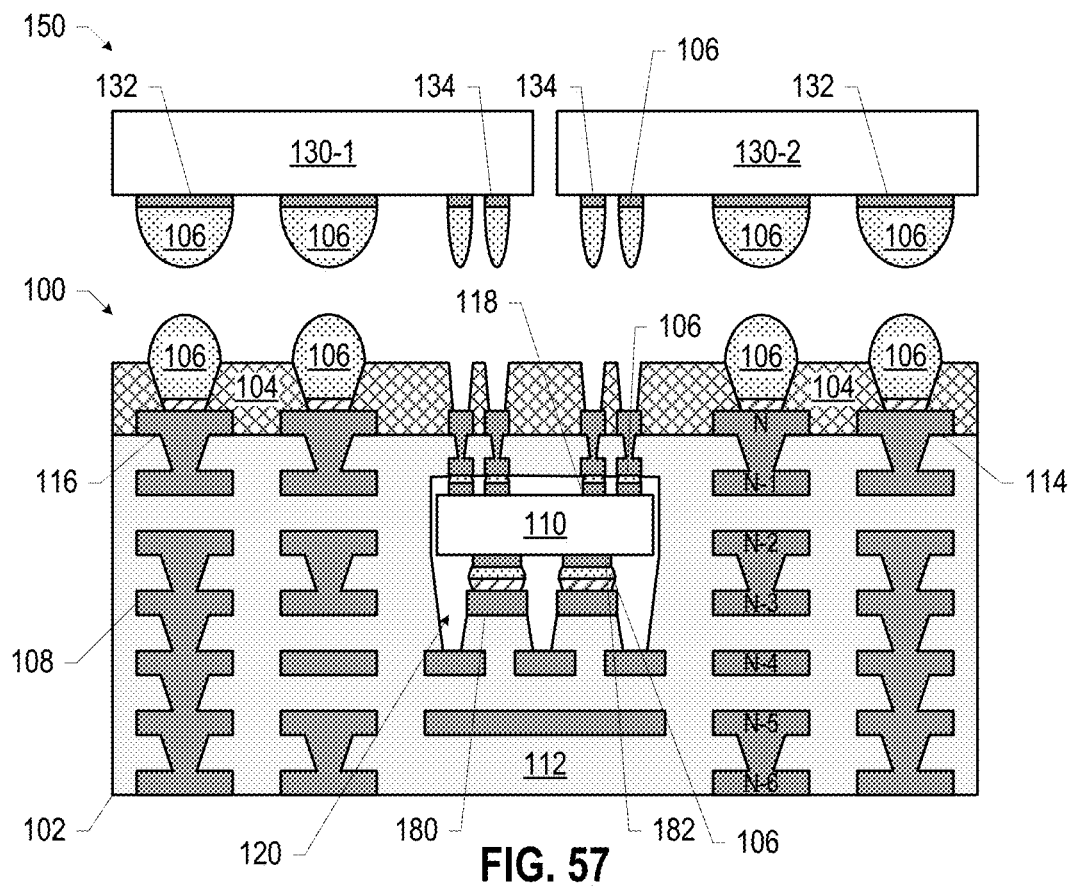

Various ones of FIGS. 3-57 illustrate example microelectronic structures 100/microelectronic assemblies 105 having various features. The features of these microelectronic structures 100/microelectronic assemblies 150 may be combined with any other features disclosed herein, as suitable, to form a microelectronic structure 100/microelectronic assembly 150. For example, any of the microelectronic structures 100 disclosed herein may be coupled to one or more microelectronic components 130 (e.g., as discussed above with reference to FIGS. 2-10) to form a microelectronic assembly 150, and any of the microelectronic assemblies 150 disclosed herein may be manufactured separately from their constituent microelectronic structures 100. A number of elements of FIGS. 1 and 2 are shared with FIGS. 3-57; for ease of discussion, a description of these elements is not repeated, and these elements may take the form of any of the embodiments disclosed herein.

Figure 11:
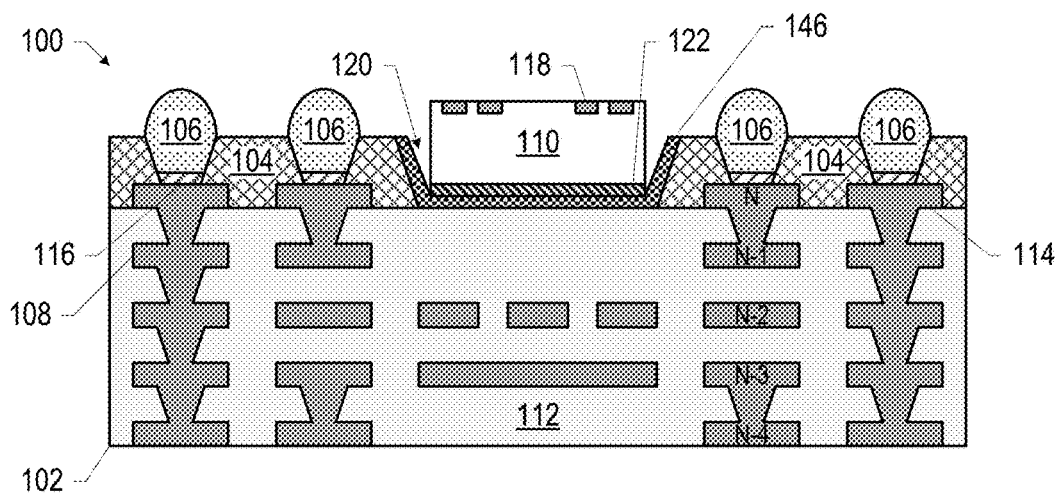
FIGS. 11-16 are side, cross-sectional views of example microelectronic structures, in accordance with various embodiments.
Figure 12:
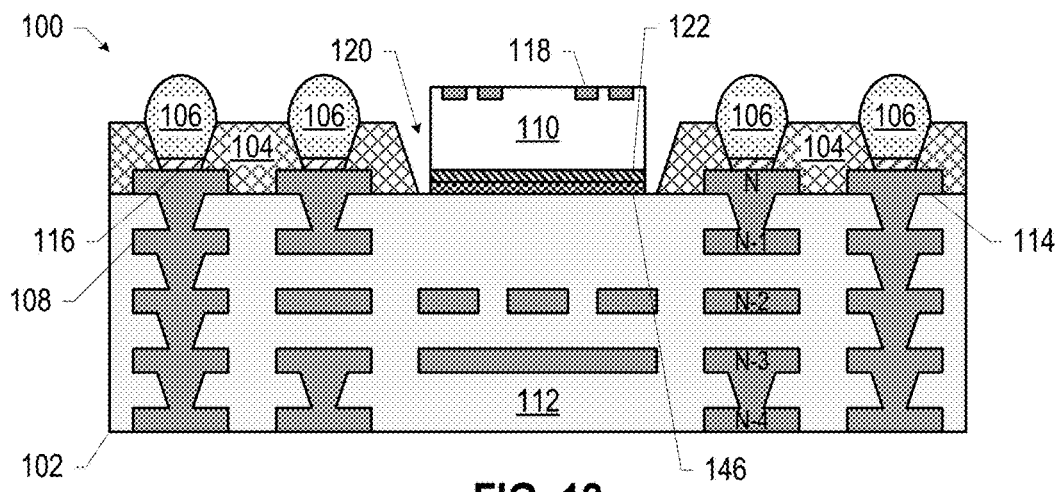

A microelectronic structure 100 may include a cavity 120 that extends through a surface insulation material 104 at a "top" face of the substrate 102 (e.g., as discussed above with reference to FIG. 1). In some embodiments, the dielectric material 112 of the substrate 102 may provide the bottom of the cavity 120 (e.g., as discussed above with reference to FIG. 1), while in other embodiments, another material may provide a bottom of the cavity 120. For example, FIGS. 11 and 12 illustrate a microelectronic structure 100 including a metal layer 146 to which the bridge component 110 is coupled by adhesive 122. The metal layer 146 may extend up the (angled) side faces of the cavity 120, as shown in FIG. 11, or may be located only below the bridge component 110/adhesive 122, as shown in FIG. 12. In some embodiments, the metal layer 146 may include aluminum (which may be sputtered onto an assembly like that of FIG. 7) or a nickel-palladium-gold multilayer (which may be deposited onto an assembly like that of FIG. 7 by an electroless deposition technique). In an embodiment like that of FIG. 12, the initially deposited metal layer 146 may be patterned after attachment of the bridge component 110 to remove the metal layer 146 not shielded by the bridge component 110/adhesive 122. In some embodiments, a thickness of the metal layer 146 may be less than a thickness 138 of the underlying metal of the conductive contacts 114, as shown. In embodiments like those of FIGS. 11 and 12, the adhesive 122 may be an epoxy material. In some such embodiments, the epoxy adhesive 122 may be a ultraviolet (UV)-curable epoxy (also referred to as a "snap-curable" epoxy) that, upon exposure to UV radiation after deposition, quickly cross-links in place (without requiring a long thermal cure). The metal layer 146 may act as a reflective surface during this UV exposure, enabling a desired scattering and distribution of the UV radiation to fully cross-link the epoxy. The use of a UV-curable epoxy as the adhesive 122 may allow the bridge component 110 to be secured in place quickly so that the shift of the bridge component 110 that typically occurs during subsequent processing operations may be mitigated or eliminated.

Figure 13:
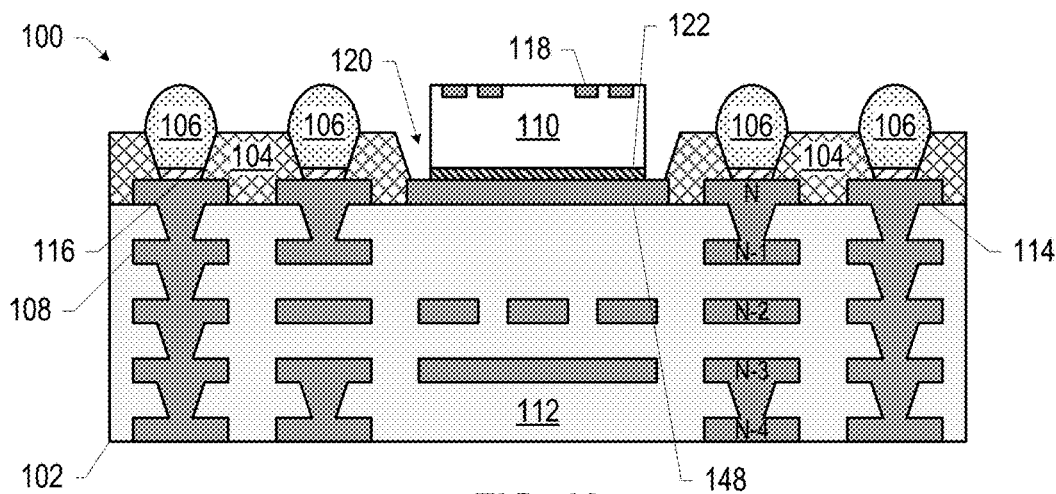

FIG. 13 illustrates another embodiment in which a microelectronic structure 100 includes a metal to which the bridge component 110 is coupled by adhesive 122; in FIG. 13, however, the metal is a metal pad 148, coplanar with the underlying metal of the conductive contacts 114, and having a same thickness 138. In some such embodiments, the metal pad 148 may present a roughened copper surface to which an adhesive 122 (e.g., a DAF) may readily bond.

The microelectronic structures 100 of FIGS. 1 and 11-13 may allow manufacturers to avoid expensive and complex manufacturing operations typically required for high-density interconnect structures (e.g., ultraviolet (UV) or carbon dioxide laser machining, first-level interconnect plating, etc.) and thus may speed development of new structures and reduce cost.

Figure 14:
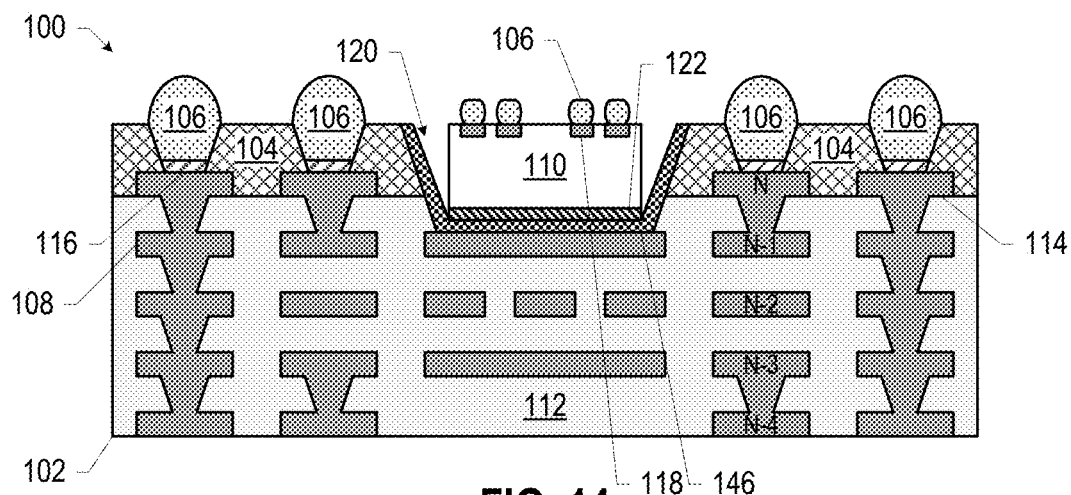
Figure 15:
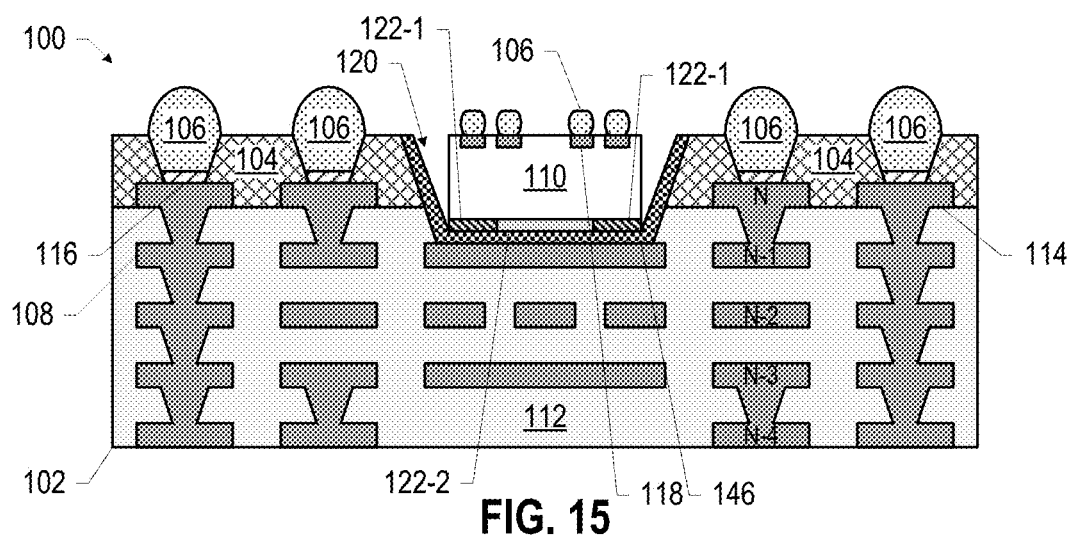
Figure 16:
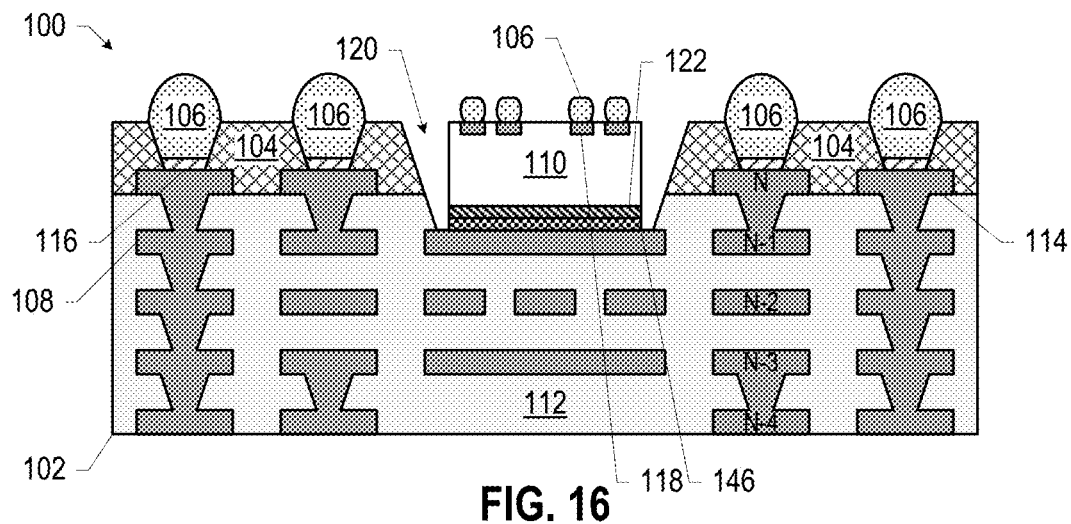

In some embodiments, a microelectronic structure 100 may include a cavity 120 that extends through a surface insulation material 104 at a "top" face of the substrate 102 and into the dielectric material 112 of the substrate 102. For example, FIGS. 14-16 illustrate microelectronic structures 100 including cavities 120 that extend into the dielectric material 112 and whose bottoms are provided by the conductive material 108 (e.g., a metal in the N-1 layer). Further, FIGS. 14-16 illustrate microelectronic structures 100 including a metal layer 146 to which the bridge component 110 is coupled by adhesive 122. The metal layer 146 may extend up the (angled) side faces of the cavity 120, as shown in FIGS. 14 and 15, or may be located only below the bridge component 110/adhesive 122, as shown in FIG. 16. In some embodiments, the metal layer 146 may include aluminum (which may be sputtered onto an assembly like that of FIG. 7), gold, or a nickel-palladium-gold multilayer (which may be deposited onto an assembly like that of FIG. 7 by an electroless deposition technique). In an embodiment like that of FIG. 16, the initially deposited metal layer 146 may be patterned after attachment of the bridge component 110 to remove the metal layer 146 not shielded by the bridge component 110/adhesive 122. In some embodiments, a thickness of the metal layer 146 may be less than a thickness 138 of the underlying metal of the conductive contacts 114, as shown. In embodiments like those of FIGS. 14-16, as discussed above with reference to FIGS. 11-12, the adhesive 122 may be an epoxy material (e.g., a UV-curable epoxy).

In the embodiment of FIG. 15, the adhesive 122 may include a peripheral adhesive 122-1 and a central adhesive 122-2. The peripheral adhesive 122-1 may be a UV-curable epoxy, as discussed above, while the central adhesive 122-2 may be a thermally cured epoxy. In the manufacture of the microelectronic structure 100 of FIG. 15, the peripheral adhesive 122-1 may be cured first by exposure to UV radiation (e.g., as discussed below with reference to FIGS. 17-25, and then the resulting assembly may be subject to a thermal treatment to cure the central adhesive 122-2. As noted above, the use of a UV-curable epoxy as (or as part of) the adhesive 122 may allow the bridge component 110 to be secured in place quickly so that the shift of the bridge component 110 that typically occurs during subsequent processing operations may be mitigated or eliminated, dramatically improving the yield and ease of later assembly operations (e.g., attaching microelectronic components 130).

Figure 17:
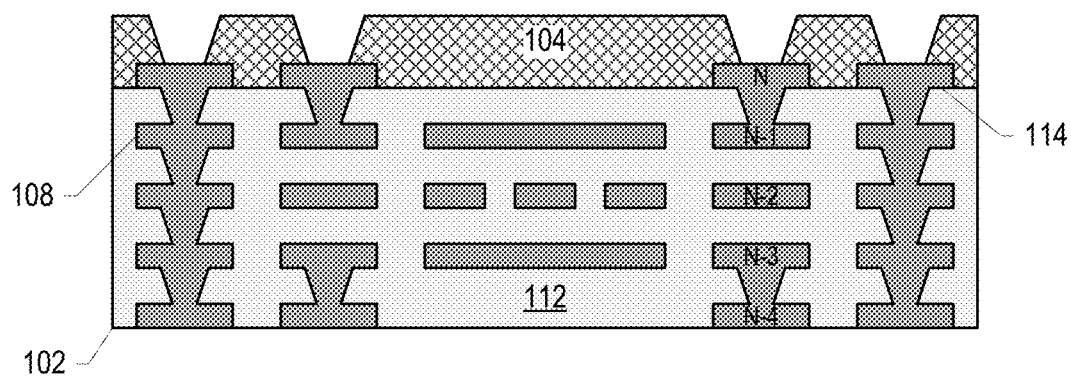
FIGS. 17-25 are side, cross-sectional views of various stages in an example process for the manufacture of the microelectronic structure of FIG. 14, in accordance with various embodiments.

FIGS. 17-25 illustrate various stages in an example process for the manufacture of the microelectronic structure 100 of FIG. 14, in accordance with various embodiments. FIG. 17 illustrates an assembly subsequent to patterning openings in the surface insulation material 104 of the assembly of FIG. 5 to expose the underlying metal of the conductive contacts 114. In some embodiments, the openings in the surface insulation material 104 (including the cavity 120) may be formed by mechanical patterning, laser patterning, dry etch patterning, or lithographic patterning techniques.

Figure 18:
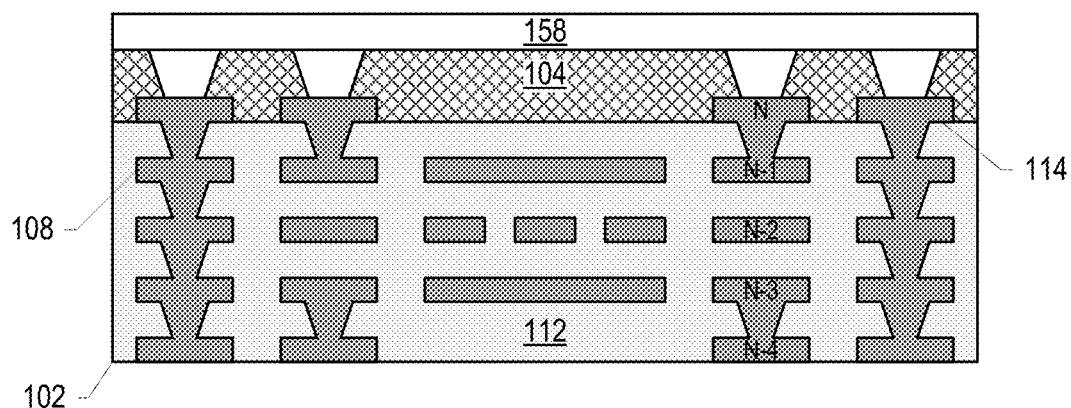

FIG. 18 illustrates an assembly subsequent to applying a mask material 158 over the assembly of FIG. 18. In some embodiments, the mask material 158 may include a dry film resist (DFR) or a polyethylene terephthalate (PET) film, and may be laminated on.

Figure 19:
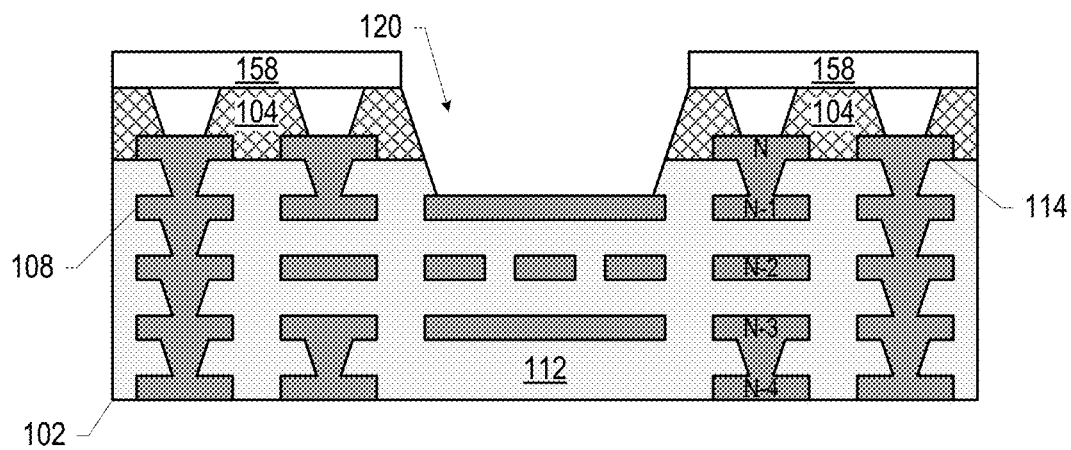

FIG. 19 illustrates an assembly subsequent to forming the cavity 120 in the assembly of FIG. 18. The cavity 120 may be formed through the mask material 158, as shown, and any suitable technique may be used to form the cavity 120 (e.g., laser drilling). Cleaning operations (e.g., water cleaning and/or plasma etch cleaning) may follow the formation of the cavity 120.

Figure 20:
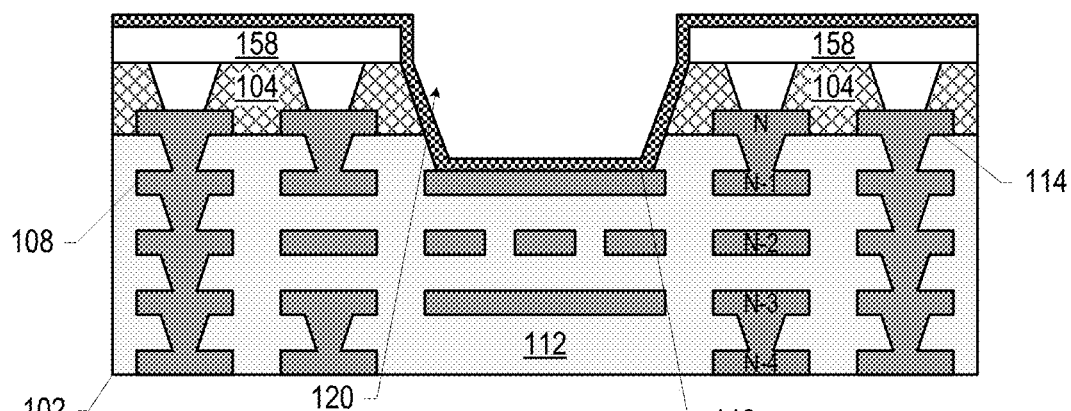

FIG. 20 illustrates an assembly subsequent to forming a metal layer 146 on the assembly of FIG. 19. The metal layer 146 may include any of the materials disclosed herein, and may be deposited using any suitable technique (e.g., aluminum deposited by sputtering).

Figure 21:
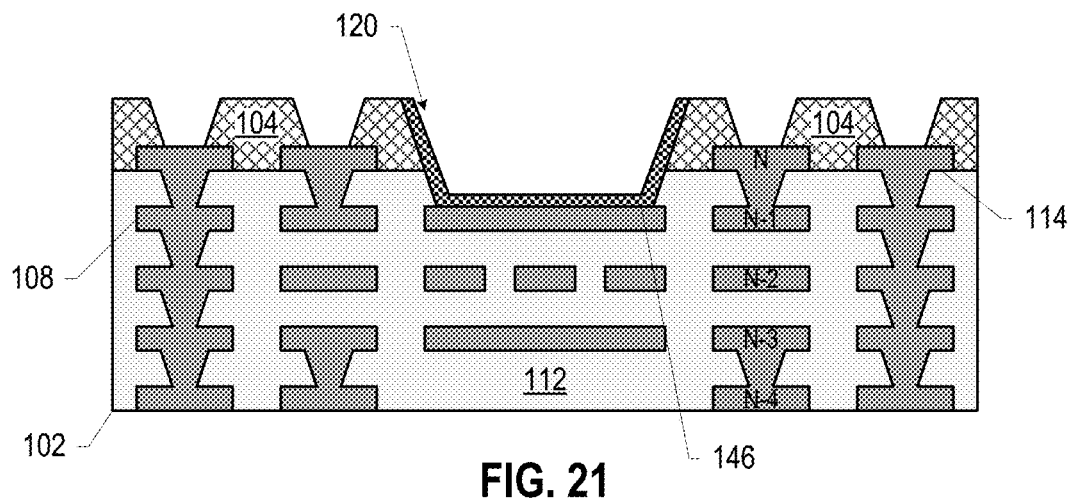

FIG. 21 illustrates an assembly subsequent to removing the mask material 158 from the assembly of FIG. 20, and consequently removing the portion of the metal layer 146 on the mask material 158. For example, when the mask material 158 is a PET film, the mask material 158 may be peeled off; when the mask material 158 is a DFR, the mask material 158 may be stripped.

Figure 22:
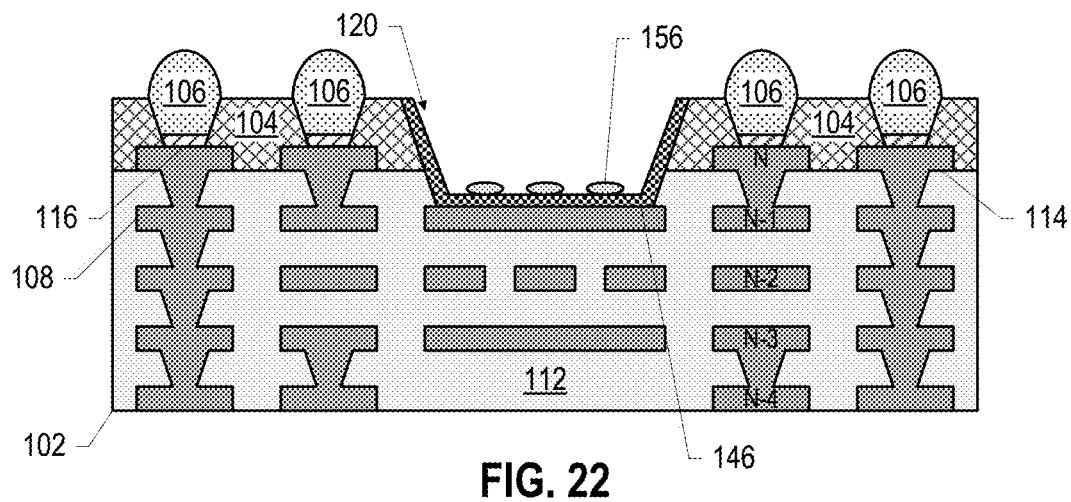

FIG. 22 illustrates an assembly subsequent to depositing uncured adhesive 156 on the metal layer 146 at the bottom of the cavity 120 of the assembly of FIG. 21. When multiple types of adhesives 122 are to be used (e.g., as discussed above with reference to FIG. 15, the multiple types of uncured adhesive 156 may be deposited in a desired pattern. Alternately, a single type of uncured adhesive 156 (e.g., an uncured peripheral adhesive 122-1) may be deposited initially, and another type of uncured adhesive (e.g., an uncured center adhesive 122-2) may be provided later (e.g., by capillary underfill after attachment of the bridge component 110).

Figure 23:
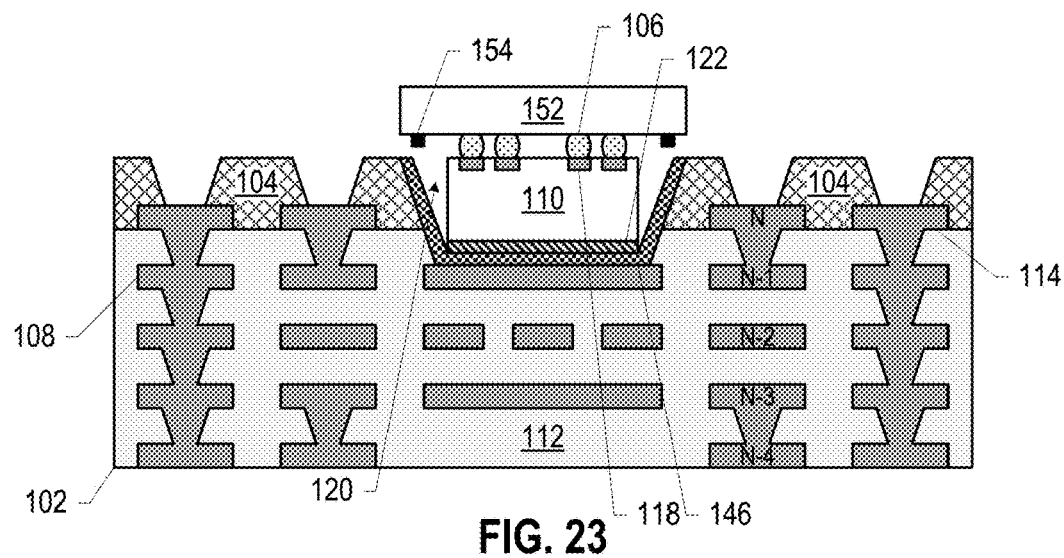

FIG. 23 illustrates an assembly subsequent to using a bond head 152 to bring the bridge component 110 (along with solder 106 on the conductive contacts 118) into contact with the uncured adhesive 156 of the assembly of FIG. 22. When the bridge component 110 is properly positioned, UV sources 154 (e.g., a ring of light-emitting diodes (LEDs)) of the bond head 152 may shine UV radiation on the uncured adhesive 156, cross-linking the uncured adhesive 156 and resulting in the adhesive 122.

Figure 24:
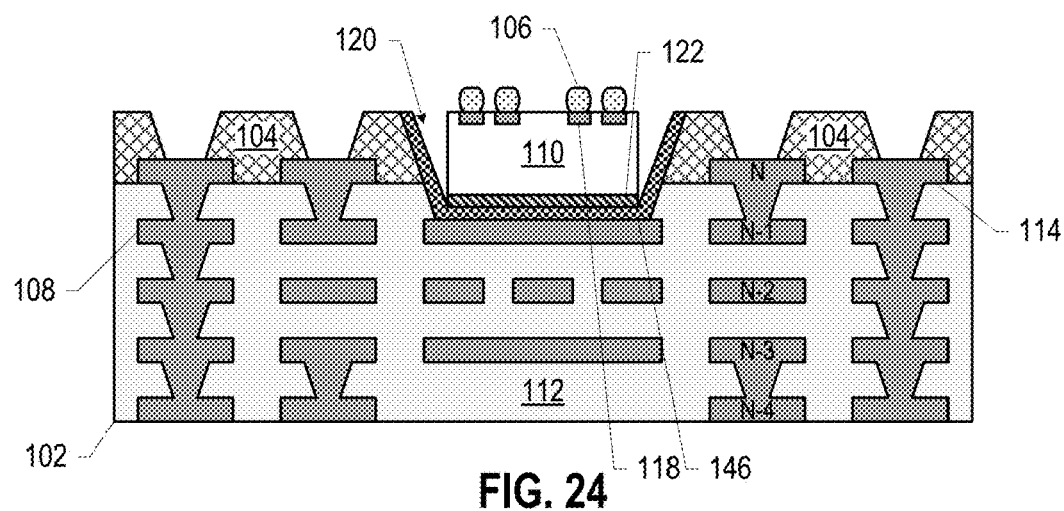

FIG. 24 illustrates an assembly subsequent to retracing the bond head 152 and performing a thermal cure (e.g., at the panel level) of the assembly of FIG. 24.

Figure 25:
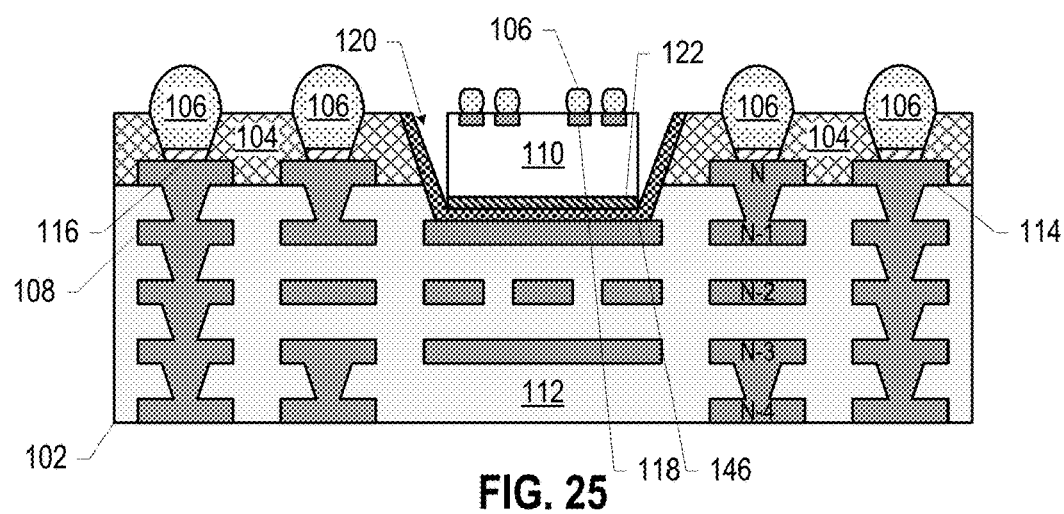

FIG. 25 illustrates an assembly subsequent to forming the surface finish 116 and the solder 106 (e.g., microballs) on the conductive contacts 114 of FIG. 24. The resulting assembly may take the form of the microelectronic structure 100 of FIG. 14.

Other manufacturing processes may be used to fabricate the microelectronic structures 100 of FIGS. 14-16. For example, instead of applying a mask material 158 before the formation of the metal layer 146, no mask material 158 may be used; instead, the metal layer 146 may be formed after the cavity 120 is formed, and the excess metal layer 146 may be removed after the bridge component 110 is attached and before the solder 106 is provided (resulting in a microelectronic structure 100 like that of FIG. 16). In another process, the solder 106 may be provided after the cavity 120 is formed, but before the bridge component 110 is attached; after the thermal cure of FIG. 24, the resulting assembly may be "flash etched" to remove the excess metal layer 146. Additionally, in some embodiments, a "bump flattening" operation may be performed after formation of the solder 106; the assembly may be subject to a controlled "downward" force at a controlled temperature to achieve a desired height profile of the solder 106.

Figure 26:
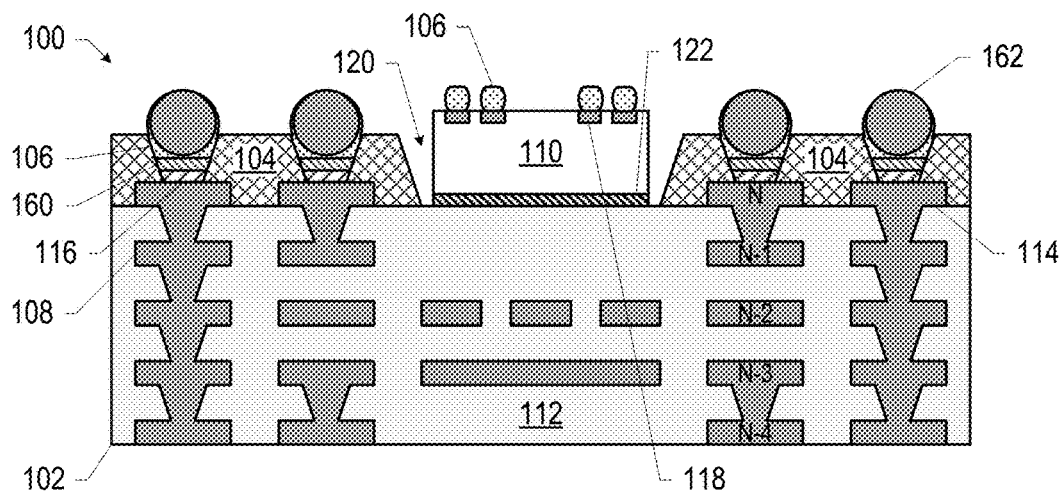
FIG. 26 is a side, cross-sectional view of an example microelectronic structure, in accordance with various embodiments.

Other techniques may be used to control the stand-off between the microelectronic structure 100 and the microelectronic components 130, instead of or in addition to the techniques utilizing a UV-curable adhesive 122 discussed above. For example, FIG. 26 is a side, cross-sectional view of an example microelectronic structure 100 that includes metal-cored solder balls 164 in contact with the conductive contacts 114 (e.g., instead of solder only, as illustrated in some of the preceding drawings). A metal-cored solder ball 164 may include a metal ball 162 (e.g., including copper) that has a surface finish (e.g., nickel, a nickel-palladium-gold multilayer, etc.) to mitigate corrosion, and a thin layer of solder 106 coating the metal ball 162. In some embodiments, the diameter of the metal ball 162 may be between 10 microns and 300 microns (e.g., between 50 microns and 70 microns, or between 60 microns and 70 microns). In some embodiments, the thickness of the layer of solder 106 on the metal ball 162 may be between 1 microns and 15 microns; as shown in FIG. 26, after reflow of the solder 106 of the metal-cored solder ball 164, the solder 106 may flow down towards the conductive contact 114. As shown in FIG. 26, the metal ball 162 may occupy the majority of the volume of the corresponding opening in the surface insulation material 104, and may extend above a top surface of the surface insulation material 104.

Figure 27:
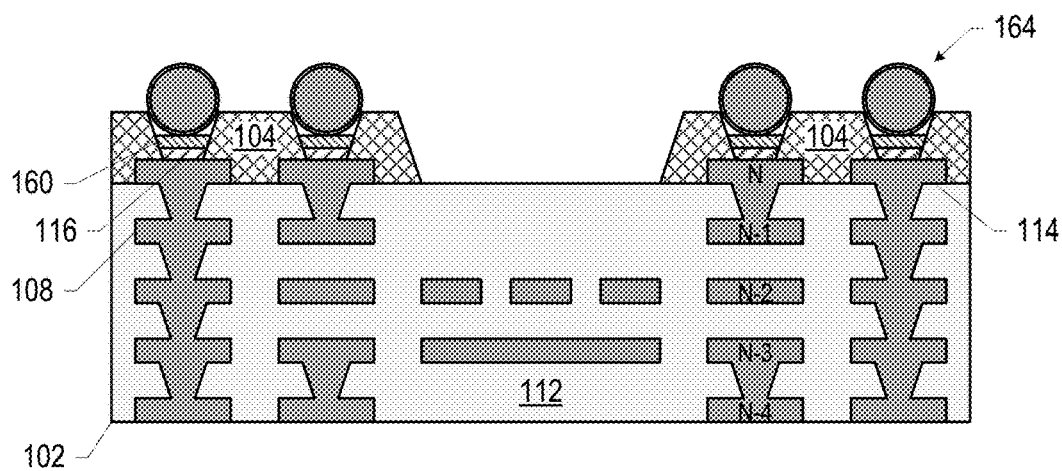
FIGS. 27-28 are side, cross-sectional views of various stages in an example process for the manufacture of the microelectronic structure of FIG. 26.
Figure 28:
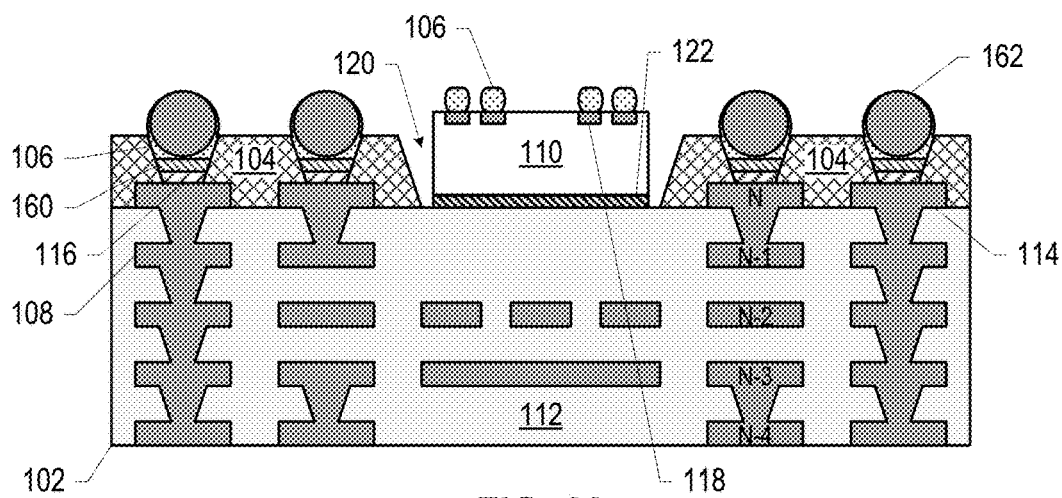

FIGS. 27-28 are side, cross-sectional views of various stages in an example process for the manufacture of the microelectronic structure 100 of FIG. 26. FIG. 27 illustrates an assembly subsequent to printing a layer of flux 160 on the conductive contacts 114 of the assembly of FIG. 6, and placing metal-cored solder balls 164 on the flux 160. FIG. 28 illustrates an assembly subsequent to performing a solder reflow (and deflux) to melt the solder 106 around the metal ball 162 of the assembly of FIG. 27, and then attaching the bridge component 110 to the exposed dielectric material 112 of the cavity 120 using the adhesive 122, resulting in the microelectronic structure 100 of FIG. 26. Although a single adhesive 122 is shown in FIGS. 26 and 28, and the cavity 120 is shown as having a particular depth and bottom material in FIGS. 26-28, any of the embodiments of these features disclosed herein may be used. The small volume of solder 106 included in the metal-cored solder balls 164 may result in little change of the height or profile of the metal-cored solder balls 164 after the solder reflow operation. FIGS. 26-28 also illustrate solder 106 on the conductive contacts 118 of the bridge component 110; in some embodiments, this solder 106 (e.g., a tin-based solder) may be microbumps provided on the bridge component 110 prior to attachment of the bridge component 110 to the substrate 102. Attachment of the microelectronic components 130 (e.g., as discussed above with reference to FIGS. 2-10) may then be performed on the microelectronic structure 100 of FIG. 25, aided by the predictable height of the metal-cored solder balls 164 and the solid "backstop" they provide.

Figure 29:
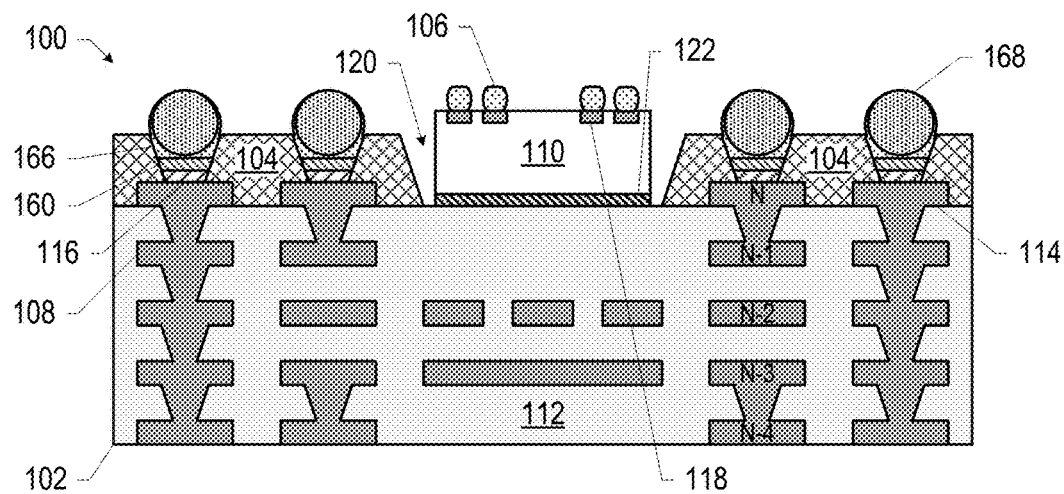
FIG. 29 is a side, cross-sectional view of an example microelectronic structure, in accordance with various embodiments.
Figure 31:
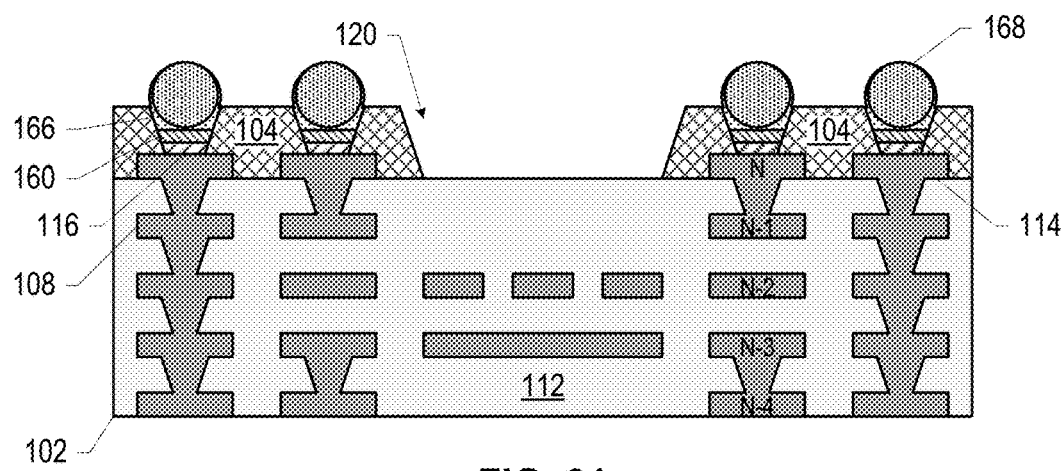
Figure 32:
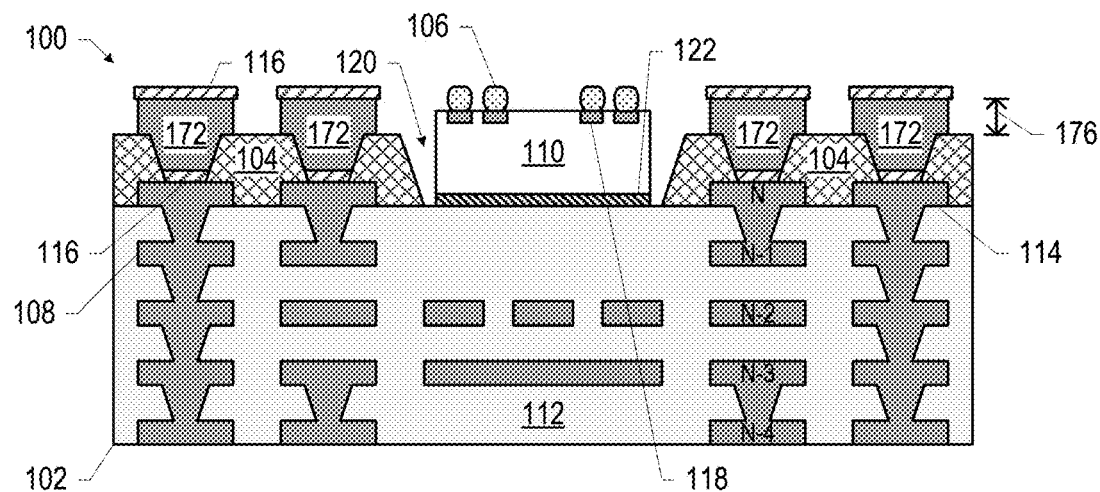
FIG. 32 is a side, cross-sectional view of an example microelectronic structure, in accordance with various embodiments.

FIGS. 29 and 32 illustrate further techniques may be used to control the stand-off between the microelectronic structure 100 and the microelectronic components 130, instead of or in addition to the techniques utilizing a UV-curable adhesive 122 discussed above. FIG. 29 is a side, cross-sectional view of an example microelectronic structure 100 that includes multi-melting point solder balls 170 in contact with the conductive contacts 114. A multi-melting point solder ball 170 may include a core of high-temperature solder 168 and a thin layer of low-temperature solder 166 coating the high-temperature solder 168. As used herein, the terms "high-temperature solder" and "low-temperature solder" are used relatively; a high-temperature solder 168 has a higher melting point than a low-temperature solder 166. In some embodiments, a high-temperature solder 168 may have a melting point that is greater than 200 degrees Celsius (e.g., between 220 degrees Celsius and 300 degrees Celsius), while a low-temperature solder 166 may have a melting point that is less than 200 degrees Celsius (e.g., between 112 degrees Celsius and 190 degrees Celsius). Other combinations may be used (e.g., a high-temperature solder 168 with a melting point of 189 degrees Celsius and a low-temperature solder 166 with a melting point of 117 degrees Celsius, or a high-temperature solder 168 with a melting point of 300 degrees Celsius and a low-temperature solder 166 with a melting point of 230 degrees Celsius). In some embodiments, a high-temperature solder 168 may include tin, silver, or antimony, and a low-temperature solder 166 may include indium, bismuth, zinc, or lead. As shown in FIG. 29, after reflow of the low-temperature solder 166 of the multi-melting point solder balls 170, the low-temperature solder 166 may flow down towards the conductive contact 114. As shown in FIG. 29, the high-temperature solder 168 may occupy the majority of the volume of the corresponding opening in the surface insulation material 104, and may extend above a top surface of the surface insulation material 104. Although FIG. 29 (and FIG. 31, discussed below) illustrate the high-temperature solder 168 as retaining a spherical shape, this is simply illustrative, and the high-temperature solder 168 may take any of a number of forms. If the high-temperature solder 168 does not undergo reflow during subsequent manufacturing operations, the high-temperature solder 168 may retain a spherical shape or may look like a "flattened" sphere with flatter faces at the bottom (proximate to the conductive contacts 114) and the top (proximate to the conductive contacts 132 of a microelectronic component 130, not shown). The "flattened" sphere of high-temperature solder 168 may remain close to the conductive contacts 114 or may float in the solder joint; if the high-temperature solder 168 floats in the solder joint, the orientation of the sphere may change. If the high-temperature solder 168 does undergo reflow during subsequent manufacturing operations, the high-temperature solder 168 may form a gradient with the low-temperature solder 166 (with more low-temperature solder 166 closer to the conductive contacts 114) or the high-temperature solder 168 may mix more thoroughly with the low-temperature solder 166.

Figure 30:
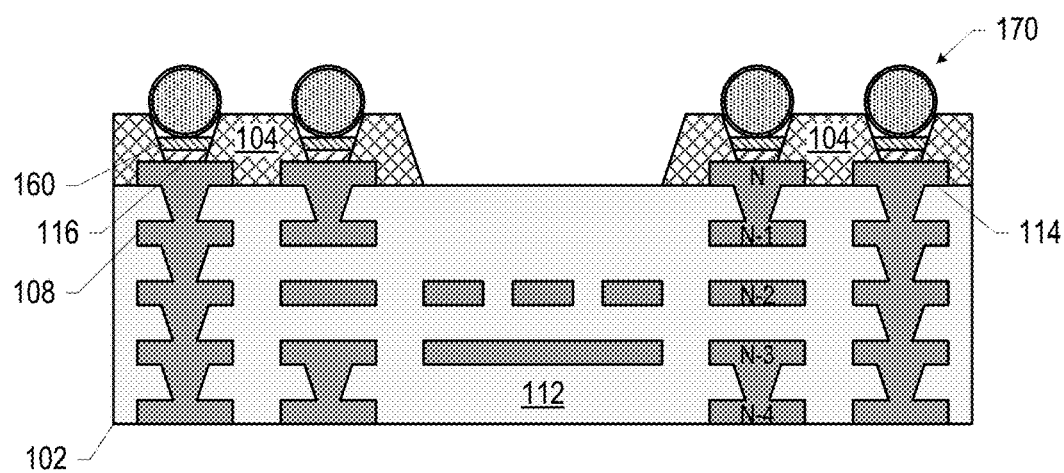
FIGS. 30-31 are side, cross-sectional views of various stages in an example process for the manufacture of the microelectronic structure of FIG. 29.

FIGS. 30-31 are side, cross-sectional views of various stages in an example process for the manufacture of the microelectronic structure 100 of FIG. 29. FIG. 30 illustrates an assembly subsequent to printing a layer of flux 160 on the conductive contacts 114 of the assembly of FIG. 6, and placing multi-melting point solder balls 170 on the flux 160. FIG. 31 illustrates an assembly subsequent to performing a (low-temperature) solder reflow (and deflux) to melt the low-temperature solder 166 around the core of high-temperature solder 168 of the assembly of FIG. 30, and then attaching the bridge component 110 to the exposed dielectric material 112 of the cavity 120 using the adhesive 122, resulting in the microelectronic structure 100 of FIG. 29. Although a single adhesive 122 is shown in FIGS. 29 and 31, and the cavity 120 is shown as having a particular depth and bottom material in FIGS. 29-31, any of the embodiments of these features disclosed herein may be used. The small volume of low-temperature solder 166 included in the multi-melting point solder balls 170 may result in little change of the height or profile of the multi-melting point solder balls 170 after the solder reflow operation. FIGS. 29-31 also illustrate solder 106 on the conductive contacts 118 of the bridge component 110; in some embodiments, this solder 106 (e.g., a tin-based solder) may be microbumps provided on the bridge component 110 prior to attachment of the bridge component 110 to the substrate 102. Attachment of the microelectronic components 130 (e.g., as discussed above with reference to FIGS. 2-10) may then be performed on the microelectronic structure 100 of FIG. 29, aided by the predictable height of the multi-melting point solder balls 170 and the solid "backstop" they provide.

FIG. 32 is a side, cross-sectional view of an example microelectronic structure 100 that includes metal posts 172 (e.g., copper posts) in contact with the conductive contacts 114. A surface finish 116 may be disposed at the top face of the metal posts 172, as shown. As shown in FIG. 32, the metal posts 172 may largely fill the corresponding openings in the surface insulation material 104, and may extend above a top surface of the surface insulation material 104. In some embodiments, the metal posts 172 may extend above the top surface of the surface insulation material 104 by a distance 176 between 20 microns and 30 microns. In some embodiments the metal posts 172 may be undercut relative to the surface finish 116, as shown in FIG. 32.

Figure 33:
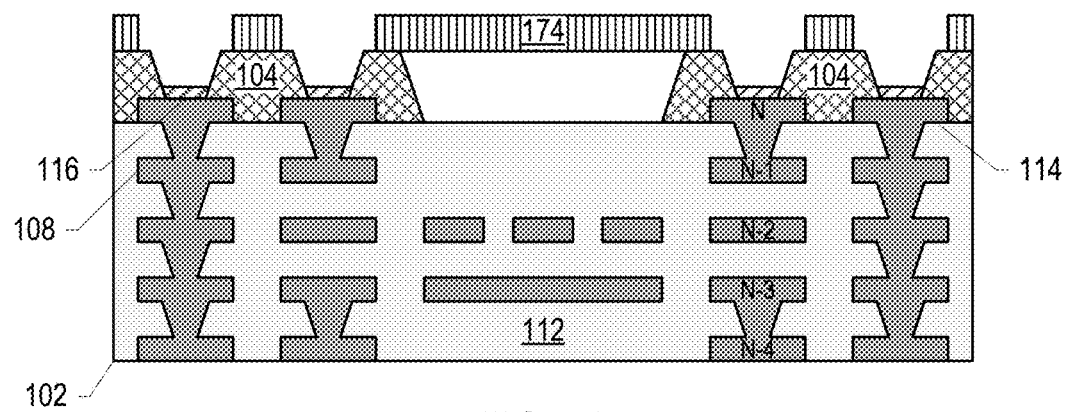
FIGS. 33-34 are side, cross-sectional views of various stages in an example process for the manufacture a microelectronic assembly including the microelectronic structure of FIG. 32.
Figure 34:
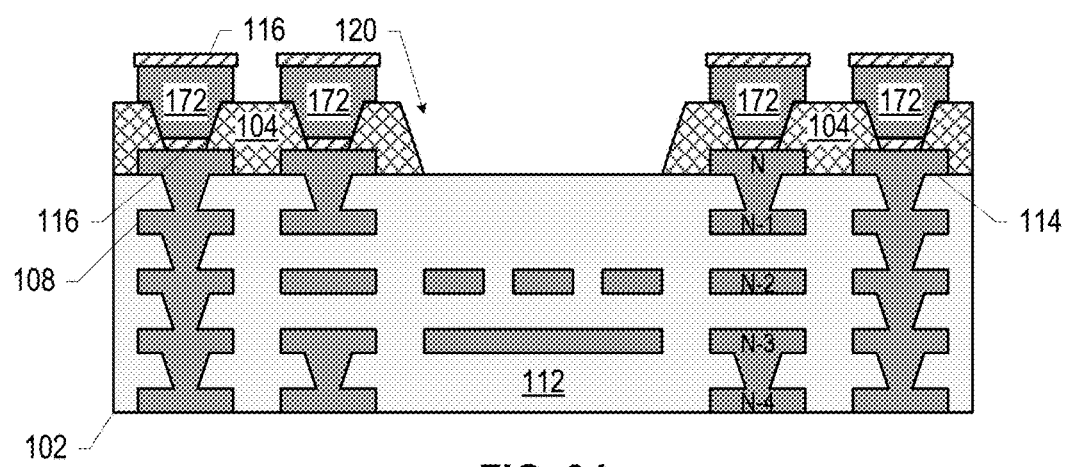

FIGS. 33-34 are side, cross-sectional views of various stages in an example process for the manufacture of the microelectronic structure 100 of FIG. 32. FIG. 33 illustrates an assembly subsequent to depositing and patterning a layer of surface insulation material 174 (e.g., a photoresist) on the assembly of FIG. 6. The surface insulation material 174 may be patterned with openings corresponding to the desired locations for the metal posts 172. FIG. 34 illustrates an assembly subsequent to plating a metal (e.g., copper) on the assembly of FIG. 33 to form the metal posts 172, forming the surface finish 116, and then stripping the surface insulation material 174 (and performing a seed etch to remove the metal seed layer used for the plating operation). Subsequently, the bridge component 110 may be attached to the exposed dielectric material 112 of the cavity 120 of the assembly of FIG. 34 using the adhesive 122, resulting in the microelectronic structure 100 of FIG. 32. Although a single adhesive 122 is shown in FIG. 32, and the cavity 120 is shown as having a particular depth and bottom material in FIGS. 32-34, any of the embodiments of these features disclosed herein may be used. FIGS. 33-34 also illustrate solder 106 on the conductive contacts 118 of the bridge component 110; in some embodiments, this solder 106 (e.g., a tin-based solder) may be microbumps provided on the bridge component 110 prior to attachment of the bridge component 110 to the substrate 102. Attachment of the microelectronic components 130 (e.g., as discussed above with reference to FIGS. 2-10) may then be performed on the microelectronic structure 100 of FIG. 32, with solder provided on the conductive contacts 132 of the microelectronic components 130 to couple the conductive contacts 132 to the metal posts 172, aided by the predictable height of the metal posts 172 and the solid "backstop" they provide.

Figure 35:
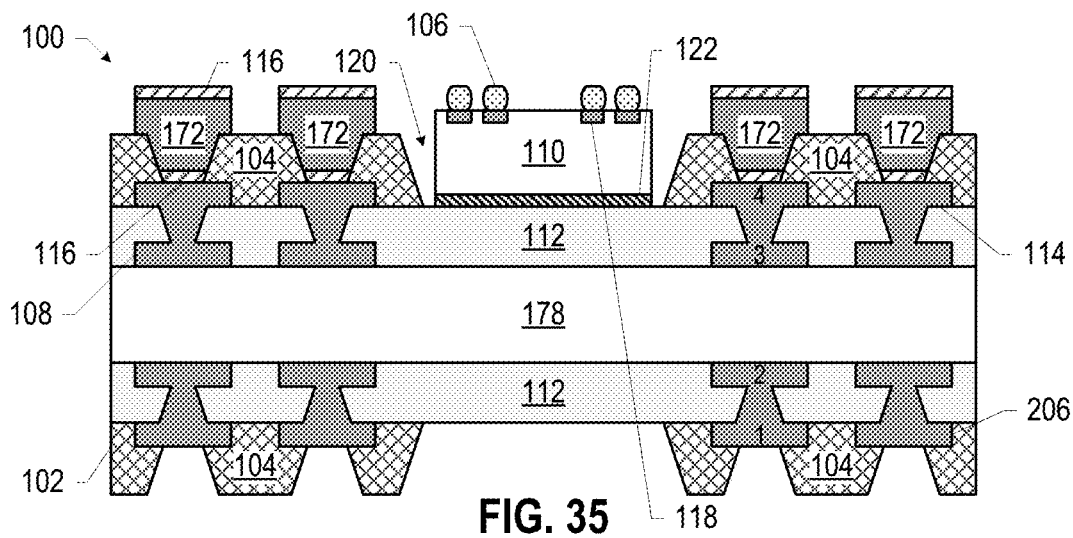
FIG. 35 is a side, cross-sectional view of an example microelectronic structure, in accordance with various embodiments.
Figure 36:
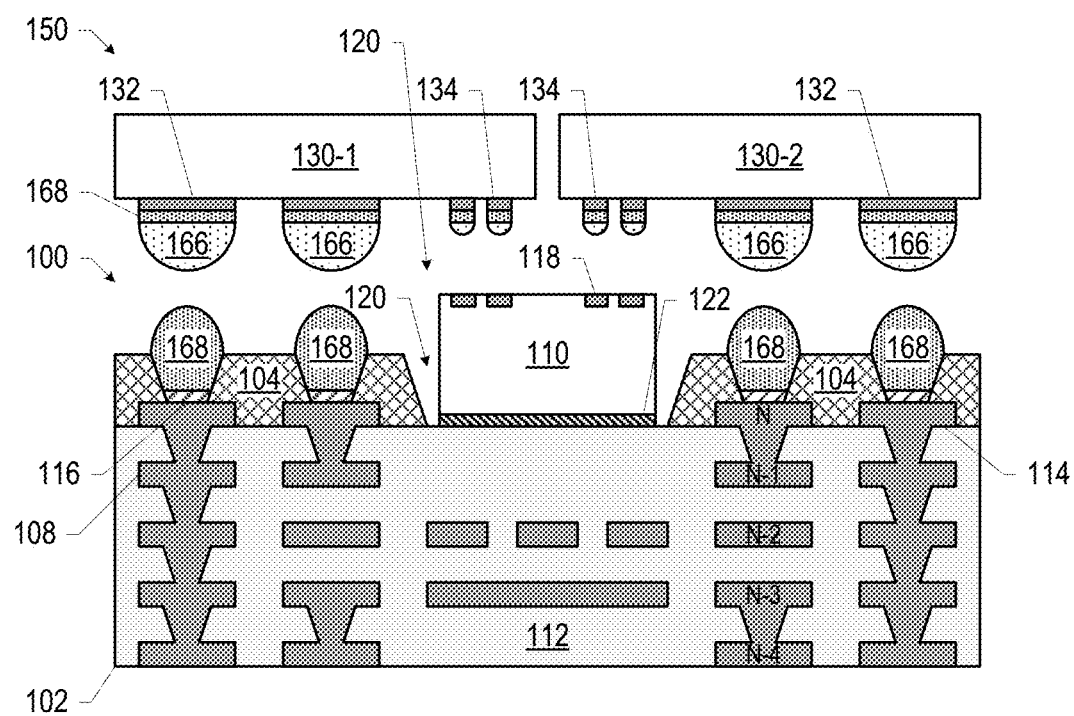
FIGS. 36-52 are side, cross-sectional, exploded views of example microelectronic assemblies, in accordance with various embodiments.

Although various ones of the drawings herein illustrate the substrate 102 as a coreless substrate (e.g., having vias that all taper in the same direction), any of the substrates 102 disclosed herein may be cored substrates 102. For example, FIG. 35 illustrates a microelectronic structure 100 having similar features to the microelectronic structure of FIG. 32, but having a substrate 102 having a core 178 (through which conductive pathways, not shown, may extend). As shown in FIG. 35, a cored substrate 102 may include vias that taper towards the core 178 (and thus taper in opposite directions at opposite sides of the core 178).

Other techniques may be used to control the stand-off between the microelectronic structure 100 and the microelectronic components 130, instead of or in addition to the techniques utilizing a UV-curable adhesive 122 and/or the techniques utilizing various interconnect arrangements on the conductive contacts 114 of the substrate 102, discussed above. For example, FIGS. 36-41 illustrate exploded views of example microelectronic assemblies 150 including arrangements of high-temperature solder 168 and low-temperature solder 166 to control stand-off, in accordance with various embodiments. In the microelectronic assembly 150 of FIG. 36, high-temperature solder 168 may be disposed on the conductive contacts 114 of the substrate 102, and a high-temperature solder 168 may be disposed between a low-temperature solder 166 and the conductive contacts 132/134 of the microelectronic components 130. In some embodiments, the low-temperature solder 166 may be plated on top of the high-temperature solder 168 on the conductive contacts 132/134. When the microelectronic components 130 are brought into contact with the microelectronic structure 100 (e.g., during a TCB operation, as discussed herein), only the low-temperature solder 166 may be molten, which may provide taller overall solder height on the conductive contacts 132/134 without side wicking of the solder. The presence of the high-temperature solder 168 on the conductive contacts 134 may allow the microelectronic components 130 to make a hard stop on the bridge component 110, if desired, and the volume of low-temperature solder 166 that will contact the conductive contacts 118 may be selected to achieve a desired solder height. More generally, the high-temperature solder 168 in the microelectronic assembly 150 of FIG. 36 may serve as a solder stand-off to improve reliability during manufacturing.

Figure 37:
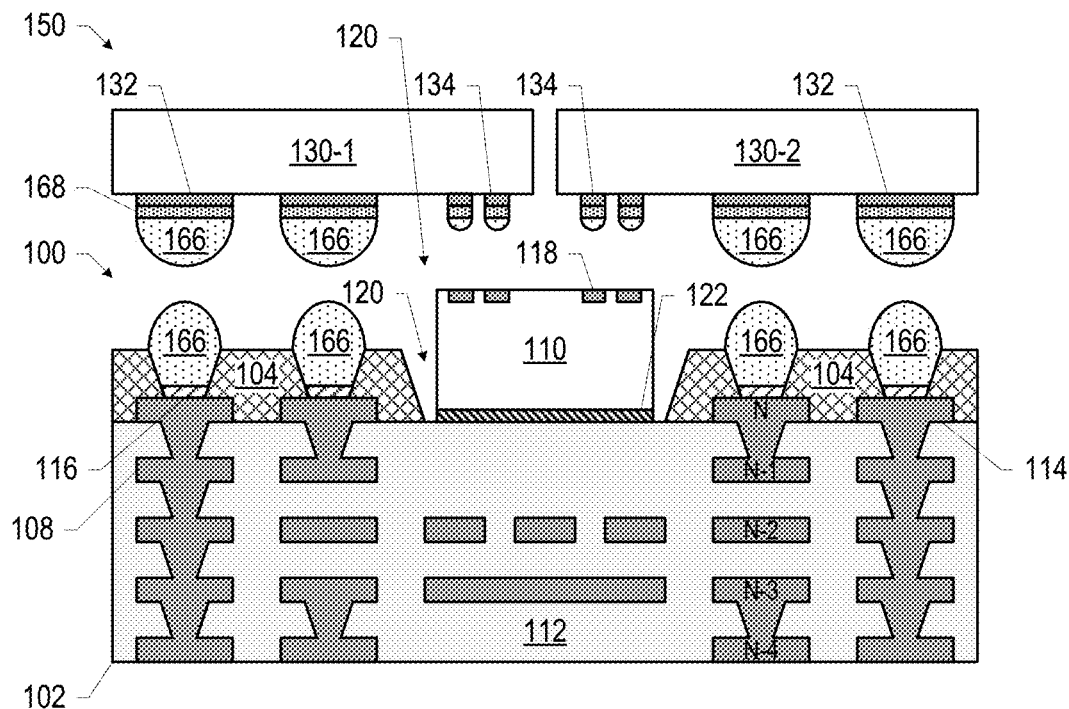

In the microelectronic assembly 150 of FIG. 37, low-temperature solder 166 may be disposed on the conductive contacts 114 of the substrate 102, and a high-temperature solder 168 may be disposed between a low-temperature solder 166 and the conductive contacts 132/134 of the microelectronic components 130. In some embodiments, the low-temperature solder 166 may be plated on top of the high-temperature solder 168 on the conductive contacts 132/134. When the microelectronic components 130 are brought into contact with the microelectronic structure 100 (e.g., during a TCB operation, as discussed herein), only the low-temperature solder 166 may be molten, which may provide taller overall solder height on the conductive contacts 132/134 without side wicking of the solder. As discussed above with reference to FIG. 36, the presence of the high-temperature solder 168 on the conductive contacts 134 may allow the microelectronic components 130 to make a hard stop on the bridge component 110, if desired, and the volume of low-temperature solder 166 that will contact the conductive contacts 118 may be selected to achieve a desired solder height. The low-temperature solder 166 on the conductive contacts 134 may provide a higher collapse window on the interconnects to the conductive contacts 134 during manufacturing.

Figure 38:
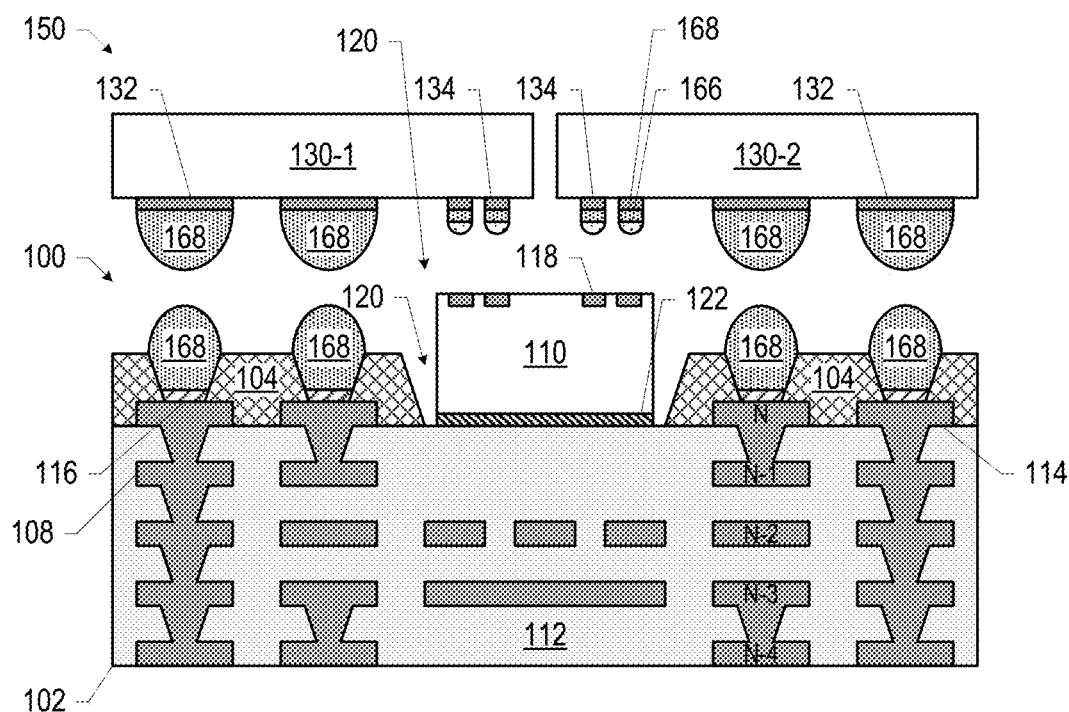

In the microelectronic assembly 150 of FIG. 38, high-temperature solder 168 may be disposed on the conductive contacts 114 of the substrate 102, high-temperature solder 168 may be disposed on the conductive contacts 132 of the microelectronic components 130, and a high-temperature solder 168 may be disposed between a low-temperature solder 166 and the conductive contacts 134 of the microelectronic components 130. In some embodiments, the low-temperature solder 166 may be plated on top of the high-temperature solder 168 on the conductive contacts 134. When the microelectronic components 130 are brought into contact with the microelectronic structure 100 (e.g., during a TCB operation, as discussed herein), only the low-temperature solder 166 may be molten, which may provide taller overall solder height on the conductive contacts 134 without side wicking of the solder. The high-temperature solder 168 may be molten after the bumps of the low-temperature solder 166 have collapsed so as to interfere minimally or not at all with the bonding of the low-temperature solder 166. The presence of the high-temperature solder 168 on the conductive contacts 134 may allow the microelectronic components 130 to make a hard stop on the bridge component 110, if desired, and the volume of low-temperature solder 166 that will contact the conductive contacts 118 may be selected to achieve a desired solder height.

As noted above, in some embodiments, the bridge component 110 may include conductive contacts other than the conductive contacts 118 at its "top" face; for example, the bridge component 110 may include conductive contacts 182 at its "bottom" face, as shown in FIGS. 39-57. The conductive contacts 182 of the bridge component 110 may be conductively coupled to conductive contacts 180 at the bottom of the cavity 120 of the substrate 102 (e.g., by solder 106 or another type of interconnect). In some embodiments, the conductive contacts 180 may be at the bottom of corresponding cavities in the dielectric material 112, as shown. The conductive contacts 180 may include a surface finish 116 at their exposed surfaces, as shown. Direct electrical connections between the substrate 102 and the bridge component 110 (i.e., electrical connections that do not go through a microelectronic component 130) may enable direct power and/or input/output (I/O) pathways between the substrate 102 and the bridge component 110, which may result in power delivery benefits and/or signal latency benefits. In some embodiments, the pitch of the conductive contacts 182 may be between 40 microns and 1 millimeter (e.g., between 40 microns and 50 microns, or between 100 microns and 1 millimeter). In embodiments in which the bridge component 110 includes conductive contacts 182 at its "bottom" face to couple to conductive contacts 180 at the bottom of the cavity 120 of the substrate 102, a dielectric material (e.g., a capillary underfill material) may support these connections; such a material is not shown in various ones of the accompanying drawings for clarity of illustration.

Figure 39:
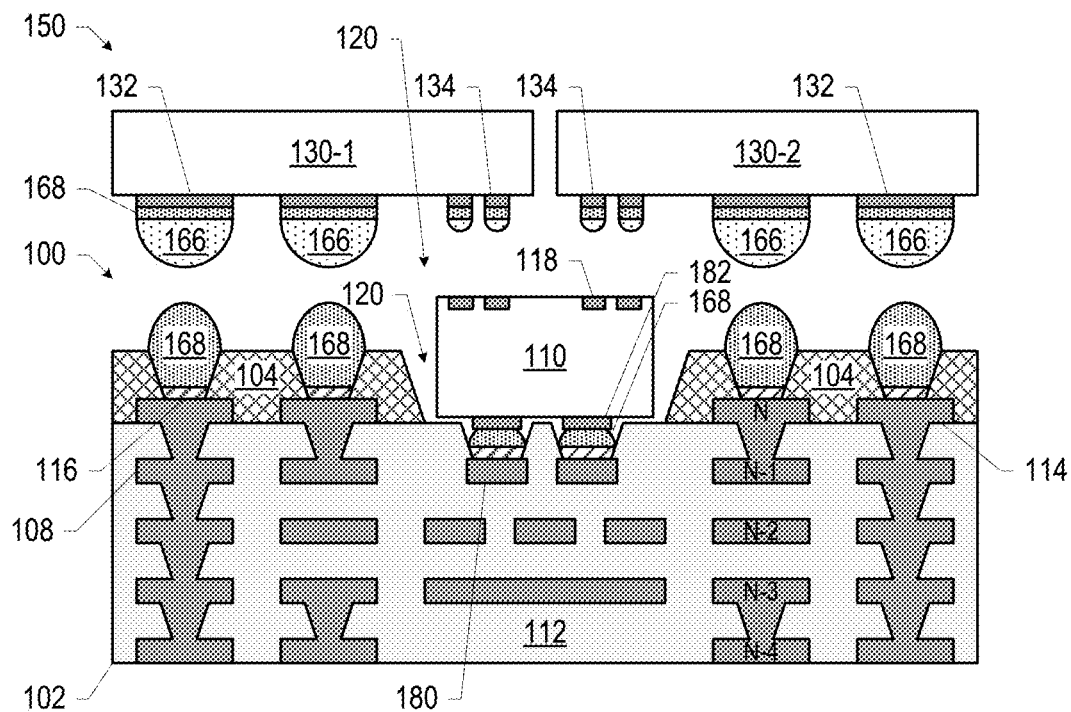

Any of the preceding embodiments may be combined with a bridge component 110 having conductive contacts 118 and conductive contacts 182 at opposing faces. For example, FIG. 39 illustrates an embodiment in which the conductive contacts 182 are coupled to the substrate 102 by solder. In particular, in the microelectronic assembly 150 of FIG. 39, high-temperature solder 168 may be disposed on the conductive contacts 114 of the substrate 102, a high-temperature solder 168 may be disposed between a low-temperature solder 166 and the conductive contacts 132/134 of the microelectronic components 130 (similar to the embodiment of FIG. 36), and a high-temperature solder 168 may be disposed between the conductive contacts 182 of the bridge component 110 and the conductive contacts 180 in the cavity 120 of the substrate 102. In some embodiments, the low-temperature solder 166 may be plated on top of the high-temperature solder 168 on the conductive contacts 132/134. When the microelectronic components 130 are brought into contact with the microelectronic structure 100 (e.g., during a TCB operation, as discussed herein), only the low-temperature solder 166 may be molten, which may allow the bridge component 110 to stay rigidly in place during attachment of the microelectronic components 130. The presence of the high-temperature solder 168 on the conductive contacts 134 may allow the microelectronic components 130 to make a hard stop on the bridge component 110, if desired, and the volume of low-temperature solder 166 that will contact the conductive contacts 118 may be selected to achieve a desired solder height.

Figure 40:
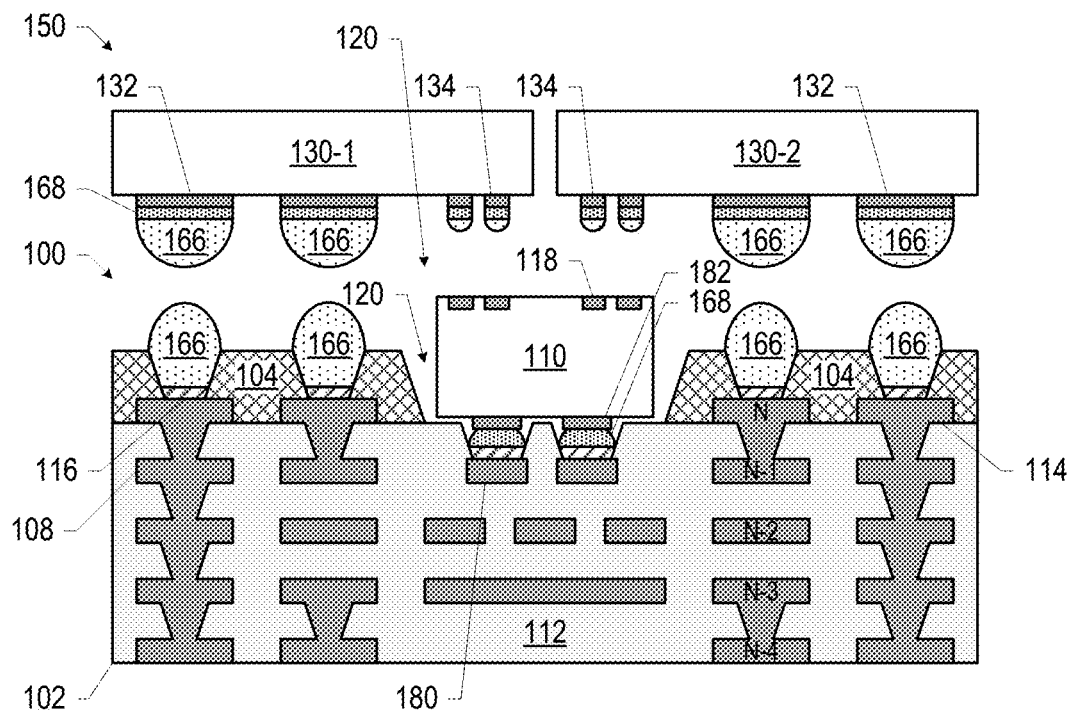

In the microelectronic assembly 150 of FIG. 40, low-temperature solder 166 may be disposed on the conductive contacts 114 of the substrate 102, a high-temperature solder 168 may be disposed between a low-temperature solder 166 and the conductive contacts 132/134 of the microelectronic components 130 (similar to the embodiment of FIG. 37), and a high-temperature solder 168 may be disposed between the conductive contacts 182 of the bridge component 110 and the conductive contacts 180 in the cavity 120 of the substrate 102. In some embodiments, the low-temperature solder 166 may be plated on top of the high-temperature solder 168 on the conductive contacts 132/134. When the microelectronic components 130 are brought into contact with the microelectronic structure 100 (e.g., during a TCB operation, as discussed herein), only the low-temperature solder 166 may be molten, which may allow the bridge component 110 to stay rigidly in place during attachment of the microelectronic components 130. As discussed, the presence of the high-temperature solder 168 on the conductive contacts 134 may allow the microelectronic components 130 to make a hard stop on the bridge component 110, if desired, and the volume of low-temperature solder 166 that will contact the conductive contacts 118 may be selected to achieve a desired solder height. The low-temperature solder 166 on the conductive contacts 134 may provide a higher collapse window on the interconnects to the conductive contacts 134 during manufacturing.

Figure 41:
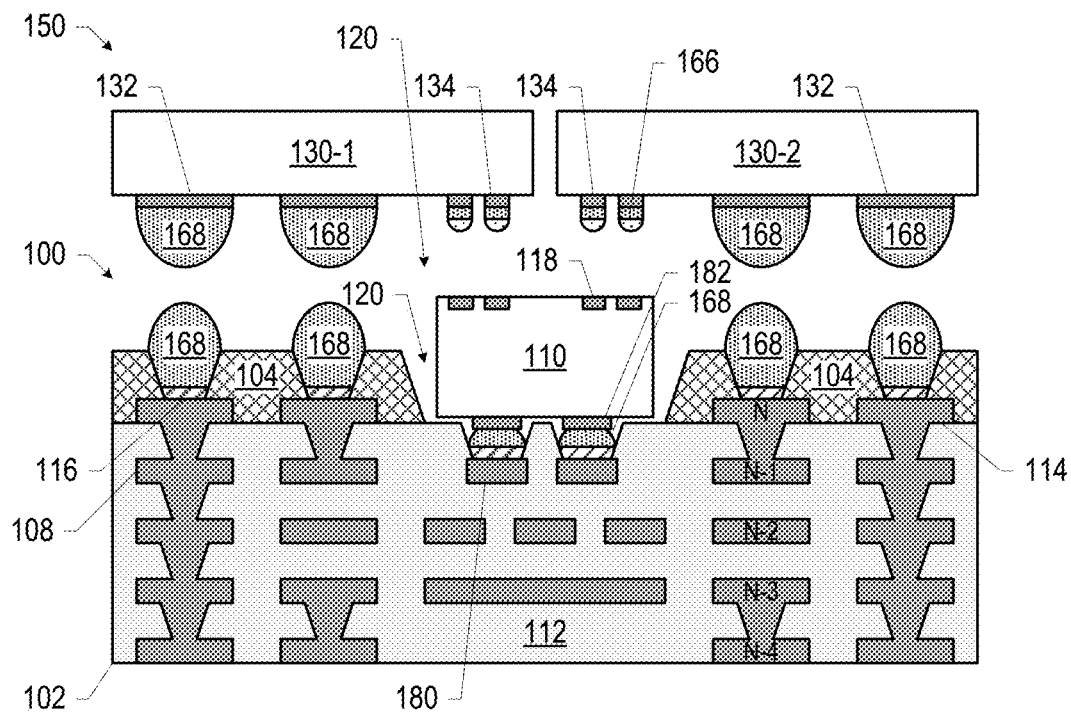

In the microelectronic assembly 150 of FIG. 41, high-temperature solder 168 may be disposed on the conductive contacts 114 of the substrate 102, high-temperature solder 168 may be disposed on the conductive contacts 132 of the microelectronic components 130, a high-temperature solder 168 may be disposed between a low-temperature solder 166 and the conductive contacts 134 of the microelectronic components 130 (similar to the embodiment of FIG. 38), and a high-temperature solder 168 may be disposed between the conductive contacts 182 of the bridge component 110 and the conductive contacts 180 in the cavity 120 of the substrate 102. In some embodiments, the low-temperature solder 166 may be plated on top of the high-temperature solder 168 on the conductive contacts 134. When the microelectronic components 130 are brought into contact with the microelectronic structure 100 (e.g., during a TCB operation, as discussed herein), only the low-temperature solder 166 may be molten, which may allow the bridge component 110 to stay rigidly in place during attachment of the microelectronic components 130. The high-temperature solder 168 may be molten after the bumps of the low-temperature solder 166 have collapsed so as to interfere minimally or not at all with the bonding of the low-temperature solder 166. The presence of the high-temperature solder 168 on the conductive contacts 134 may allow the microelectronic components 130 to make a hard stop on the bridge component 110, if desired, and the volume of low-temperature solder 166 that will contact the conductive contacts 118 may be selected to achieve a desired solder height.

Figure 42:
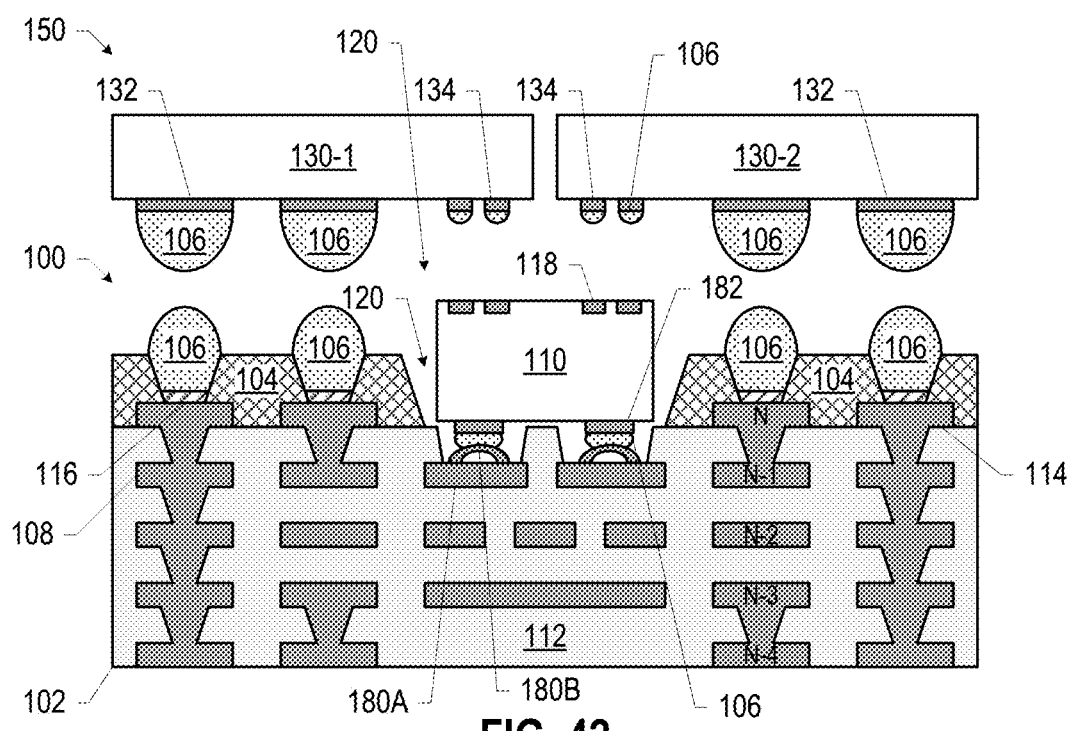
Figure 43:
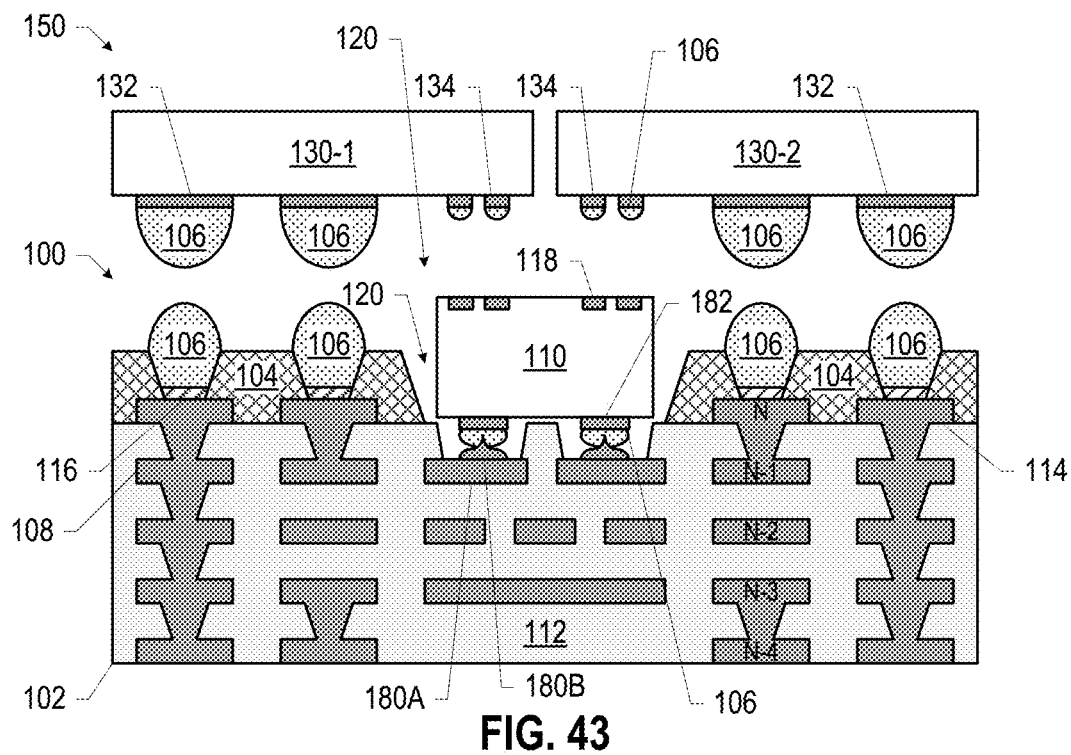
Figure 44:
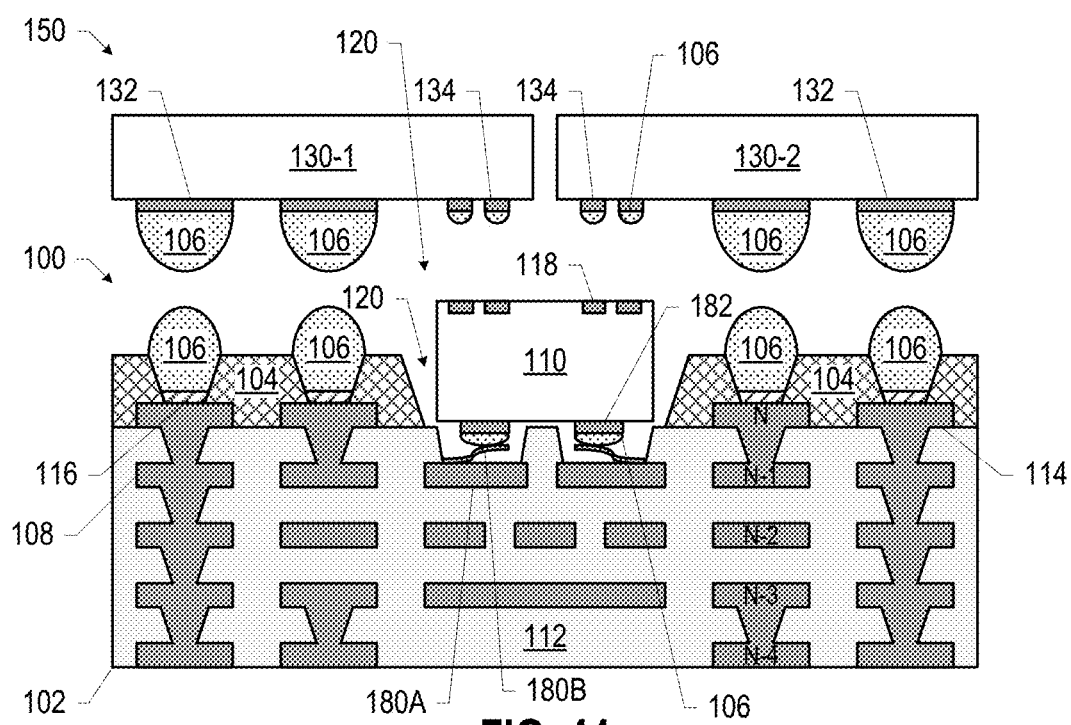

Although the conductive contacts 180 of FIGS. 39-41 have been illustrated as having a substantially planar surface facing the bridge component 110, in other embodiments, the conductive contacts 180 may have a non-planar surface. Such embodiments may allow the spacing between the bridge component 110 and the substrate 102 to be adjusted during manufacturing, and thereby make it easier to achieve a desired offset distance between a top face of the bridge component 110 and a top face of the substrate 102 to facilitate attachment of the microelectronic components 130. For example, FIGS. 42-44 illustrate microelectronic structures in which the conductive contacts 180 have a planar portion 180A and a non-planar portion 180B. The planar portions 180A may be exposed pads of a metal layer in the substrate 102 (e.g., the N−1 layer or another layer) and the non-planar portions 180B may be placed or otherwise formed on the planar portions 180A. The non-planar portions 180B may have a same material composition as the planar portions 180A, or may have different material compositions. In some embodiments, the non-planar portions 180B may include copper or gold. In some embodiments, the conductive contacts 180 (planar or non-planar) may span multiple bridge components 110 in contact with a common microelectronic component 130.

In the embodiment of FIG. 42, the non-planar portions 180B have an arcuate shape, and may include multiple wire segments shaped into arcs with the ends of the wires secured (e.g., wirebonded) to the planar portions 180A (e.g., forming a dome of wires). In the embodiment of FIG. 43, the non-planar portions 180B have a pointed shape, with the point facing the bridge component 110. Such a pointed shape may be formed by ball bonding a bond wire to the planar portion 180A, and cutting the bond wire to a desired length. In the embodiment of FIG. 44, the non-planar portions 180B have an extended "S" shape, forming a cantilever over the planar portions 180A. Such a cantilever may be formed by stitch bonding a bond wire to the planar portion 180A, and then cutting the bond wire to a desired length. Lithographic techniques may be used instead of or in addition to the wirebonding techniques described herein to form the non-planar portions 180B. In embodiments in which a conductive contact 180 includes a non-planar portion 180B, solder 106 (as shown in FIGS. 42-44) or another interconnect structure may conductive couple the non-planar portion 180B and the conductive contact 182 of the bridge component 110, and the shapes of the non-planar portions 180B may allow the z-height of the bridge component 110 in the microelectronic structure to be adjusted during manufacturing to achieve a desired relative positioning of the bridge component 110 and the substrate 102.

Figure 45:
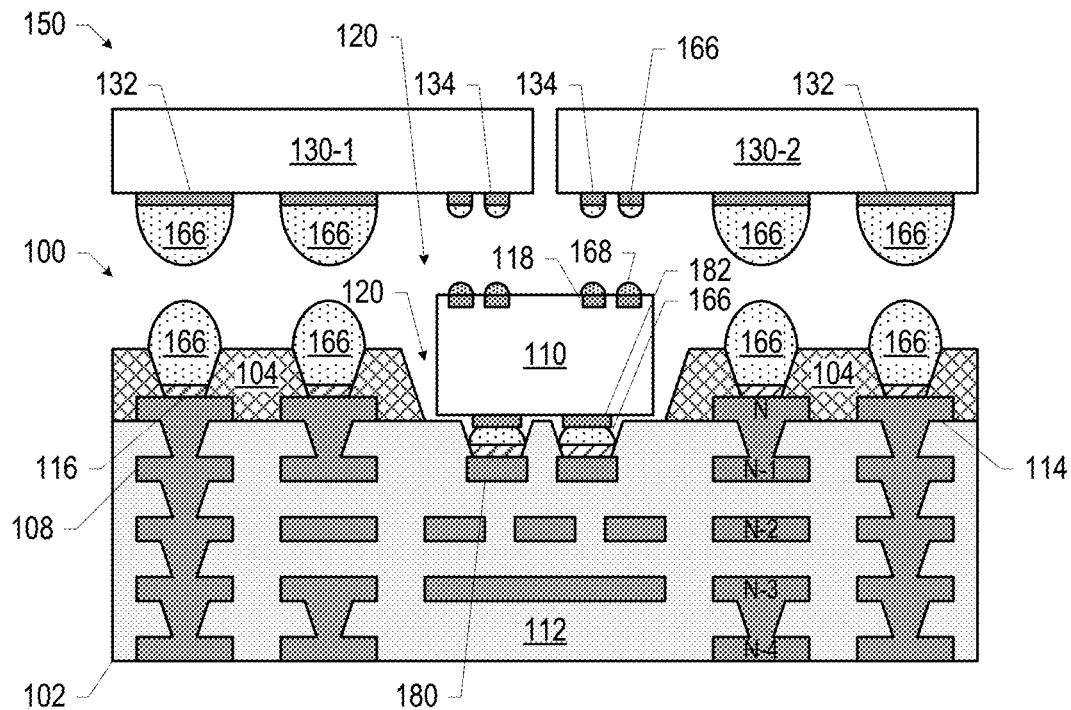
Figure 46:
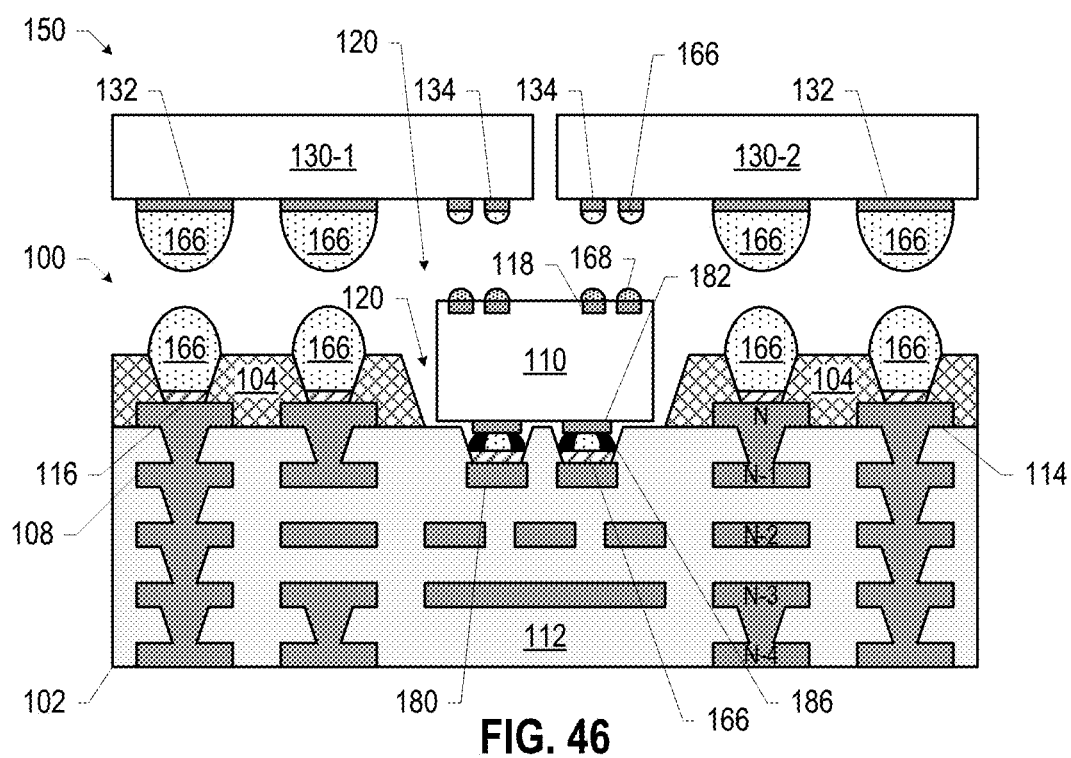
Figure 47:
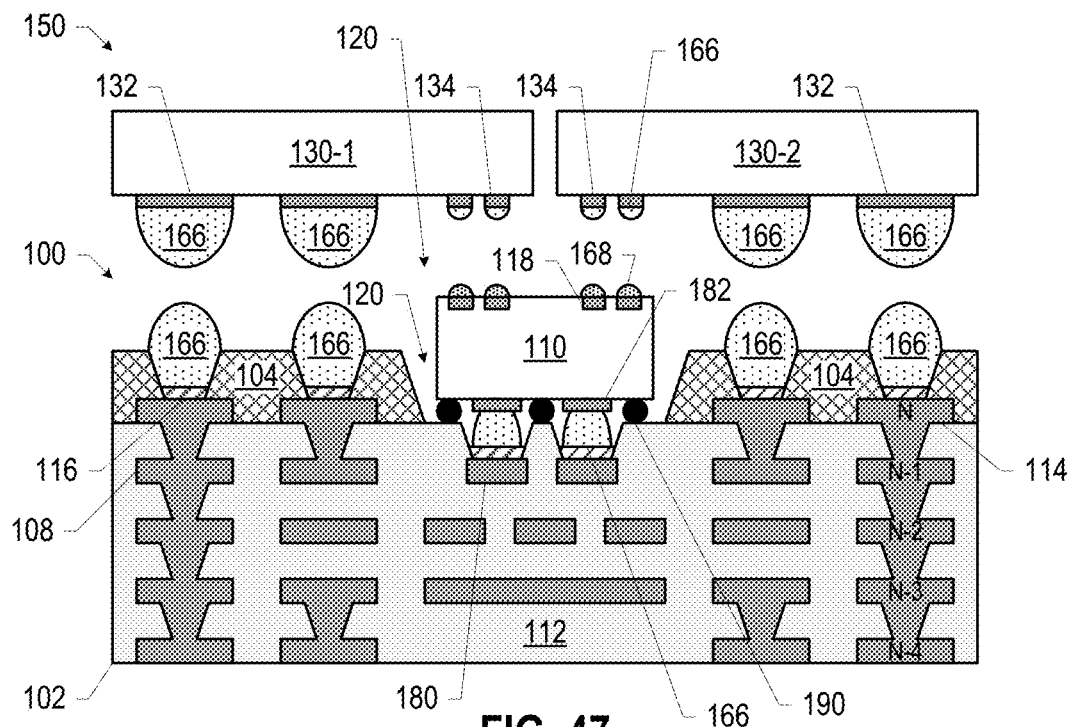

FIGS. 45-47 illustrate additional examples of microelectronic assemblies 150 in which solder having different melting points may be used to improve the ease of manufacturing and the reliability of the interconnections between the elements in a microelectronic assembly 150. For example, FIG. 45 illustrates an embodiment in which low-temperature solder 166 is disposed on the conductive contacts 116/180 of the substrate 102, low-temperature solder 166 is disposed on the conductive contacts 132/134 of the microelectronic components 130, and a high-temperature solder 168 is disposed on the conductive contacts 118 of the bridge component 110. As discussed above, the hierarchy of solder melting temperatures in such a microelectronic assembly 150 may enable selective melting of the solder. For example, utilizing a low-temperature solder 166 on the "bottom" side of the bridge component 110 may allow TCB attachment of the bridge component 110 to the substrate 102 by applying heat from the "top" side or the "bottom" side. Heating the microelectronic structure 100 from the "bottom" side may heat this low-temperature solder 166 more, and thus may be less likely to melt or soften the high-temperature solder 168 at the "top" side of the bridge component 110. Such selective melting of the solder may allow a TCB bond head to contact the high-temperature solder 168 on a "top" face of the bridge component 110 to melt the low-temperature solder 166 at the "bottom" face of the bridge component 110 without undesirably attaching the bridge component 110 to the TCB bond head with melted solder.

FIG. 46 illustrates an embodiment similar to that of FIG. 45, but in which a polymer material 186 (e.g., a joint reinforcement paste) is disposed around the low-temperature solder 166 between the bridge component 110 and the substrate 102. The use of such a polymer material 186 may help "freeze" the coupling between the bridge component 110 and the substrate 102 in place, easing subsequent manufacturing operations.

FIG. 47 illustrates another embodiment similar to that of FIG. 45, but in which adhesive dots 190 (e.g., dots of a cured epoxy) are disposed between the "bottom" face of the bridge component 110 and the dielectric material 112 of the substrate 102. These adhesive dots 190 may be distributed around the low-temperature solder 166, and may be used instead of or in addition to the polymer material 186 (discussed above with reference to FIG. 46) to "freeze" the coupling between the bridge component 110 and the substrate 102 in place, easing subsequent manufacturing operations.

Figure 48:
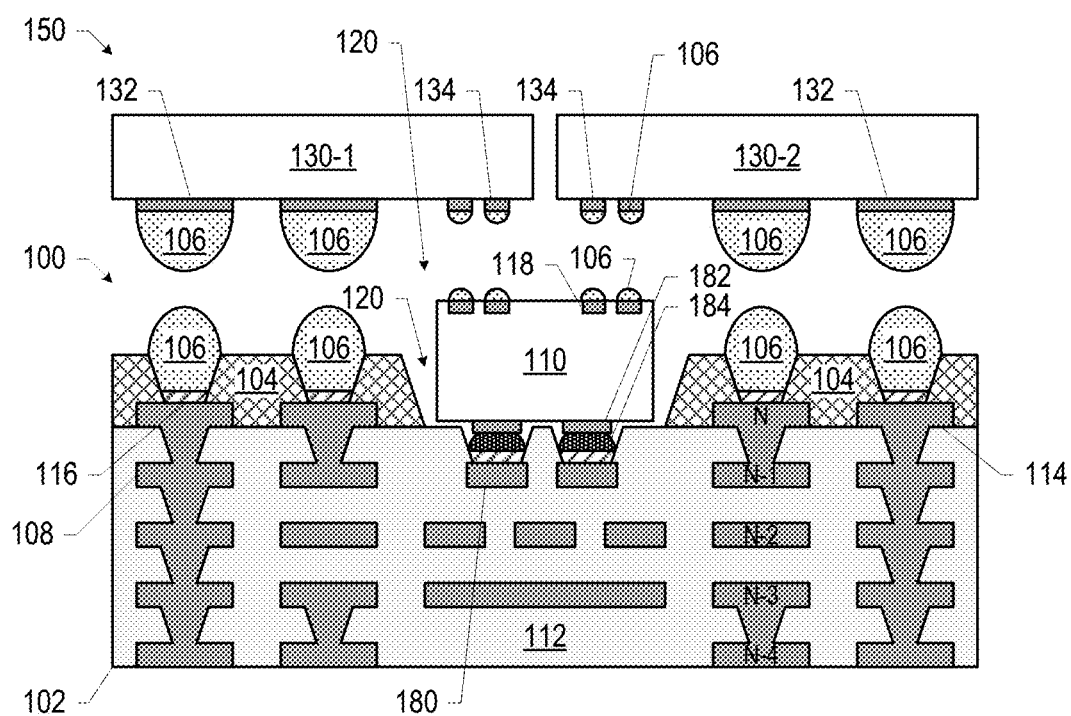

In some embodiments, non-solder materials may be used to conductively couple the bridge component 110 and the substrate 102. For example, FIG. 48 illustrates an embodiment in which a conductive adhesive 184 is used to conductively couple the conductive contacts 182 of the bridge component 110 to the conductive contacts 180 of the substrate 102. In some embodiments, the conductive adhesive 184 may include a polymer and a conductive filler (e.g., a metal, such as silver, or a conductive polymer), and may be cured to "freeze" the coupling between the bridge component 110 and the substrate 102.

Figure 49:
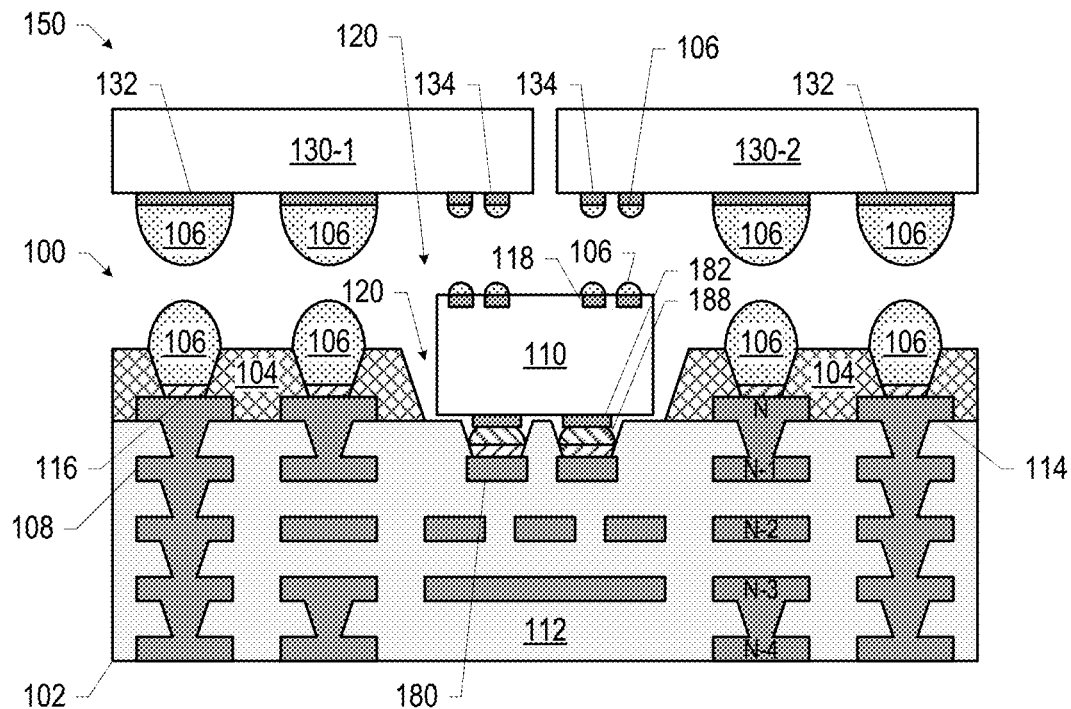

In some embodiments, the solder materials used to couple the bridge component 110 and the substrate 102 may be selected so as to "freeze" the coupling in place for subsequent manufacturing operations. FIG. 49 illustrates an embodiment in which an intermetallic compound (IMC) or transient liquid phase sintering (TLPS) material 188 is used to conductively couple the conductive contacts 182 of the bridge component 110 to the conductive contacts 180 of the substrate 102. In embodiments in which the material 188 is an IMC material, the bridge component 110 may be soldered to the substrate 102 using a solder chemistry in which the initial solder material is quickly converted into a IMC. In some embodiments, such a solder chemistry may include a mix of low-temperature solder particles and high-temperature solder particles suspended in a flux and an epoxy carrier. In embodiments in which the material 188 is a TLPS material, a low-temperature sinterable material (e.g., a copper-tin polymer material having a peak reflow temperature of 220 degrees Celsius) may be heated between the conductive contacts 182 and the conductive contacts 180, forming a strong metallic bond that will not reflow during subsequent assembly operations. A TLPS material 188 may have a distinct sintered structure with epoxy and IMC trapped in internal pockets.

Figure 50:
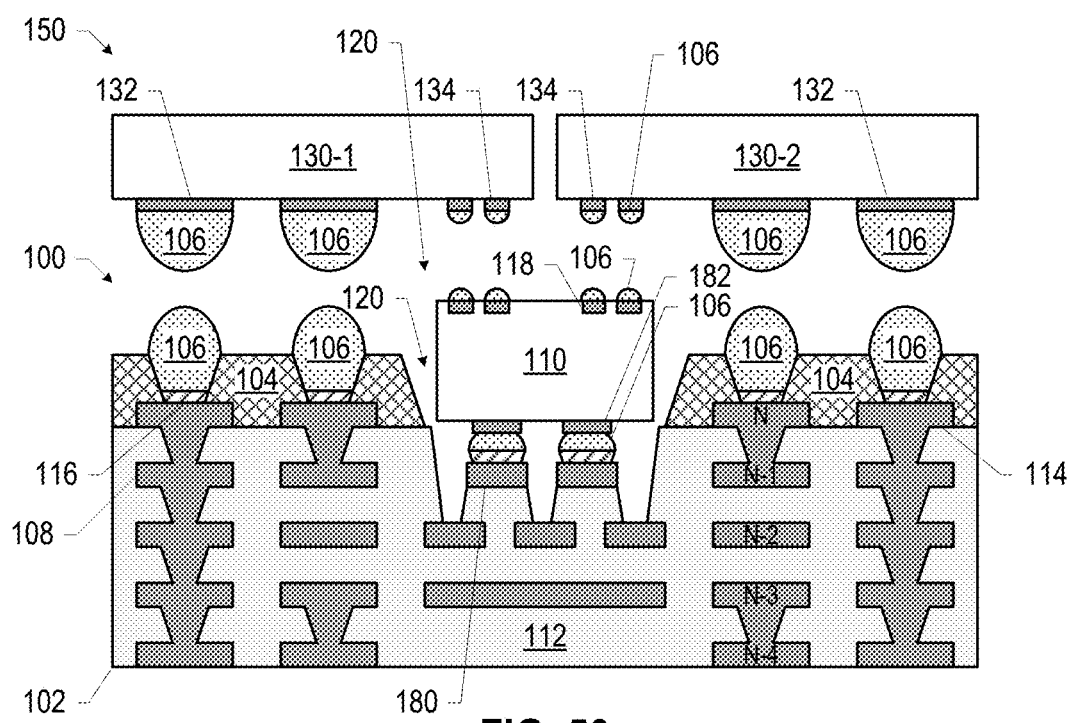
Figure 51:
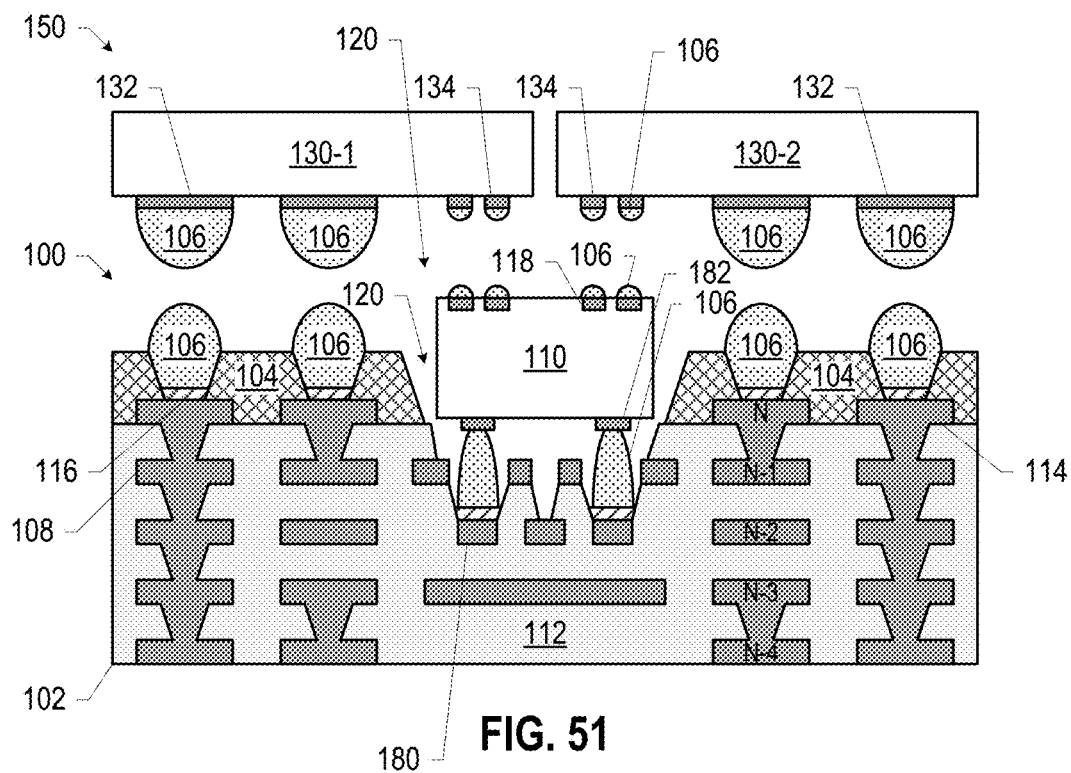

In some embodiments including conductive contacts 180 in a cavity 120 of a substrate 102, the conductive contacts 180 may or may not be located at the "deepest" points in the cavity 120. Such embodiments may advantageously provide greater volume between the bridge component 110 and the substrate 102, providing a large enough "chip gap" to allow an underfill material to be used between the bridge component 110 and the substrate 102. For example, FIG. 50 illustrates an embodiment in which the conductive contacts 180 are located in the N−1 layer, and the cavity 120 extends down to the N−2 layer. In some such embodiments, the metal in the N−1 and N−2 layers together may provide a laser stop for a laser drill used to form the cavity 120, and thus some portions of the cavity 120 may extend down the N−2 layer. FIG. 51 illustrates an embodiment similar to that of FIG. 50, but in which the conductive contacts 180 are located in the N−2 layer, and some of the bottom surface of the cavity 120 is provided by metal in the N−1 layer. Again, as discussed with reference to FIG. 50, in some embodiments like that of FIG. 51, the metal in the N−1 and N−2 layers together may provide a laser stop for a laser drill used to form the cavity 120, and thus some portions of the cavity 120 may extend down the N−2 layer. The metal of the N−1 layer closest to a conductive contact 180 may provide a ring around that conductive contact 180 so as to avoid an undesirable electrical short if the solder 106 on the conductive contact 180 contacts the nearest N−1 metal.

Figure 52:
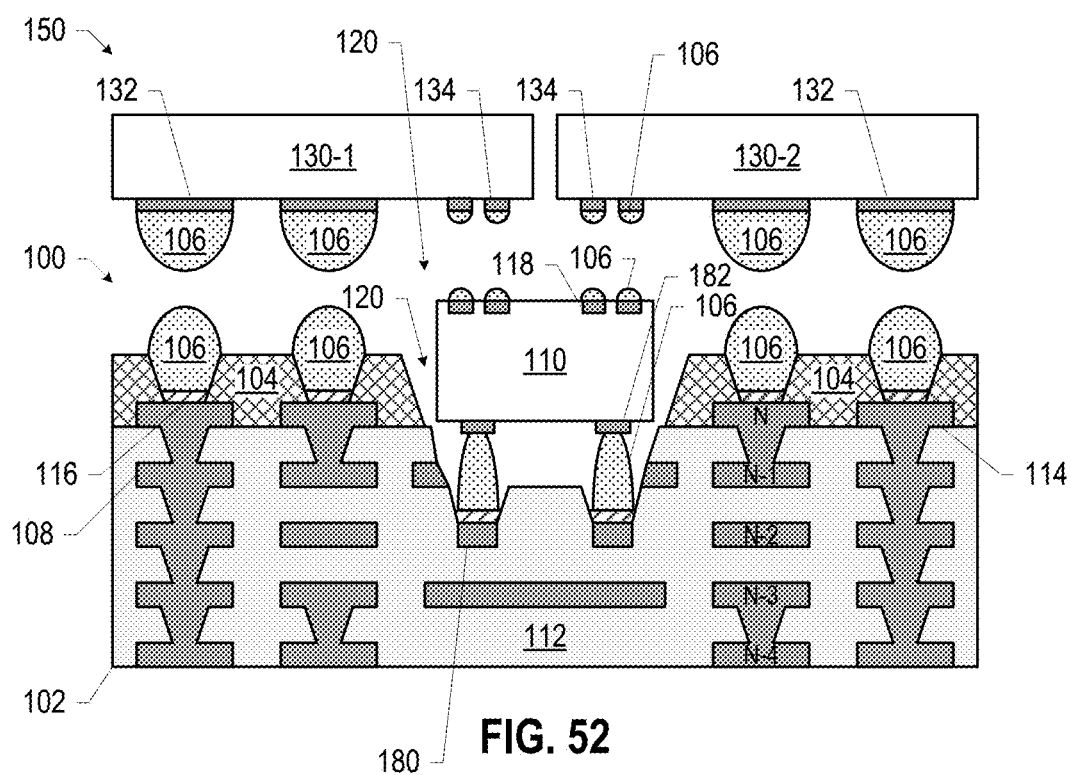

FIG. 52 illustrates an embodiment in which, like the embodiment of FIG. 51, the conductive contacts 180 are located in the N−2 layer, but some of the bottom surface of the cavity 120 is provided by the dielectric material 112 underlying the N−1 layer. A substrate 102 like that of FIG. 52 may be fabricated by providing a solid metal portion in the area of the cavity 120 in the N−1 layer (as part of the initial substrate manufacturing process), and performing an initial cavity formation step by laser drilling and stopping on this solid metal portion; the solid metal portion may then be removed (e.g., by etch, and possibly leaving some of the peripheral metal of the solid metal portion behind, as shown in FIG. 52), and then a second cavity formation step of laser drilling may be performed to expose the conductive contacts 180 in the N−2 layer.

Figure 53:
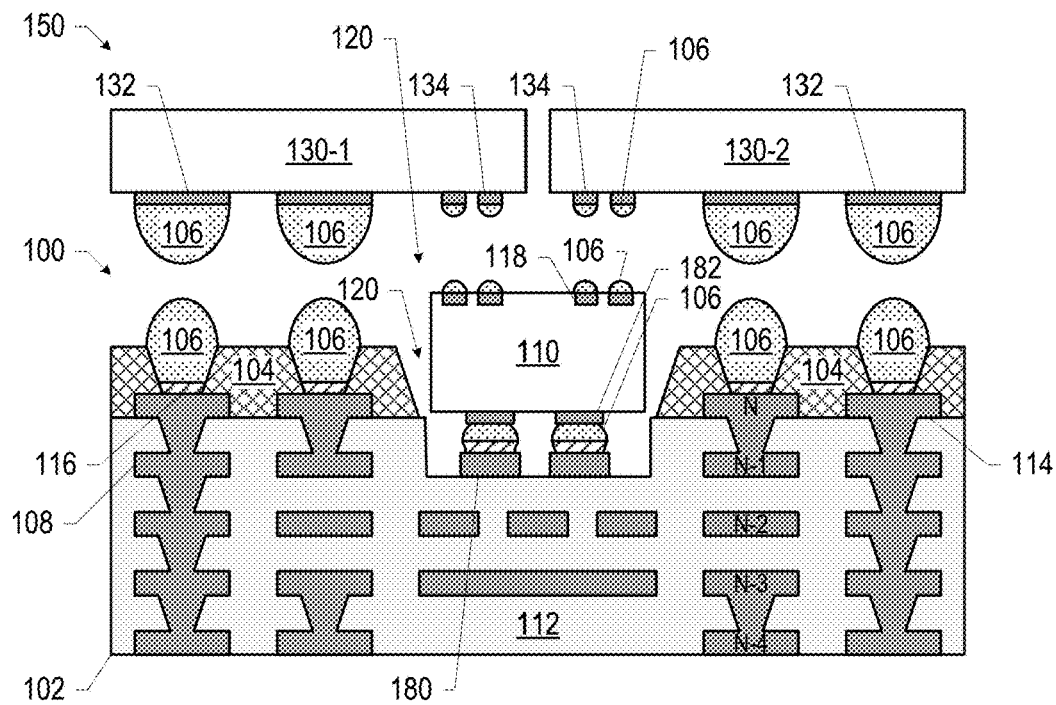
FIGS. 53-54 are side, cross-sectional views of various stages in an example process for the manufacture of the microelectronic structure of FIG. 52.
Figure 54:
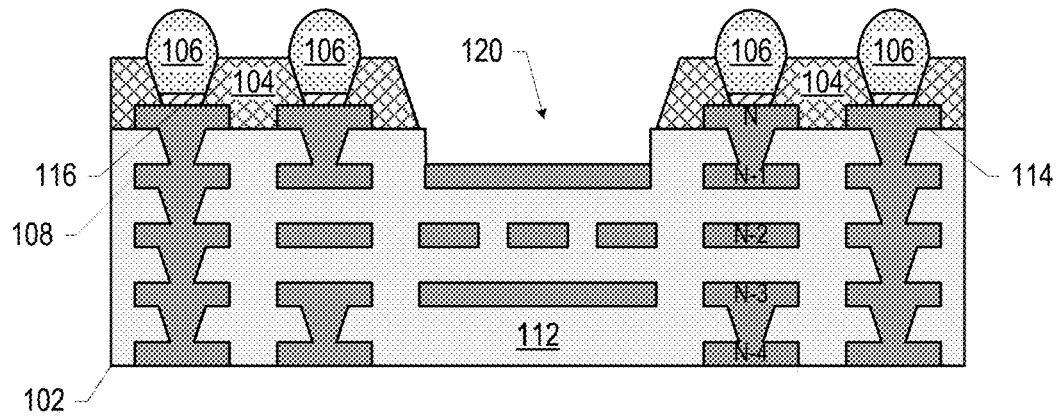
Figure 55:
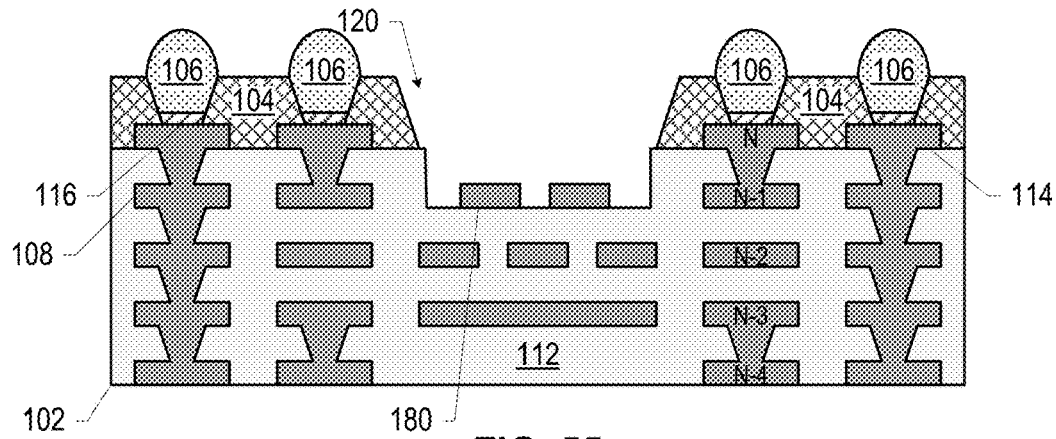
FIGS. 55-57 are side, cross-sectional, exploded views of example microelectronic assemblies, in accordance with various embodiments.

FIG. 53 illustrates another embodiment in which the conductive contacts 180 are located in a metal layer below the N layer (e.g., the N−1 layer, as shown), and some of the bottom surface of the cavity 120 is provided by the dielectric material 112. In contrast to the embodiment of FIG. 52, the dielectric material 112 at the bottom of the cavity 120 is the dielectric material 112 underlying the metal layer in which the conductive contacts 180 are disposed (i.e., the top surface of the dielectric material 112 at the bottom of the cavity 120 is coplanar with the bottom surface of the conductive contacts 180). FIGS. 54-55 are side, cross-sectional views of various stages in an example process for the manufacture of the microelectronic structure of FIG. 53. FIG. 54 illustrates an assembly subsequent to laser drilling into the assembly of FIG. 7, stopping at a solid metal portion in the area of the cavity 120 in the N−1 layer (as part of the initial substrate manufacturing process). FIG. 55 illustrates an assembly subsequent to performing a patterned etch of some of the solid metal portion of FIG. 54, with the remaining metal providing the conductive contacts 180. A bridge component 110 may then be attached to the assembly of FIG. 55 to form a microelectronic structure 100, and microelectronic components 130 may be coupled to the microelectronic structure 100 to form the microelectronic assembly 150 of FIG. 53.

Figure 56:
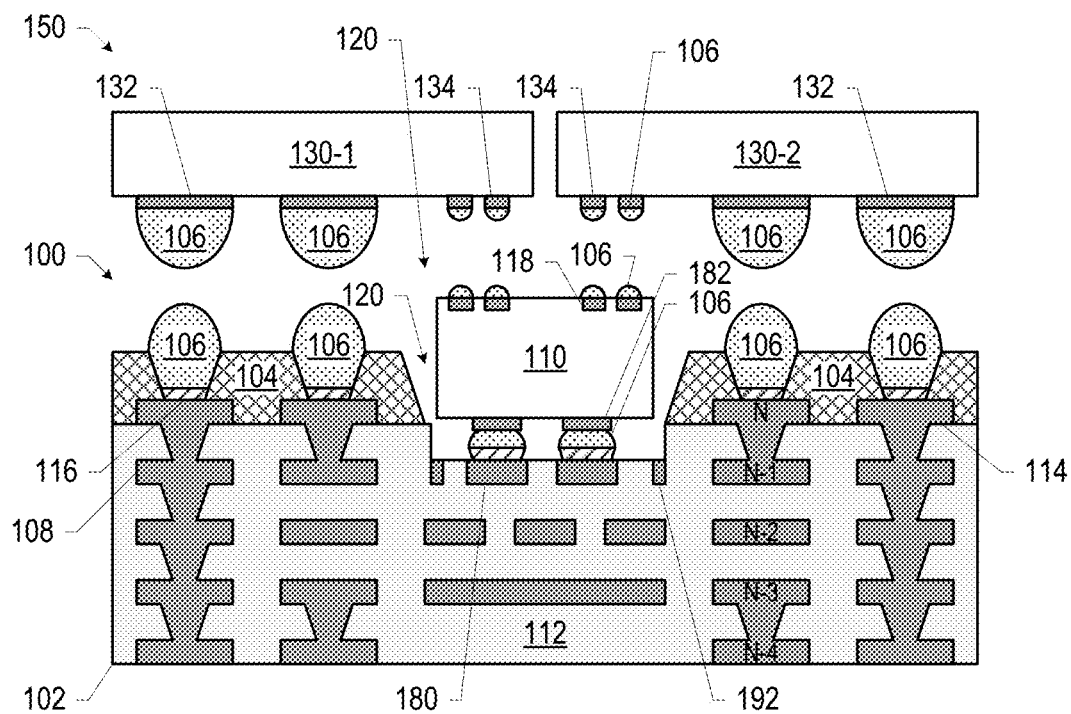

FIG. 56 illustrates another embodiment in which the conductive contacts 180 are located in a metal layer below the N layer (e.g., the N−1 layer, as shown), and some of the bottom surface of the cavity 120 is provided by the dielectric material 112. In contrast to the embodiment of FIG. 53, the top surface of the dielectric material 112 at the bottom of the cavity 120 is coplanar with the top surface of the conductive contacts 180). An embodiment like that of FIG. 56 may also include a metal ring 192, coplanar with the conductive contacts 180, proximate to the edges of the cavity 120, as shown. A substrate 102 like that of FIG. 56 may be fabricated by providing the conductive contacts 180 and the metal ring 192 in the N−1 layer (as part of the initial substrate manufacturing process), and putting a sacrificial film over the area on the N−1 layer corresponding to the cavity 120; after completion of the initial substrate 102, a ring corresponding to the edges of the cavity 120 may be laser drilled, stopping on the metal ring 192, and the sacrificial film (now exposed at its edges) may be released and any material above the sacrificial film may be removed.

Although various ones of the embodiments disclosed herein have been illustrated for embodiments in which the conductive contacts 118 at the "top" face of the bridge component 110 are exposed in the microelectronic structure 100 (i.e., an "open cavity" arrangement), any suitable ones of the embodiments disclosed herein may be utilized in embodiments in which additional layers of the substrate 102 are built up over the bridge component 110, enclosing the bridge component 110 (i.e., an "embedded" arrangement). For example, FIG. 57 illustrates a microelectronic assembly 150 like that of FIG. 50, but in which additional dielectric material 112 and metal layers are disposed "above" the bridge component 110. As shown in FIG. 57, conductive pads and vias through this "additional" material may be used to allow microelectronic components 130 to conductively couple to the conductive contacts 118 via the intervening material of the substrate 102. Similarly, any suitable ones of the embodiments disclosed herein may be utilized in such an embedded arrangement.

The microelectronic structures 100 and microelectronic assemblies 150 disclosed herein may be included in any suitable electronic component. FIGS. 58-61 illustrate various examples of apparatuses that may include any of the microelectronic structures 100 and microelectronic assemblies 150 disclosed herein, or may be included in microelectronic structures 100 and microelectronic assemblies 150 disclosed herein, as appropriate.

Figure 58:
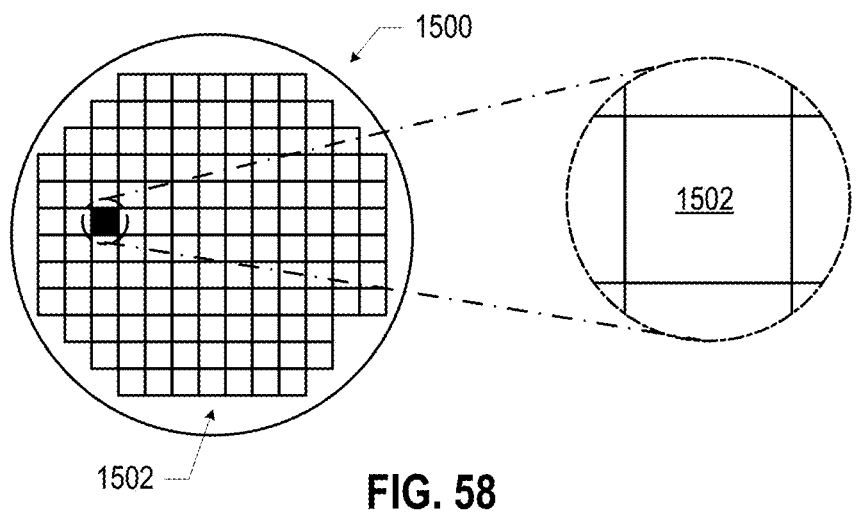
FIG. 58 is a top view of a wafer and dies that may be included in a microelectronic structure or microelectronic assembly in accordance with any of the embodiments disclosed herein.

FIG. 58 is a top view of a wafer 1500 and dies 1502 that may be included in any of the microelectronic structures 100 and microelectronic assemblies 150 disclosed herein. For example, a die 1502 may be included in a microelectronic structure 100/microelectronic assembly 150 as (or part of) a bridge component 110 and/or a microelectronic component 130. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more one or more transistors (e.g., some of the transistors 1640 of FIG. 59, discussed below), one or more diodes, and/or supporting circuitry to route electrical signals to the transistors, as well as any other IC components. In some embodiments, a die 1502 may be a "passive" die in that it includes no active components (e.g., transistors), while in other embodiments, a die 1502 may be an "active" die in that it includes active components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 61) or other logic that is configured to store information in the memory devices or execute instructions stored in the memory array.

Figure 59:
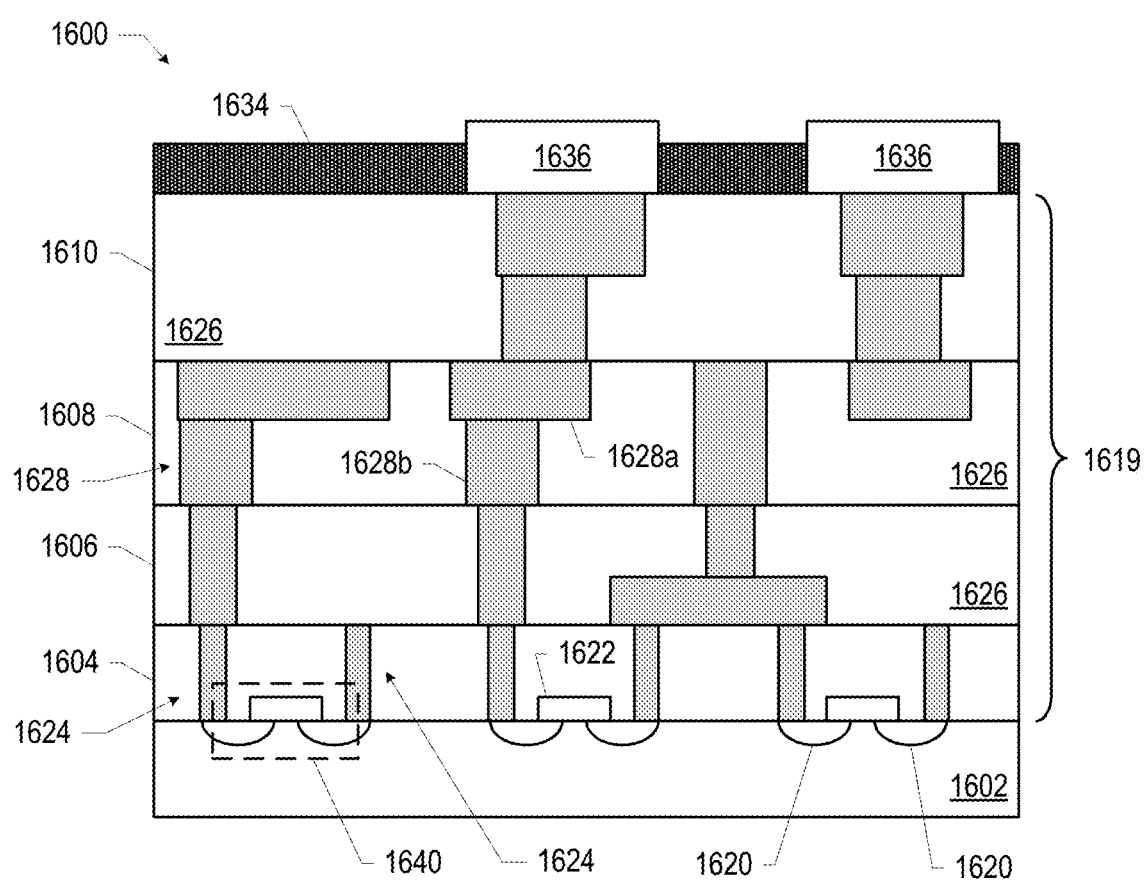
FIG. 59 is a side, cross-sectional view of an integrated circuit (IC) device that may include be included in a microelectronic structure or microelectronic assembly in accordance with any of the embodiments disclosed herein.

FIG. 59 is a side, cross-sectional view of an IC device 1600 that may be included in a microelectronic structure 100 and/or a microelectronic assembly 150. For example, an IC device 1600 may be included in a microelectronic structure 100/microelectronic assembly 150 as (or part of) a bridge component 110 and/or a microelectronic component 130. An IC device 1600 may be part of a die 1502 (e.g., as discussed above with reference to FIG. 58). One or more of the IC devices 1600 may be included in one or more dies 1502 (FIG. 58). The IC device 1600 may be formed on a substrate 1602 (e.g., the wafer 1500 of FIG. 58) and may be included in a die (e.g., the die 1502 of FIG. 58). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 58) or a wafer (e.g., the wafer 1500 of FIG. 58).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 59 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures.

For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 59 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, an IC device 1600 may be a "passive" device in that it includes no active components (e.g., transistors), while in other embodiments, a die 1502 may be an "active" die in that it includes active components.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 59). Although a particular number of interconnect layers 1606-1610 is depicted in FIG. 59, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 59. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 59. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a surface insulation material 1634 (e.g., polyimide or similar material) and one or more conductive contacts 1636 formed on the interconnect layers 1606-1610. In FIG. 59, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 60:
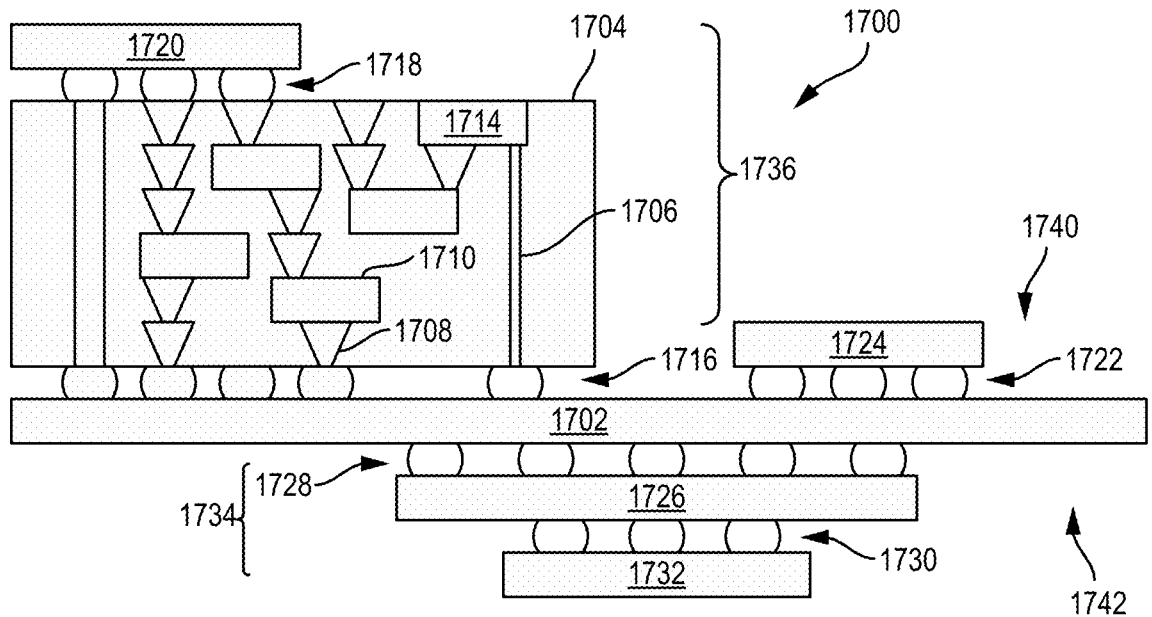
FIG. 60 is a side, cross-sectional view of an IC device assembly that may include a microelectronic structure or microelectronic assembly in accordance with any of the embodiments disclosed herein.

FIG. 60 is a side, cross-sectional view of an IC device assembly 1700 that may include one or more microelectronic structures 100 and/or microelectronic assemblies 150, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the microelectronic assemblies 150 discussed herein, or may otherwise include any of the microelectronic structures 100 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 60 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 60), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 60, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 58), an IC device (e.g., the IC device 1600 of FIG. 59), or any other suitable component. Generally, the package interposer 1704 may spread a connection to a wider pitch or reroute a connection to a different connection. For example, the package interposer 1704 may couple the IC package 1720 (e.g., a die) to a set of ball grid array (BGA) conductive contacts of the coupling components 1716 for coupling to the circuit board 1702. In the embodiment illustrated in FIG. 60, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more microelectronic structures 100 and/or microelectronic assemblies 150.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 60 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 61:
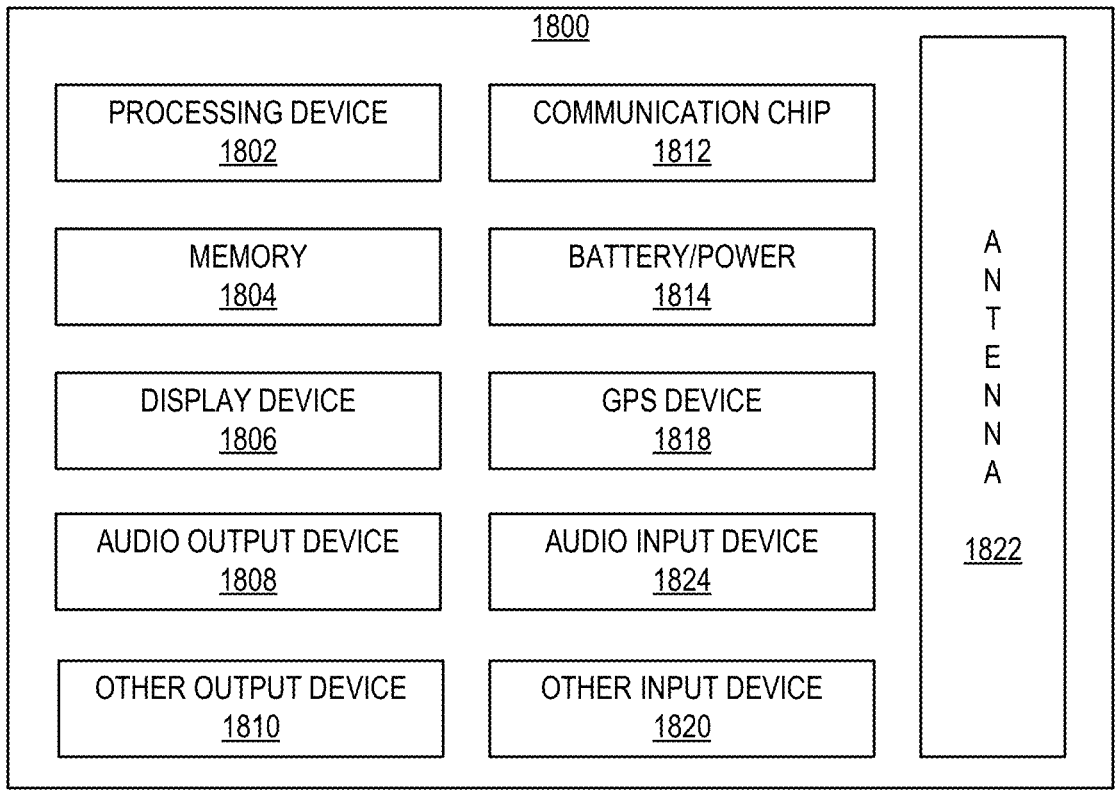
FIG. 61 is a block diagram of an example electrical device that may include a microelectronic structure or microelectronic assembly in accordance with any of the embodiments disclosed herein.

FIG. 61 is a block diagram of an example electrical device 1800 that may include one or more microelectronic structures 100 and/or microelectronic assemblies 150 in accordance with any of the embodiments disclosed herein. For example, any suitable ones of the components of the electrical device 1800 may include one or more of the microelectronic structures 100, microelectronic assemblies 150, IC device assemblies 1700, IC devices 1600, or dies 1502 disclosed herein. A number of components are illustrated in FIG. 61 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 61, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is a microelectronic structure, including: a substrate including a surface insulation material at a face of the substrate; a cavity in the substrate, wherein the cavity extends at least through the surface insulation material; and a bridge component in the cavity, wherein the bridge component includes a first face and an opposing second face, the second face of the bridge component is between the first face of the bridge component and the substrate, and the bridge component includes conductive contacts at the first face of the bridge component.

Example A2 includes the subject matter of Example A1, and further specifies that the substrate includes an organic dielectric material.

Example A3 includes the subject matter of any of Examples A1-2, and further specifies that the substrate includes a conductive contact at the face of the substrate, the surface insulation material includes an opening, and the conductive contact of the substrate is at a bottom of the opening.

Example A4 includes the subject matter of Example A3, and further includes: solder on the conductive contact of the substrate.

Example A5 includes the subject matter of any of Examples A3-4, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example A6 includes the subject matter of Example A5, and further specifies that the second conductive contact is a second-level interconnect contact.

Example A7 includes the subject matter of any of Examples A1-6, and further specifies that the cavity is tapered, narrowing towards a bottom of the cavity.

Example A8 includes the subject matter of any of Examples A1-7, and further specifies that a dielectric material of the substrate is at a bottom of the cavity.

Example A9 includes the subject matter of Example A8, and further specifies that the bridge component is coupled to the dielectric material.

Example A10 includes the subject matter of Example A9, and further specifies that the bridge component is coupled to the dielectric material by an adhesive.

Example A11 includes the subject matter of any of Examples A8-10, and further specifies that the bottom of the cavity is coplanar with a bottom of a conductive contact of the substrate at the face of the substrate.

Example A12 includes the subject matter of any of Examples A1-7, and further specifies that a metal is at a bottom of the cavity.

Example A13 includes the subject matter of Example A12, and further specifies that a bottom of the metal is coplanar with a bottom of the surface insulation material.

Example A14 includes the subject matter of any of Examples A12-13, and further specifies that the metal extends onto the surface insulation material at side faces of the cavity.

Example A15 includes the subject matter of any of Examples A12-14, and further specifies that the metal has a thickness that is less than a thickness of a conductive contact of the substrate at the face of the substrate.

Example A16 includes the subject matter of Example A15, and further specifies that the thickness of the metal is less than 5 microns.

Example A17 includes the subject matter of any of Examples A12-13, and further specifies that a top of the metal is coplanar with a top of a conductive contact of the substrate at the face of the substrate.

Example A18 includes the subject matter of Example A17, and further specifies that a thickness of the metal is greater than 5 microns.

Example A19 includes the subject matter of any of Examples A12-18, and further specifies that the bridge component is coupled to the metal.

Example A20 includes the subject matter of Example A19, and further specifies that the bridge component is coupled to the metal by an adhesive.

Example A21 includes the subject matter of Example A20, and further specifies that the adhesive includes a snap-curable adhesive.

Example A22 includes the subject matter of any of Examples A12-21, and further specifies that the metal includes nickel, palladium, and gold.

Example A23 includes the subject matter of any of Examples A12-21, and further specifies that the metal includes aluminum.

Example A24 includes the subject matter of any of Examples A12-21, and further specifies that the metal includes copper.

Example A25 includes the subject matter of any of Examples A1-24, and further specifies that a bottom of the cavity has an undulating surface.

Example A26 includes the subject matter of Example A25, and further specifies that the undulations have an amplitude between 1 micron and 10 microns.

Example A27 includes the subject matter of any of Examples A25, and further specifies that the undulations have an amplitude that is less than 1 micron.

Example A28 includes the subject matter of any of Examples A1-27, and further specifies that the surface insulation material has a thickness between 10 microns and 30 microns.

Example A29 includes the subject matter of any of Examples A1-28, and further specifies that the bridge component includes a semiconductor material.

Example A30 includes the subject matter of any of Examples A1-29, and further specifies that the bridge component has a thickness that is less than 100 microns.

Example A31 is a microelectronic assembly, including: a substrate; a cavity at a face of the substrate; a bridge component in the cavity, wherein the bridge component includes a first face and an opposing second face, the second face of the bridge component is between the first face of the bridge component and the substrate, and the bridge component includes conductive contacts at the first face of the bridge component; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are conductively coupled to conductive contacts of the substrate at the face of the substrate, and some of the conductive contacts of the microelectronic component are conductively coupled to conductive contacts at the first face of the bridge component.

Example A32 includes the subject matter of Example A31, and further specifies that the substrate includes an organic dielectric material.

Example A33 includes the subject matter of any of Examples A31-32, and further specifies that the substrate includes a surface insulation material at the face of the substrate, the surface insulation material includes an opening, and the conductive contact of the substrate is at a bottom of the opening.

Example A34 includes the subject matter of Example A33, and further includes: solder on the conductive contact of the substrate.

Example A35 includes the subject matter of any of Examples A33-34, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example A36 includes the subject matter of Example A35, and further specifies that the second conductive contact is a second-level interconnect contact.

Example A37 includes the subject matter of any of Examples A31-36, and further specifies that the cavity is tapered, narrowing towards a bottom of the cavity.

Example A38 includes the subject matter of any of Examples A31-37, and further specifies that a dielectric material of the substrate is at a bottom of the cavity.

Example A39 includes the subject matter of Example A38, and further specifies that the bridge component is coupled to the dielectric material.

Example A40 includes the subject matter of Example A39, and further specifies that the bridge component is coupled to the dielectric material by an adhesive.

Example A41 includes the subject matter of any of Examples A38-40, and further specifies that the bottom of the cavity is coplanar with a bottom of a conductive contact of the substrate at the face of the substrate.

Example A42 includes the subject matter of any of Examples A31-37, and further specifies that a metal is at a bottom of the cavity.

Example A43 includes the subject matter of Example A42, and further specifies that a bottom of the metal is coplanar with a bottom of surface insulation material at the face of the substrate.

Example A44 includes the subject matter of any of Examples A42-43, and further specifies that the metal extends onto surface insulation material at side faces of the cavity.

Example A45 includes the subject matter of any of Examples A42-44, and further specifies that the metal has a thickness that is less than a thickness of a conductive contact of the substrate at the face of the substrate.

Example A46 includes the subject matter of Example A45, and further specifies that the thickness of the metal is less than 5 microns.

Example A47 includes the subject matter of any of Examples A42-43, and further specifies that a top of the metal is coplanar with a top of a conductive contact of the substrate at the face of the substrate.

Example A48 includes the subject matter of Example A47, and further specifies that a thickness of the metal is greater than 5 microns.

Example A49 includes the subject matter of any of Examples A42-48, and further specifies that the bridge component is coupled to the metal.

Example A50 includes the subject matter of Example A49, and further specifies that the bridge component is coupled to the metal by an adhesive.

Example A51 includes the subject matter of Example A50, and further specifies that the adhesive includes a snap-curable adhesive.

Example A52 includes the subject matter of any of Examples A42-51, and further specifies that the metal includes nickel, palladium, and gold.

Example A53 includes the subject matter of any of Examples A42-51, and further specifies that the metal includes aluminum.

Example A54 includes the subject matter of any of Examples A42-51, and further specifies that the metal includes copper.

Example A55 includes the subject matter of any of Examples A31-54, and further specifies that a bottom of the cavity has an undulating surface.

Example A56 includes the subject matter of Example A55, and further specifies that the undulations have an amplitude between 1 micron and 10 microns.

Example A57 includes the subject matter of Example A55, and further specifies that the undulations have an amplitude that is less than 1 micron.

Example A58 includes the subject matter of any of Examples A31-57, and further specifies that surface insulation material at the face of the substrate has a thickness between 10 microns and 30 microns.

Example A59 includes the subject matter of any of Examples A31-58, and further specifies that the bridge component includes a semiconductor material.

Example A60 includes the subject matter of any of Examples A31-59, and further specifies that the bridge component has a thickness that is less than 100 microns.

Example A61 includes the subject matter of any of Examples A31-60, and further specifies that a pitch of conductive contacts of the substrate is greater than a pitch of conductive contacts of the bridge component.

Example A62 includes the subject matter of any of Examples A31-61, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example A63 includes the subject matter of any of Examples A31-62, and further specifies that the microelectronic component includes a die.

Example A64 includes the subject matter of any of Examples A31-63, and further includes: a fill compound between the microelectronic component and the substrate.

Example A65 includes the subject matter of Example A64, and further specifies that the fill compound extends between the microelectronic component and the bridge component.

Example A66 includes the subject matter of any of Examples A31-65, and further specifies that the microelectronic component includes a transistor.

Example A67 includes the subject matter of any of Examples A31-66, and further specifies that the microelectronic component includes a memory device.

Example A68 includes the subject matter of any of Examples A31-67, and further specifies that the microelectronic assembly has a footprint that is less than 100 square millimeters.

Example A69 includes the subject matter of any of Examples A31-68, and further specifies that conductive contacts of the substrate include a surface finish, and the surface finish includes nickel.

Example A70 includes the subject matter of Example A69, and further specifies that the surface finish further includes palladium and gold.

Example A71 is an electronic device, including: a circuit board; and a microelectronic assembly conductively coupled to the circuit board, wherein the microelectronic assembly includes: a substrate; a cavity at a face of the substrate; a bridge component in the cavity; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are coupled by solder to conductive contacts of the substrate, and some of the conductive contacts of the microelectronic component are coupled by solder to conductive contacts of the bridge component.

Example A72 includes the subject matter of Example A71, and further specifies that the substrate includes an organic dielectric material.

Example A73 includes the subject matter of any of Examples A71-72, and further specifies that the substrate includes a surface insulation material at the face of the substrate, the surface insulation material includes an opening, and the conductive contact of the substrate is at a bottom of the opening.

Example A74 includes the subject matter of Example A73, and further includes: solder on the conductive contact of the substrate.

Example A75 includes the subject matter of any of Examples A73-74, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example A76 includes the subject matter of Example A75, and further specifies that the second conductive contact is a second-level interconnect contact.

Example A77 includes the subject matter of any of Examples A71-76, and further specifies that the cavity is tapered, narrowing towards a bottom of the cavity.

Example A78 includes the subject matter of any of Examples A71-77, and further specifies that a dielectric material of the substrate is at a bottom of the cavity.

Example A79 includes the subject matter of Example A78, and further specifies that the bridge component is coupled to the dielectric material.

Example A80 includes the subject matter of Example A79, and further specifies that the bridge component is coupled to the dielectric material by an adhesive.

Example A81 includes the subject matter of any of Examples A78-80, and further specifies that the bottom of the cavity is coplanar with a bottom of a conductive contact of the substrate at the face of the substrate.

Example A82 includes the subject matter of any of Examples A71-77, and further specifies that a metal is at a bottom of the cavity.

Example A83 includes the subject matter of Example A82, and further specifies that a bottom of the metal is coplanar with a bottom of surface insulation material at the face of the substrate.

Example A84 includes the subject matter of any of Examples A82-83, and further specifies that the metal extends onto surface insulation material at side faces of the cavity.

Example A85 includes the subject matter of any of Examples A82-84, and further specifies that the metal has a thickness that is less than a thickness of a conductive contact of the substrate at the face of the substrate.

Example A86 includes the subject matter of Example A85, and further specifies that the thickness of the metal is less than 5 microns.

Example A87 includes the subject matter of any of Examples A82-83, and further specifies that a top of the metal is coplanar with a top of a conductive contact of the substrate at the face of the substrate.

Example A88 includes the subject matter of Example A87, and further specifies that a thickness of the metal is greater than 5 microns.

Example A89 includes the subject matter of any of Examples A82-88, and further specifies that the bridge component is coupled to the metal.

Example A90 includes the subject matter of Example A89, and further specifies that the bridge component is coupled to the metal by an adhesive.

Example A91 includes the subject matter of Example A90, and further specifies that the adhesive includes a snap-curable adhesive.

Example A92 includes the subject matter of any of Examples A82-91, and further specifies that the metal includes nickel, palladium, and gold.

Example A93 includes the subject matter of any of Examples A82-91, and further specifies that the metal includes aluminum.

Example A94 includes the subject matter of any of Examples A82-91, and further specifies that the metal includes copper.

Example A95 includes the subject matter of any of Examples A71-94, and further specifies that a bottom of the cavity has an undulating surface.

Example A96 includes the subject matter of Example A95, and further specifies that the undulations have an amplitude between 1 micron and 10 microns.

Example A97 includes the subject matter of Example A95, and further specifies that the undulations have an amplitude that is less than 1 micron.

Example A98 includes the subject matter of any of Examples A71-97, and further specifies that surface insulation material at the face of the substrate has a thickness between 10 microns and 30 microns.

Example A99 includes the subject matter of any of Examples A71-98, and further specifies that the bridge component includes a semiconductor material.

Example A100 includes the subject matter of any of Examples A71-99, and further specifies that the bridge component has a thickness that is less than 100 microns.

Example A101 includes the subject matter of any of Examples A71-100, and further specifies that a pitch of conductive contacts of the substrate is greater than a pitch of conductive contacts of the bridge component.

Example A102 includes the subject matter of any of Examples A71-101, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example A103 includes the subject matter of any of Examples A71-102, and further specifies that the microelectronic component includes a die.

Example A104 includes the subject matter of any of Examples A71-103, and further includes: a fill compound between the microelectronic component and the substrate.

Example A105 includes the subject matter of Example A104, and further specifies that the fill compound extends between the microelectronic component and the bridge component.

Example A106 includes the subject matter of any of Examples A71-105, and further specifies that the microelectronic component includes a transistor.

Example A107 includes the subject matter of any of Examples A71-106, and further specifies that the microelectronic component includes a memory device.

Example A108 includes the subject matter of any of Examples A71-107, and further specifies that the microelectronic assembly has a footprint that is less than 100 square millimeters.

Example A109 includes the subject matter of any of Examples A71-108, and further specifies that conductive contacts of the substrate include a surface finish, and the surface finish includes nickel.

Example A110 includes the subject matter of Example A109, and further specifies that the surface finish further includes palladium and gold.

Example A111 includes the subject matter of any of Examples A71-110, and further specifies that the electronic device is a handheld computing device, a laptop computing device, a wearable computing device, or a server computing device.

Example A112 includes the subject matter of any of Examples A71-111, and further specifies that the circuit board is a motherboard.

Example A113 includes the subject matter of any of Examples A71-112, and further includes: a display communicatively coupled to the circuit board.

Example A114 includes the subject matter of Example A113, and further specifies that the display includes a touchscreen display.

Example A115 includes the subject matter of any of Examples A71-114, and further includes: a housing around the circuit board and the microelectronic assembly.

Example A116 is a method of manufacturing a microelectronic structure, including any of the methods disclosed herein.

Example A117 is a method of manufacturing a microelectronic assembly, including any of the methods disclosed herein.

Example B1 is a microelectronic structure, including: a substrate including a first layer, a last layer, and one or more interior layers between the first layer and the last layer; a cavity in a face of the substrate, wherein the face of the substrate is proximate to the last layer, and the cavity extends through and past the last layer; a metal at a bottom of the cavity; and a bridge component in the cavity, wherein the bridge component includes a first face and an opposing second face, the second face of the bridge component is between the first face of the bridge component and the substrate, and the bridge component includes conductive contacts at the first face of the bridge component.

Example B2 includes the subject matter of Example B1, and further specifies that the substrate includes an organic dielectric material.

Example B3 includes the subject matter of any of Examples B1-2, and further specifies that the substrate includes a conductive contact at the face of the substrate, the substrate includes a surface insulation material at the face of the substrate, the surface insulation material includes an opening, and the conductive contact of the substrate is at a bottom of the opening.

Example B4 includes the subject matter of Example B3, and further includes: solder on the conductive contact of the substrate.

Example B5 includes the subject matter of any of Examples B3-4, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example B6 includes the subject matter of Example B5, and further specifies that the second conductive contact is a second-level interconnect contact.

Example B7 includes the subject matter of any of Examples B1-6, and further specifies that the cavity is tapered, narrowing towards a bottom of the cavity.

Example B8 includes the subject matter of any of Examples B1-7, and further specifies that a metal at a bottom of the cavity is adjacent to a metal line of an interior metal layer of the substrate.

Example B9 includes the subject matter of Example B8, and further specifies that the metal line includes copper.

Example B10 includes the subject matter of Example B9, and further specifies that the metal is different from copper.

Example B11 includes the subject matter of any of Examples B8-10, and further specifies that the metal has a thickness that is less than a thickness of the metal line.

Example B12 includes the subject matter of any of Examples B1-11, and further specifies that the metal extends onto side faces of the cavity.

Example B13 includes the subject matter of any of Examples B1-11, and further specifies that the metal does not extend onto side faces of the cavity.

Example B14 includes the subject matter of any of Examples B1-13, and further specifies that the thickness of the metal is less than 1 micron.

Example B15 includes the subject matter of any of Examples B1-14, and further specifies that the bridge component is coupled to the metal.

Example B16 includes the subject matter of any of Examples B1-15, and further includes: an adhesive between the bridge component and the metal.

Example B17 includes the subject matter of Example B16, and further specifies that the adhesive includes a snap-curable adhesive.

Example B18 includes the subject matter of any of Examples B16-17, and further specifies that the adhesive includes a UV-curable adhesive.

Example B19 includes the subject matter of any of Examples B16-17, and further specifies that the adhesive includes a first adhesive region and a second adhesive region, and a material composition of the first adhesive region is different from a material composition of the second adhesive region.

Example B20 includes the subject matter of Example B19, and further specifies that the first adhesive region is proximate to edges of the bridge component and the second adhesive region is proximate to an interior of the bridge component.

Example B21 includes the subject matter of any of Examples B19-20, and further specifies that the second adhesive region includes a thermally curable adhesive and the first adhesive region includes a snap-curable adhesive.

Example B22 includes the subject matter of any of Examples B16-21, and further specifies that the metal does not extend outside the region between the adhesive and the bottom of the cavity.

Example B23 includes the subject matter of any of Examples B1-22, and further specifies that the metal includes aluminum.

Example B24 includes the subject matter of any of Examples B1-23, and further specifies that the metal includes gold.

Example B25 includes the subject matter of any of Examples B1-24, and further specifies that a diameter of an opening of the cavity is greater than a diameter of a bottom of the cavity by greater than 5 microns.

Example B26 includes the subject matter of any of Examples B1-25, and further specifies that a bottom of the cavity has an undulating surface.

Example B27 includes the subject matter of Example B26, and further specifies that the undulations have an amplitude between 1 micron and 10 microns.

Example B28 includes the subject matter of any of Examples B1-27, and further specifies that surface insulation material of the substrate has a thickness between 10 microns and 30 microns.

Example B29 includes the subject matter of any of Examples B1-28, and further specifies that the bridge component includes a semiconductor material.

Example B30 includes the subject matter of any of Examples B1-29, and further specifies that the bridge component has a thickness that is less than 100 microns.

Example B31 is a microelectronic assembly, including: a substrate; a cavity in a face of the substrate, wherein the face of the substrate is proximate to a metallization layer of the substrate, and the cavity extends through and past the metallization layer; a metal at a bottom of the cavity; a bridge component in the cavity, wherein the bridge component includes a first face and an opposing second face, the second face of the bridge component is between the first face of the bridge component and the substrate, and the bridge component includes conductive contacts at the first face of the bridge component; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are conductively coupled to conductive contacts of the substrate at the face of the substrate, and some of the conductive contacts of the microelectronic component are conductively coupled to conductive contacts at the first face of the bridge component.

Example B32 includes the subject matter of Example B31, and further specifies that the substrate includes an organic dielectric material.

Example B33 includes the subject matter of any of Examples B31-32, and further specifies that the substrate includes a surface insulation material at the face of the substrate, the substrate includes a surface insulation material at the face of the substrate, the surface insulation material includes an opening, and the conductive contact of the substrate is at a bottom of the opening.

Example B34 includes the subject matter of Example B33, and further includes: solder on the conductive contact of the substrate.

Example B35 includes the subject matter of any of Examples B33-34, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example B36 includes the subject matter of Example B35, and further specifies that the second conductive contact is a second-level interconnect contact.

Example B37 includes the subject matter of any of Examples B31-36, and further specifies that the cavity is tapered, narrowing towards a bottom of the cavity.

Example B38 includes the subject matter of any of Examples B31-37, and further specifies that a metal at a bottom of the cavity is adjacent to a metal line of an interior metal layer of the substrate.

Example B39 includes the subject matter of Example B38, and further specifies that the metal line includes copper.

Example B40 includes the subject matter of Example B39, and further specifies that the metal is different from copper.

Example B41 includes the subject matter of any of Examples B38-40, and further specifies that the metal has a thickness that is less than a thickness of the metal line.

Example B42 includes the subject matter of any of Examples B31-41, and further specifies that the metal extends onto side faces of the cavity.

Example B43 includes the subject matter of any of Examples B31-41, and further specifies that the metal does not extend onto side faces of the cavity.

Example B44 includes the subject matter of any of Examples B31-43, and further specifies that the thickness of the metal is less than 1 micron.

Example B45 includes the subject matter of any of Examples B31-44, and further specifies that the bridge component is coupled to the metal.

Example B46 includes the subject matter of any of Examples B31-45, and further includes: an adhesive between the bridge component and the metal.

Example B47 includes the subject matter of Example B46, and further specifies that the adhesive includes a snap-curable adhesive.

Example B48 includes the subject matter of any of Examples B46-47, and further specifies that the adhesive includes a UV-curable adhesive.

Example B49 includes the subject matter of any of Examples B46-47, and further specifies that the adhesive includes a first adhesive region and a second adhesive region, and a material composition of the first adhesive region is different from a material composition of the second adhesive region.

Example B50 includes the subject matter of Example B49, and further specifies that the first adhesive region is proximate to edges of the bridge component and the second adhesive region is proximate to an interior of the bridge component.

Example B51 includes the subject matter of any of Examples B49-50, and further specifies that the second adhesive region includes a thermally curable adhesive and the first adhesive region includes a snap-curable adhesive.

Example B52 includes the subject matter of any of Examples B46-51, and further specifies that the metal does not extend outside the region between the adhesive and the bottom of the cavity.

Example B53 includes the subject matter of any of Examples B31-52, and further specifies that the metal includes aluminum.

Example B54 includes the subject matter of any of Examples B31-53, and further specifies that the metal includes gold.

Example B55 includes the subject matter of any of Examples B31-54, and further specifies that a diameter of an opening of the cavity is greater than a diameter of a bottom of the cavity by greater than 5 microns.

Example B56 includes the subject matter of any of Examples B31-55, and further specifies that a bottom of the cavity has an undulating surface.

Example B57 includes the subject matter of any of Examples B56, and further specifies that the undulations have an amplitude between 1 micron and 10 microns.

Example B58 includes the subject matter of any of Examples B31-57, and further specifies that surface insulation material of the substrate has a thickness between 10 microns and 30 microns.

Example B59 includes the subject matter of any of Examples B31-58, and further specifies that the bridge component includes a semiconductor material.

Example B60 includes the subject matter of any of Examples B31-59, and further specifies that the bridge component has a thickness that is less than 100 microns.

Example B61 includes the subject matter of any of Examples B31-60, and further specifies that a pitch of conductive contacts of the substrate is greater than a pitch of conductive contacts of the bridge component.

Example B62 includes the subject matter of any of Examples B31-61, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example B63 includes the subject matter of any of Examples B31-62, and further specifies that the microelectronic component includes a die.

Example B64 includes the subject matter of any of Examples B31-63, and further includes: a fill compound between the microelectronic component and the substrate.

Example B65 includes the subject matter of Example B64, and further specifies that the fill compound extends between the microelectronic component and the bridge component.

Example B66 includes the subject matter of any of Examples B31-65, and further specifies that the microelectronic component includes a transistor.

Example B67 includes the subject matter of any of Examples B31-66, and further specifies that the microelectronic component includes a memory device.

Example B68 includes the subject matter of any of Examples B31-67, and further specifies that the microelectronic assembly has a footprint that is less than 100 square millimeters.

Example B69 includes the subject matter of any of Examples B31-68, and further specifies that conductive contacts of the substrate include a surface finish, and the surface finish includes nickel.

Example B70 includes the subject matter of Example B69, and further specifies that the surface finish further includes palladium and gold.

Example B71 is an electronic device, including: a circuit board; and a microelectronic assembly conductively coupled to the circuit board, wherein the microelectronic assembly includes: a substrate; a cavity in a face of the substrate, wherein the substrate includes a buildup material, and the cavity extends into the buildup material; a metal at a bottom of the cavity; a bridge component in the cavity; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are coupled by solder to conductive contacts of the substrate, and some of the conductive contacts of the microelectronic component are coupled by solder to conductive contacts of the bridge component.

Example B72 includes the subject matter of Example B71, and further specifies that the substrate includes an organic dielectric material.

Example B73 includes the subject matter of any of Examples B71-72, and further specifies that the substrate includes a surface insulation material at the face of the substrate, the surface insulation material includes an opening, and the conductive contact of the substrate is at a bottom of the opening.

Example B74 includes the subject matter of Example B73, and further includes: solder on the conductive contact of the substrate.

Example B75 includes the subject matter of any of Examples B73-74, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example B76 includes the subject matter of Example B75, and further specifies that the second conductive contact is a second-level interconnect contact.

Example B77 includes the subject matter of any of Examples B71-76, and further specifies that the cavity is tapered, narrowing towards a bottom of the cavity.

Example B78 includes the subject matter of any of Examples B71-77, and further specifies that a metal at a bottom of the cavity is adjacent to a metal line of an interior metal layer of the substrate.

Example B79 includes the subject matter of Example B78, and further specifies that the metal line includes copper.

Example B80 includes the subject matter of Example B79, and further specifies that the metal is different from copper.

Example B81 includes the subject matter of any of Examples B78-80, and further specifies that the metal has a thickness that is less than a thickness of the metal line.

Example B82 includes the subject matter of any of Examples B71-81, and further specifies that the metal extends onto side faces of the cavity.

Example B83 includes the subject matter of any of Examples B71-81, and further specifies that the metal does not extend onto side faces of the cavity.

Example B84 includes the subject matter of any of Examples B71-83, and further specifies that the thickness of the metal is less than 1 micron.

Example B85 includes the subject matter of any of Examples B71-84, and further specifies that the bridge component is coupled to the metal.

Example B86 includes the subject matter of any of Examples B71-85, and further includes: an adhesive between the bridge component and the metal.

Example B87 includes the subject matter of Example B86, and further specifies that the adhesive includes a snap-curable adhesive.

Example B88 includes the subject matter of any of Examples B86-87, and further specifies that the adhesive includes a UV-curable adhesive.

Example B89 includes the subject matter of any of Examples B86-87, and further specifies that the adhesive includes a first adhesive region and a second adhesive region, and a material composition of the first adhesive region is different from a material composition of the second adhesive region.

Example B90 includes the subject matter of Example B89, and further specifies that the first adhesive region is proximate to edges of the bridge component and the second adhesive region is proximate to an interior of the bridge component.

Example B91 includes the subject matter of any of Examples B89-90, and further specifies that the second adhesive region includes a thermally curable adhesive and the first adhesive region includes a snap-curable adhesive.

Example B92 includes the subject matter of any of Examples B86-91, and further specifies that the metal does not extend outside the region between the adhesive and the bottom of the cavity.

Example B93 includes the subject matter of any of Examples B71-92, and further specifies that the metal includes aluminum.

Example B94 includes the subject matter of any of Examples B71-93, and further specifies that the metal includes gold.

Example B95 includes the subject matter of any of Examples B71-94, and further specifies that a diameter of an opening of the cavity is greater than a diameter of a bottom of the cavity by greater than 5 microns.

Example B96 includes the subject matter of any of Examples B71-95, and further specifies that a bottom of the cavity has an undulating surface.

Example B97 includes the subject matter of Example B96, and further specifies that the undulations have an amplitude between 1 micron and 10 microns.

Example B98 includes the subject matter of any of Examples B71-97, and further specifies that surface insulation material of the substrate has a thickness between 10 microns and 30 microns.

Example B99 includes the subject matter of any of Examples B71-98, and further specifies that the bridge component includes a semiconductor material.

Example B100 includes the subject matter of any of Examples B71-99, and further specifies that the bridge component has a thickness that is less than 100 microns.

Example B101 includes the subject matter of any of Examples B71-100, and further specifies that a pitch of conductive contacts of the substrate is greater than a pitch of conductive contacts of the bridge component.

Example B102 includes the subject matter of any of Examples B71-101, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example B103 includes the subject matter of any of Examples B71-102, and further specifies that the microelectronic component includes a die.

Example B104 includes the subject matter of any of Examples B71-103, and further includes: a fill compound between the microelectronic component and the substrate.

Example B105 includes the subject matter of Example B104, and further specifies that the fill compound extends between the microelectronic component and the bridge component.

Example B106 includes the subject matter of any of Examples B71-105, and further specifies that the microelectronic component includes a transistor.

Example B107 includes the subject matter of any of Examples B71-106, and further specifies that the microelectronic component includes a memory device.

Example B108 includes the subject matter of any of Examples B71-107, and further specifies that the microelectronic assembly has a footprint that is less than 100 square millimeters.

Example B109 includes the subject matter of any of Examples B71-108, and further specifies that conductive contacts of the substrate include a surface finish, and the surface finish includes nickel.

Example B110 includes the subject matter of Example B109, and further specifies that the surface finish further includes palladium and gold.

Example B111 includes the subject matter of any of Examples B71-110, and further specifies that the electronic device is a handheld computing device, a laptop computing device, a wearable computing device, or a server computing device.

Example B112 includes the subject matter of any of Examples B71-111, and further specifies that the circuit board is a motherboard.

Example B113 includes the subject matter of any of Examples B71-112, and further includes: a display communicatively coupled to the circuit board.

Example B114 includes the subject matter of any of Examples B113, and further specifies that the display includes a touchscreen display.

Example B115 includes the subject matter of any of Examples B71-114, and further includes: a housing around the circuit board and the microelectronic assembly.

Example B116 is bonding equipment including a bond head and an ultraviolet (UV) light source.

Example B117 includes the subject matter of Example B116, and further specifies that the UV light source is coupled to the bond head.

Example C1 is a microelectronic structure, including: a substrate; a cavity at a face of the substrate; a bridge component in the cavity, wherein the bridge component includes a first face and an opposing second face, the second face of the bridge component is between the first face of the bridge component and the substrate, and the bridge component includes conductive contacts at the first face of the bridge component; a conductive contact at a face of the substrate; and a material between solder and the conductive contact.

Example C2 includes the subject matter of Example C1, and further specifies that the substrate includes an organic dielectric material.

Example C3 includes the subject matter of any of Examples C1-2, and further specifies that the material includes a metal.

Example C4 includes the subject matter of Example C3, and further specifies that the material includes a metal ball.

Example C5 includes the subject matter of Example C4, and further specifies that the metal ball has a diameter that is between 10 microns and 500 microns.

Example C6 includes the subject matter of Example C3, and further specifies that the material includes a metal pillar.

Example C7 includes the subject matter of Example C6, and further specifies that the metal pillar extends past a top surface of a surface insulation material of the substrate by a distance between 10 microns and 50 microns.

Example C8 includes the subject matter of any of Examples C6-7, and further specifies that the metal pillar includes a surface finish on a bulk metal.

Example C9 includes the subject matter of Example C8, and further specifies that the bulk metal includes copper.

Example C10 includes the subject matter of any of Examples C8-9, and further specifies that the surface finish includes nickel, palladium, or gold.

Example C11 includes the subject matter of any of Examples C8-10, and further specifies that the bulk metal is undercut relative to the surface finish.

Example C12 includes the subject matter of any of Examples C3-11, and further specifies that the metal includes copper.

Example C13 includes the subject matter of any of Examples C3-12, and further specifies that the metal includes nickel, palladium, or gold.

Example C14 includes the subject matter of any of Examples C1-2, and further specifies that the solder is a first solder, the material is a second solder, and the first solder has a different material composition than the second solder.

Example C15 includes the subject matter of Example C14, and further specifies that the second solder has a higher melting point than the first solder.

Example C16 includes the subject matter of any of Examples C14-15, and further includes: a third solder between the second solder and the conductive contact, wherein the third solder has a different material composition than the second solder.

Example C17 includes the subject matter of Example C16, and further specifies that the second solder has a higher melting point than the third solder.

Example C18 includes the subject matter of any of Examples C1-17, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example C19 includes the subject matter of Example C18, and further specifies that the second conductive contact is a second-level interconnect contact.

Example C20 includes the subject matter of any of Examples C1-19, and further specifies that the cavity is tapered, narrowing towards a bottom of the cavity.

Example C21 includes the subject matter of any of Examples C1-20, and further specifies that a dielectric material of the substrate is at a bottom of the cavity.

Example C22 includes the subject matter of Example C21, and further specifies that the bridge component is coupled to the dielectric material.

Example C23 includes the subject matter of Example C22, and further specifies that the bridge component is coupled to the dielectric material by an adhesive.

Example C24 includes the subject matter of any of Examples C21-23, and further specifies that the bottom of the cavity is coplanar with a bottom of the conductive contact.

Example C25 includes the subject matter of any of Examples C1-24, and further specifies that a bottom of the cavity has an undulating surface.

Example C26 includes the subject matter of Example C25, and further specifies that the undulations have an amplitude between 1 micron and 10 microns.

Example C27 includes the subject matter of Example C25, and further specifies that the undulations have an amplitude that is less than 1 micron.

Example C28 includes the subject matter of any of Examples C1-27, and further specifies that a surface insulation material proximate to the conductive contact of the substrate has a thickness between 10 microns and 30 microns.

Example C29 includes the subject matter of any of Examples C1-28, and further specifies that the bridge component includes a semiconductor material.

Example C30 includes the subject matter of any of Examples C1-29, and further specifies that the bridge component has a thickness that is less than 100 microns.

Example C31 is a microelectronic assembly, including: a substrate; a cavity at a face of the substrate; a bridge component in the cavity, wherein the bridge component includes a first face and an opposing second face, the second face of the bridge component is between the first face of the bridge component and the substrate, and the bridge component includes conductive contacts at the first face of the bridge component; and a microelectronic component having a first face and an opposing second face, the first face of the microelectronic component is between the second face of the microelectronic component and the substrate, the microelectronic component includes conductive contacts at the first face of the microelectronic component, a conductive contact of the microelectronic component is conductively coupled, by an interconnect, to a conductive contact of the substrate at the face of the substrate, and a conductive contact of the microelectronic component is conductively coupled to a conductive contact at the first face of the bridge component; wherein the interconnect includes solder and a material between the solder and the conductive contact of the substrate, and the material extends beyond a surface of a surface insulation material proximate to the conductive contact of the substrate.

Example C32 includes the subject matter of Example C31, and further specifies that the substrate includes an organic dielectric material.

Example C33 includes the subject matter of any of Examples C31-32, and further specifies that the material includes a metal.

Example C34 includes the subject matter of Example C33, and further specifies that the material includes a metal ball.

Example C35 includes the subject matter of Example C34, and further specifies that the metal ball has a diameter that is between 10 microns and 500 microns.

Example C36 includes the subject matter of Example C33, and further specifies that the material includes a metal pillar.

Example C37 includes the subject matter of Example C36, and further specifies that the metal pillar extends past a top surface of the surface insulation material by a distance between 10 microns and 50 microns.

Example C38 includes the subject matter of any of Examples C36-37, and further specifies that the metal pillar includes a surface finish on a bulk metal.

Example C39 includes the subject matter of Example C38, and further specifies that the bulk metal includes copper.

Example C40 includes the subject matter of any of Examples C38-39, and further specifies that the surface finish includes nickel, palladium, or gold.

Example C41 includes the subject matter of any of Examples C38-40, and further specifies that the bulk metal is undercut relative to the surface finish.

Example C42 includes the subject matter of any of Examples C33-41, and further specifies that the metal includes copper.

Example C43 includes the subject matter of any of Examples C33-42, and further specifies that the metal includes nickel, palladium, or gold.

Example C44 includes the subject matter of any of Examples C31-32, and further specifies that the solder is a first solder, the material is a second solder, and the first solder has a different material composition than the second solder.

Example C45 includes the subject matter of Example C44, and further specifies that the second solder has a higher melting point than the first solder.

Example C46 includes the subject matter of any of Examples C44-45, and further includes: a third solder between the second solder and the conductive contact, wherein the third solder has a different material composition than the second solder.

Example C47 includes the subject matter of Example C46, and further specifies that the second solder has a higher melting point than the third solder.

Example C48 includes the subject matter of any of Examples C31-47, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example C49 includes the subject matter of Example C48, and further specifies that the second conductive contact is a second-level interconnect contact.

Example C50 includes the subject matter of any of Examples C31-49, and further specifies that the cavity is tapered, narrowing towards a bottom of the cavity.

Example C51 includes the subject matter of any of Examples C31-50, and further specifies that a dielectric material of the substrate is at a bottom of the cavity.

Example C52 includes the subject matter of Example C51, and further specifies that the bridge component is coupled to the dielectric material.

Example C53 includes the subject matter of Example C52, and further specifies that the bridge component is coupled to the dielectric material by an adhesive.

Example C54 includes the subject matter of any of Examples C51-53, and further specifies that the bottom of the cavity is coplanar with a bottom of the conductive contact.

Example C55 includes the subject matter of any of Examples C31-54, and further specifies that a bottom of the cavity has an undulating surface.

Example C56 includes the subject matter of Example C55, and further specifies that the undulations have an amplitude between 1 micron and 10 microns.

Example C57 includes the subject matter of Example C55, and further specifies that the undulations have an amplitude that is less than 1 micron.

Example C58 includes the subject matter of any of Examples C31-57, and further specifies that surface insulation material at the face of the substrate has a thickness between 10 microns and 30 microns.

Example C59 includes the subject matter of any of Examples C31-58, and further specifies that the bridge component includes a semiconductor material.

Example C60 includes the subject matter of any of Examples C31-59, and further specifies that the bridge component has a thickness that is less than 100 microns.

Example C61 includes the subject matter of any of Examples C31-60, and further specifies that a pitch of conductive contacts of the substrate is greater than a pitch of conductive contacts of the bridge component.

Example C62 includes the subject matter of any of Examples C31-61, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example C63 includes the subject matter of any of Examples C31-62, and further specifies that the microelectronic component includes a die.

Example C64 includes the subject matter of any of Examples C31-63, and further includes: a fill compound between the microelectronic component and the substrate.

Example C65 includes the subject matter of Example C64, and further specifies that the fill compound extends between the microelectronic component and the bridge component.

Example C66 includes the subject matter of any of Examples C31-65, and further specifies that the microelectronic component includes a transistor.

Example C67 includes the subject matter of any of Examples C31-66, and further specifies that the microelectronic component includes a memory device.

Example C68 includes the subject matter of any of Examples C31-67, and further specifies that the microelectronic assembly has a footprint that is less than 100 square millimeters.

Example C69 includes the subject matter of any of Examples C31-68, and further specifies that conductive contacts of the substrate include a surface finish, and the surface finish includes nickel.

Example C70 includes the subject matter of Example C69, and further specifies that the surface finish further includes palladium and gold.

Example C71 is an electronic device, including: a circuit board; and a microelectronic assembly conductively coupled to the circuit board, wherein the microelectronic assembly includes: a substrate; a cavity at a face of the substrate; a bridge component in the cavity; and a microelectronic component having a first face and an opposing second face, the first face of the microelectronic component is between the second face of the microelectronic component and the substrate, the microelectronic component includes conductive contacts at the first face of the microelectronic component, a conductive contact of the microelectronic component is coupled, by an interconnect, to a conductive contact of the substrate, and a conductive contact of the microelectronic component is coupled to a conductive contact of the bridge component; wherein the conductive contact of the substrate is at a bottom of an opening in a surface insulation material, the interconnect includes solder and a material, and the material fills a majority of a volume of the opening.

Example C72 includes the subject matter of Example C71, and further specifies that the substrate includes an organic dielectric material.

Example C73 includes the subject matter of any of Examples C71-72, and further specifies that the material includes a metal.

Example C74 includes the subject matter of Example C73, and further specifies that the material includes a metal ball.

Example C75 includes the subject matter of Example C74, and further specifies that the metal ball has a diameter that is between 10 microns and 500 microns.

Example C76 includes the subject matter of Example C73, and further specifies that the material includes a metal pillar.

Example C77 includes the subject matter of Example C76, and further specifies that the metal pillar extends past a top surface of the surface insulation material by a distance between 10 microns and 50 microns.

Example C78 includes the subject matter of any of Examples C76-77, and further specifies that the metal pillar includes a surface finish on a bulk metal.

Example C79 includes the subject matter of Example C78, and further specifies that the bulk metal includes copper.

Example C80 includes the subject matter of any of Examples C78-79, and further specifies that the surface finish includes nickel, palladium, or gold.

Example C81 includes the subject matter of any of Examples C78-80, and further specifies that the bulk metal is undercut relative to the surface finish.

Example C82 includes the subject matter of any of Examples C73-81, and further specifies that the metal includes copper.

Example C83 includes the subject matter of any of Examples C73-82, and further specifies that the metal includes nickel, palladium, or gold.

Example C84 includes the subject matter of any of Examples C71-72, and further specifies that the solder is a first solder, the material is a second solder, and the first solder has a different material composition than the second solder.

Example C85 includes the subject matter of Example C84, and further specifies that the second solder has a higher melting point than the first solder.

Example C86 includes the subject matter of any of Examples C84-85, and further includes: a third solder between the second solder and the conductive contact of the substrate, wherein the third solder has a different material composition than the second solder.

Example C87 includes the subject matter of Example C86, and further specifies that the second solder has a higher melting point than the third solder.

Example C88 includes the subject matter of any of Examples C71-87, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example C89 includes the subject matter of any of Examples C88, and further specifies that the second conductive contact is a second-level interconnect contact.

Example C90 includes the subject matter of any of Examples C71-89, and further specifies that the cavity is tapered, narrowing towards a bottom of the cavity.

Example C91 includes the subject matter of any of Examples C71-90, and further specifies that a dielectric material of the substrate is at a bottom of the cavity.

Example C92 includes the subject matter of Example C91, and further specifies that the bridge component is coupled to the dielectric material.

Example C93 includes the subject matter of Example C92, and further specifies that the bridge component is coupled to the dielectric material by an adhesive.

Example C94 includes the subject matter of any of Examples C91-93, and further specifies that the bottom of the cavity is coplanar with a bottom of the conductive contact.

Example C95 includes the subject matter of any of Examples C71-94, and further specifies that a bottom of the cavity has an undulating surface.

Example C96 includes the subject matter of Example C95, and further specifies that the undulations have an amplitude between 1 micron and 10 microns.

Example C97 includes the subject matter of Example C95, and further specifies that the undulations have an amplitude that is less than 1 micron.

Example C98 includes the subject matter of any of Examples C71-97, and further specifies that surface insulation material at the face of the substrate has a thickness between 10 microns and 30 microns.

Example C99 includes the subject matter of any of Examples C71-98, and further specifies that the bridge component includes a semiconductor material.

Example C100 includes the subject matter of any of Examples C71-99, and further specifies that the bridge component has a thickness that is less than 100 microns.

Example C101 includes the subject matter of any of Examples C71-100, and further specifies that a pitch of conductive contacts of the substrate is greater than a pitch of conductive contacts of the bridge component.

Example C102 includes the subject matter of any of Examples C71-101, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example C103 includes the subject matter of any of Examples C71-102, and further specifies that the microelectronic component includes a die.

Example C104 includes the subject matter of any of Examples C71-103, and further includes: a fill compound between the microelectronic component and the substrate.

Example C105 includes the subject matter of Example C104, and further specifies that the fill compound extends between the microelectronic component and the bridge component.

Example C106 includes the subject matter of any of Examples C71-105, and further specifies that the microelectronic component includes a transistor.

Example C107 includes the subject matter of any of Examples C71-106, and further specifies that the microelectronic component includes a memory device.

Example C108 includes the subject matter of any of Examples C71-107, and further specifies that the microelectronic assembly has a footprint that is less than 100 square millimeters.

Example C109 includes the subject matter of any of Examples C71-108, and further specifies that conductive contacts of the substrate include a surface finish, and the surface finish includes nickel.

Example C110 includes the subject matter of Example C109, and further specifies that the surface finish further includes palladium and gold.

Example C111 includes the subject matter of any of Examples C71-110, and further specifies that the electronic device is a handheld computing device, a laptop computing device, a wearable computing device, or a server computing device.

Example C112 includes the subject matter of any of Examples C71-111, and further specifies that the circuit board is a motherboard.

Example C113 includes the subject matter of any of Examples C71-112, and further includes: a display communicatively coupled to the circuit board.

Example C114 includes the subject matter of Example C113, and further specifies that the display includes a touchscreen display.

Example C115 includes the subject matter of any of Examples C71-114, and further includes: a housing around the circuit board and the microelectronic assembly.

Example D1 is a microelectronic structure, including: a substrate; a cavity at a face of the substrate; a first conductive contact of the substrate at a bottom of the cavity; a second conductive contact of the substrate outside the cavity; first solder on the first conductive contact; and second solder on the second conductive contact, wherein the first solder and the second solder have different material compositions.

Example D2 includes the subject matter of Example D1, and further specifies that the first solder and the second solder have different melting temperatures.

Example D3 includes the subject matter of any of Examples D1-2, and further specifies that the first solder has a higher melting point than the second solder.

Example D4 includes the subject matter of any of Examples D1-3, and further includes: a bridge component in the cavity, wherein the bridge component includes a first face and an opposing second face, the second face of the bridge component is between the first face of the bridge component and the substrate, the bridge component includes a first conductive contact at the first face of the bridge component, the bridge component includes a second conductive contact at the second face of the bridge component, and the second conductive contact of the bridge component is coupled to the first conductive contact of the substrate by the first solder.

Example D5 includes the subject matter of any of Examples D1-4, and further specifies that the substrate includes an organic dielectric material.

Example D6 includes the subject matter of any of Examples D1-2, and further specifies that the substrate includes a surface insulation material at the face of the substrate, the surface insulation material includes an opening, and the second conductive contact of the substrate is at a bottom of the opening.

Example D7 includes the subject matter of any of Examples D3-4, and further specifies that the face of the substrate is a first face of the substrate, the substrate further includes a second face of the substrate opposite to the first face of the substrate, and the substrate further includes a third conductive contact at the second face of the substrate.

Example D8 includes the subject matter of Example D7, and further specifies that the third conductive contact is a second-level interconnect contact.

Example D9 includes the subject matter of any of Examples D1-8, and further specifies that the cavity is tapered, narrowing towards a bottom of the cavity.

Example D10 includes the subject matter of any of Examples D1-9, and further specifies that a dielectric material of the substrate is at a bottom of the cavity.

Example D11 includes the subject matter of any of Examples D1-10, and further specifies that the bridge component includes a semiconductor material.

Example D12 includes the subject matter of any of Examples D1-11, and further specifies that the bridge component has a thickness that is less than 100 microns.

Example D13 is a microelectronic assembly, including: a substrate; a cavity at a face of the substrate; a first conductive contact of the substrate outside the cavity; a bridge component in the cavity, wherein the bridge component includes a first face and an opposing second face, the second face of the bridge component is between the first face of the bridge component and the substrate, and the bridge component includes a second conductive contact at the first face of the bridge component; and a microelectronic component having a first face and an opposing second face, the first face of the microelectronic component is between the second face of the microelectronic component and the substrate, the microelectronic component includes conductive contacts at the first face of the microelectronic component, a first conductive contact of the microelectronic component is conductively coupled to the first conductive contact of the substrate, and a second conductive contact of the microelectronic component is conductively coupled, by an interconnect, to the second conductive contact of the bridge component; wherein the interconnect includes a first solder material and a second solder material different from the first solder material.

Example D14 includes the subject matter of Example D13, and further specifies that the first solder material is between the second solder material and the second conductive contact of the microelectronic component.

Example D15 includes the subject matter of any of Examples D13-14, and further specifies that the first solder material has a different melting point than the second solder material.

Example D16 includes the subject matter of any of Examples D13-14, and further specifies that the first solder material has a higher melting point than the second solder material.

Example D17 includes the subject matter of any of Examples D13-16, and further specifies that the interconnect is a first interconnect, the first conductive contact of the microelectronic component is conductively coupled to the first conductive contact of the substrate by a second interconnect, and the second interconnect includes a third solder material and a fourth solder material different from the third solder material.

Example D18 includes the subject matter of Example D17, and further specifies that the third solder material is between the fourth solder material and the first conductive contact of the microelectronic component.

Example D19 includes the subject matter of any of Examples D17-18, and further specifies that the third solder material has a different melting point than the fourth solder material.

Example D20 includes the subject matter of any of Examples D17-19, and further specifies that the third solder material has a higher melting point than the fourth solder material.

Example D21 includes the subject matter of any of Examples D17-20, and further specifies that the second interconnect further includes a fifth solder material different from the fourth solder material.

Example D22 includes the subject matter of Example D21, and further specifies that the fourth solder material is between the fifth solder material and the third solder material.

Example D23 includes the subject matter of any of Examples D21-22, and further specifies that the fourth solder material has a different melting point than the fifth solder material.

Example D24 includes the subject matter of any of Examples D21-23, and further specifies that the fourth solder material has a lower melting point than the fifth solder material.

Example D25 includes the subject matter of any of Examples D21-24, and further specifies that the fifth solder material has a same material composition as the third solder material.

Example D26 includes the subject matter of any of Examples D21-25, and further specifies that the fifth solder material has a same material composition as the first solder material.

Example D27 includes the subject matter of any of Examples D17-26, and further specifies that the fourth solder material has a same material composition as the second solder material.

Example D28 includes the subject matter of any of Examples D17-27, and further specifies that the third solder material has a same material composition as the first solder material.

Example D29 includes the subject matter of any of Examples D13-16, and further specifies that the interconnect is a first interconnect, the first conductive contact of the microelectronic component is conductively coupled to the first conductive contact of the substrate by a second interconnect, and the second interconnect includes a third solder material.

Example D30 includes the subject matter of Example D29, and further specifies that the third solder material has a same material composition as the first solder material.

Example D31 includes the subject matter of any of Examples D13-30, and further specifies that the substrate further includes a second conductive contact in the cavity, the bridge component includes a third conductive contact at the second face of the bridge component, and the second conductive contact of the substrate is coupled to the third conductive contact of the bridge component by solder.

Example D32 includes the subject matter of Example D31, and further specifies that the solder has a same material composition as the first solder.

Example D33 includes the subject matter of any of Examples D13-32, and further specifies that the substrate includes an organic dielectric material.

Example D34 includes the subject matter of any of Examples D13-32, and further specifies that the substrate includes a surface insulation material at the face of the substrate, the surface insulation material includes an opening, and the first conductive contact of the substrate is at a bottom of the opening.

Example D35 includes the subject matter of any of Examples D13-34, and further specifies that the face of the substrate is a first face of the substrate, the substrate further includes a second face of the substrate opposite to the first face of the substrate, and the substrate further includes a third conductive contact at the second face of the substrate.

Example D36 includes the subject matter of Example D35, and further specifies that the third conductive contact is a second-level interconnect contact.

Example D37 includes the subject matter of any of Examples D13-36, and further specifies that the cavity is tapered, narrowing towards a bottom of the cavity.

Example D38 includes the subject matter of any of Examples D13-37, and further specifies that a bottom of the cavity has an undulating surface.

Example D39 includes the subject matter of Example D38, and further specifies that the undulations have an amplitude between 1 micron and 10 microns.

Example D40 includes the subject matter of Example D38, and further specifies that the undulations have an amplitude that is less than 1 micron.

Example D41 includes the subject matter of any of Examples D13-40, and further specifies that surface insulation material at the face of the substrate has a thickness between 10 microns and 30 microns.

Example D42 includes the subject matter of any of Examples D13-41, and further specifies that the bridge component includes a semiconductor material.

Example D43 includes the subject matter of any of Examples D13-42, and further specifies that the bridge component has a thickness that is less than 100 microns.

Example D44 includes the subject matter of any of Examples D13-43, and further specifies that a pitch of conductive contacts of the substrate is greater than a pitch of conductive contacts of the bridge component.

Example D45 includes the subject matter of any of Examples D13-44, and further specifies that the first conductive contact of the microelectronic component has a different area than the second conductive contact of the microelectronic component.

Example D46 includes the subject matter of any of Examples D13-45, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example D47 includes the subject matter of any of Examples D13-46, and further specifies that the microelectronic component includes a die.

Example D48 includes the subject matter of any of Examples D13-47, and further includes: a fill compound between the microelectronic component and the substrate.

Example D49 includes the subject matter of Example D48, and further specifies that the fill compound extends between the microelectronic component and the bridge component.

Example D50 includes the subject matter of any of Examples D13-49, and further specifies that the microelectronic component includes a transistor.

Example D51 includes the subject matter of any of Examples D13-50, and further specifies that the microelectronic component includes a memory device.

Example D52 includes the subject matter of any of Examples D13-51, and further specifies that the microelectronic assembly has a footprint that is less than 100 square millimeters.

Example D53 includes the subject matter of any of Examples D13-52, and further specifies that conductive contacts of the substrate include a surface finish, and the surface finish includes nickel.

Example D54 includes the subject matter of Example D53, and further specifies that the surface finish further includes palladium and gold.

Example D55 is an electronic device, including: a circuit board; and a microelectronic assembly conductively coupled to the circuit board, wherein the microelectronic assembly includes: a substrate; a cavity at a face of the substrate; a bridge component in the cavity; and a microelectronic component having a first face and an opposing second face, the first face of the microelectronic component is between the second face of the microelectronic component and the substrate, the microelectronic component includes conductive contacts at the first face of the microelectronic component, a first conductive contact of the microelectronic component is conductively coupled to the first conductive contact of the substrate, and a second conductive contact of the microelectronic component is conductively coupled, by an interconnect, to the second conductive contact of the bridge component; wherein the interconnect includes a first solder material and a second solder material different from the first solder material.

Example D56 includes the subject matter of Example D55, and further specifies that the first solder material is between the second solder material and the second conductive contact of the microelectronic component.

Example D57 includes the subject matter of any of Examples D55-56, and further specifies that the first solder material has a different melting point than the second solder material.

Example D58 includes the subject matter of any of Examples D55-56, and further specifies that the first solder material has a higher melting point than the second solder material.

Example D59 includes the subject matter of any of Examples D55-58, and further specifies that the interconnect is a first interconnect, the first conductive contact of the microelectronic component is conductively coupled to the first conductive contact of the substrate by a second interconnect, and the second interconnect includes a third solder material and a fourth solder material different from the third solder material.

Example D60 includes the subject matter of Example D59, and further specifies that the third solder material is between the fourth solder material and the first conductive contact of the microelectronic component.

Example D61 includes the subject matter of any of Examples D59-60, and further specifies that the third solder material has a different melting point than the fourth solder material.

Example D62 includes the subject matter of any of Examples D59-61, and further specifies that the third solder material has a higher melting point than the fourth solder material.

Example D63 includes the subject matter of any of Examples D59-62, and further specifies that the second interconnect further includes a fifth solder material different from the fourth solder material.

Example D64 includes the subject matter of Example D63, and further specifies that the fourth solder material is between the fifth solder material and the third solder material.

Example D65 includes the subject matter of any of Examples D63-64, and further specifies that the fourth solder material has a different melting point than the fifth solder material.

Example D66 includes the subject matter of any of Examples D63-65, and further specifies that the fourth solder material has a lower melting point than the fifth solder material.

Example D67 includes the subject matter of any of Examples D63-66, and further specifies that the fifth solder material has a same material composition as the third solder material.

Example D68 includes the subject matter of any of Examples D63-67, and further specifies that the fifth solder material has a same material composition as the first solder material.

Example D69 includes the subject matter of any of Examples D59-68, and further specifies that the fourth solder material has a same material composition as the second solder material.

Example D70 includes the subject matter of any of Examples D59-69, and further specifies that the third solder material has a same material composition as the first solder material.

Example D71 includes the subject matter of any of Examples D55-58, and further specifies that the interconnect is a first interconnect, the first conductive contact of the microelectronic component is conductively coupled to the first conductive contact of the substrate by a second interconnect, and the second interconnect includes a third solder material.

Example D72 includes the subject matter of Example D71, and further specifies that the third solder material has a same material composition as the first solder material.

Example D73 includes the subject matter of any of Examples D55-72, and further specifies that the substrate further includes a second conductive contact in the cavity, the bridge component includes a third conductive contact at the second face of the bridge component, and the second conductive contact of the substrate is coupled to the third conductive contact of the bridge component by solder.

Example D74 includes the subject matter of any of Examples D73, and further specifies that the solder has a same material composition as the first solder.

Example D75 includes the subject matter of any of Examples D55-74, and further specifies that the substrate includes an organic dielectric material.

Example D76 includes the subject matter of any of Examples D55-75, and further specifies that the substrate includes a surface insulation material at the face of the substrate, the surface insulation material includes an opening, and the conductive contact of the substrate is at a bottom of the opening.

Example D77 includes the subject matter of any of Examples D55-76, and further specifies that the face of the substrate is a first face of the substrate, the substrate further includes a second face of the substrate opposite to the first face of the substrate, and the substrate further includes a third conductive contact at the second face of the substrate.

Example D78 includes the subject matter of Example D77, and further specifies that the third conductive contact is a second-level interconnect contact.

Example D79 includes the subject matter of any of Examples D55-78, and further specifies that the first conductive contact of the microelectronic component has a different area than the second conductive contact of the microelectronic component.

Example D80 includes the subject matter of any of Examples D55-79, and further specifies that the first conductive contact of the microelectronic component has a larger area than the second conductive contact of the microelectronic component.

Example D81 includes the subject matter of any of Examples D55-80, and further specifies that the cavity is tapered, narrowing towards a bottom of the cavity.

Example D82 includes the subject matter of any of Examples D55-81, and further specifies that a bottom of the cavity has an undulating surface.

Example D83 includes the subject matter of Example D82, and further specifies that the undulations have an amplitude between 1 micron and 10 microns.

Example D84 includes the subject matter of Example D82, and further specifies that the undulations have an amplitude that is less than 1 micron.

Example D85 includes the subject matter of any of Examples D55-84, and further specifies that surface insulation material at the face of the substrate has a thickness between 10 microns and 30 microns.

Example D86 includes the subject matter of any of Examples D55-85, and further specifies that the bridge component includes a semiconductor material.

Example D87 includes the subject matter of any of Examples D55-86, and further specifies that the bridge component has a thickness that is less than 100 microns.

Example D88 includes the subject matter of any of Examples D55-87, and further specifies that a pitch of conductive contacts of the substrate is greater than a pitch of conductive contacts of the bridge component.

Example D89 includes the subject matter of any of Examples D55-88, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example D90 includes the subject matter of any of Examples D55-89, and further specifies that the microelectronic component includes a die.

Example D91 includes the subject matter of any of Examples D55-90, and further includes: a fill compound between the microelectronic component and the substrate.

Example D92 includes the subject matter of Example D91, and further specifies that the fill compound extends between the microelectronic component and the bridge component.

Example D93 includes the subject matter of any of Examples D55-92, and further specifies that the microelectronic component includes a transistor.

Example D94 includes the subject matter of any of Examples D55-93, and further specifies that the microelectronic component includes a memory device.

Example D95 includes the subject matter of any of Examples D55-94, and further specifies that the microelectronic assembly has a footprint that is less than 100 square millimeters.

Example D96 includes the subject matter of any of Examples D55-95, and further specifies that conductive contacts of the substrate include a surface finish, and the surface finish includes nickel.

Example D97 includes the subject matter of Example D96, and further specifies that the surface finish further includes palladium and gold.

Example D98 includes the subject matter of any of Examples D55-97, and further specifies that the electronic device is a handheld computing device, a laptop computing device, a wearable computing device, or a server computing device.

Example D99 includes the subject matter of any of Examples D55-98, and further specifies that the circuit board is a motherboard.

Example D100 includes the subject matter of any of Examples D55-99, and further includes: a display communicatively coupled to the circuit board.

Example D101 includes the subject matter of Example D100, and further specifies that the display includes a touchscreen display.

Example D102 includes the subject matter of any of Examples D55-101, and further includes: a housing around the circuit board and the microelectronic assembly.

Example E1 is a microelectronic structure, including: a substrate; a cavity at a face of the substrate; a first conductive contact in the cavity; and a bridge component in the cavity, wherein the bridge component includes a first face and an opposing second face, the second face of the bridge component is between the first face of the bridge component and the substrate, and the bridge component includes a second conductive contact at the second face of the bridge component; wherein the first conductive contact is electrically coupled to the second conductive contact, and the first conductive contact in the cavity has a non-planar contact surface.

Example E2 includes the subject matter of Example E1, and further specifies that the substrate includes an organic dielectric material.

Example E3 includes the subject matter of any of Examples E1-2, and further specifies that the substrate includes a third conductive contact outside the cavity at the face of the substrate, the substrate includes surface insulation material at the face of the substrate, the surface insulation material includes an opening, and the third conductive contact of the substrate is at a bottom of the opening.

Example E4 includes the subject matter of Example E3, and further includes: solder on the third conductive contact of the substrate.

Example E5 includes the subject matter of any of Examples E3-4, and further specifies that the face of the substrate is a first face of the substrate, the substrate further includes a second face of the substrate opposite to the first face of the substrate, and the substrate further includes a third conductive contact at the second face of the substrate.

Example E6 includes the subject matter of Example E5, and further specifies that the third conductive contact is a second-level interconnect contact.

Example E7 includes the subject matter of any of Examples E1-6, and further specifies that the cavity is tapered, narrowing towards a bottom of the cavity.

Example E8 includes the subject matter of any of Examples E1-7, and further specifies that the first conductive contact includes a wire.

Example E9 includes the subject matter of Example E8, and further specifies that the wire includes copper, silver, or gold.

Example E10 includes the subject matter of any of Examples E1-9, and further specifies that the contact surface includes a pointed shape.

Example E11 includes the subject matter of any of Examples E1-9, and further specifies that the contact surface has an arc shape.

Example E12 includes the subject matter of any of Examples E11, and further specifies that the first conductive contact includes a dome of multiple wires.

Example E13 includes the subject matter of any of Examples E1-9, and further specifies that the first conductive contact includes a cantilever.

Example E14 includes the subject matter of any of Examples E1-13, and further specifies that the first conductive contact includes a wire that is wirebonded to metal of a metal layer of the substrate.

Example E15 includes the subject matter of any of Examples E1-14, and further specifies that the substrate includes a surface insulation material at the face of the substrate, and the cavity extends at least through the surface insulation material.

Example E16 includes the subject matter of Example E15, and further specifies that the cavity extends past the surface insulation material into a dielectric material of the substrate.

Example E17 includes the subject matter of any of Examples E15-16, and further specifies that the first conductive contact does not extend past a plane of a lower surface of the surface insulation material.

Example E18 includes the subject matter of any of Examples E1-17, and further specifies that the first conductive contact is electrically coupled to the second conductive contact by solder.

Example E19 includes the subject matter of any of Examples E1-18, and further specifies that the first conductive contact is one of a plurality of first conductive contacts in a cavity of the substrate, and the plurality of first conductive contacts have non-planar contact surfaces.

Example E20 includes the subject matter of any of Examples E1-19, and further includes: an underfill material between the second face of the bridge component and the substrate.

Example E21 includes the subject matter of Example E20, and further specifies that the first conductive contact includes a wire, and the underfill material is around the wire.

Example E22 includes the subject matter of any of Examples E1-21, and further specifies that the bridge component includes a conductive pathway between the second conductive contact of the bridge component and a conductive contact on the first face of the bridge component.

Example E23 includes the subject matter of any of Examples E1-22, and further specifies that the bridge component does not contact a dielectric material of the substrate.

Example E24 includes the subject matter of any of Examples E1-23, and further specifies that the bridge component includes a transistor.

Example E25 includes the subject matter of any of Examples E1-24, and further specifies that a bottom of the cavity has an undulating surface.

Example E26 includes the subject matter of Example E25, and further specifies that the undulations have an amplitude between 1 micron and 10 microns.

Example E27 includes the subject matter of Example E25, and further specifies that the undulations have an amplitude that is less than 1 micron.

Example E28 includes the subject matter of any of Examples E1-27, and further specifies that the surface insulation material has a thickness between 10 microns and 30 microns.

Example E29 includes the subject matter of any of Examples E1-28, and further specifies that the bridge component includes a semiconductor material.

Example E30 includes the subject matter of any of Examples E1-29, and further specifies that the bridge component has a thickness that is less than 100 microns.

Example E31 is a microelectronic assembly, including: a substrate; a cavity at a face of the substrate; a first conductive contact in the cavity, wherein the first conductive contact has a non-planar contact surface; a bridge component in the cavity, wherein the bridge component includes a first face and an opposing second face, the second face of the bridge component is between the first face of the bridge component and the substrate, and the bridge component includes a second conductive contact at the first face of the bridge component; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are conductively coupled to conductive contacts of the substrate at the face of the substrate, and some of the conductive contacts of the microelectronic component are conductively coupled to conductive contacts at the first face of the bridge component.

Example E32 includes the subject matter of Example E31, and further specifies that the substrate includes an organic dielectric material.

Example E33 includes the subject matter of any of Examples E31-32, and further specifies that the substrate includes a third conductive contact outside the cavity at the face of the substrate, the substrate includes surface insulation material at the face of the substrate, the surface insulation material includes an opening, and the third conductive contact of the substrate is at a bottom of the opening.

Example E34 includes the subject matter of Example E33, and further includes: solder on the third conductive contact of the substrate.

Example E35 includes the subject matter of any of Examples E33-34, and further specifies that the face of the substrate is a first face of the substrate, the substrate further includes a second face of the substrate opposite to the first face of the substrate, and the substrate further includes a third conductive contact at the second face of the substrate.

Example E36 includes the subject matter of Example E35, and further specifies that the third conductive contact is a second-level interconnect contact.

Example E37 includes the subject matter of any of Examples E31-36, and further specifies that the cavity is tapered, narrowing towards a bottom of the cavity.

Example E38 includes the subject matter of any of Examples E31-37, and further specifies that the first conductive contact includes a wire.

Example E39 includes the subject matter of Example E38, and further specifies that the wire includes copper, silver, or gold.

Example E40 includes the subject matter of any of Examples E31-39, and further specifies that the first conductive contact has a point that extends towards the second conductive contact.

Example E41 includes the subject matter of any of Examples E31-39, and further specifies that the first conductive contact has an arc that extends towards the second conductive contact.

Example E42 includes the subject matter of Example E41, and further specifies that the first conductive contact includes a dome of multiple wires.

Example E43 includes the subject matter of any of Examples E31-39, and further specifies that the first conductive contact includes a cantilever.

Example E44 includes the subject matter of any of Examples E31-43, and further specifies that the first conductive contact includes a wire that is wirebonded to metal of a metal layer of the substrate.

Example E45 includes the subject matter of any of Examples E31-44, and further specifies that the substrate includes a surface insulation material at the face of the substrate, and the cavity extends at least through the surface insulation material.

Example E46 includes the subject matter of Example E45, and further specifies that the cavity extends past the surface insulation material into a dielectric material of the substrate.

Example E47 includes the subject matter of any of Examples E45-46, and further specifies that the first conductive contact does not extend past a plane of a lower surface of the surface insulation material.

Example E48 includes the subject matter of any of Examples E31-47, and further specifies that the first conductive contact is electrically coupled to the second conductive contact by solder.

Example E49 includes the subject matter of any of Examples E31-48, and further specifies that the first conductive contact is one of a plurality of first conductive contacts in a cavity of the substrate, and the plurality of first conductive contacts have non-planar contact surfaces.

Example E50 includes the subject matter of any of Examples E31-49, and further includes: an underfill material between the second face of the bridge component and the substrate.

Example E51 includes the subject matter of Example E50, and further specifies that the first conductive contact includes a wire, and the underfill material is around the wire.

Example E52 includes the subject matter of any of Examples E31-51, and further specifies that the bridge component includes a conductive pathway between the second conductive contact of the bridge component and a conductive contact on the first face of the bridge component.

Example E53 includes the subject matter of any of Examples E31-52, and further specifies that the bridge component does not contact a dielectric material of the substrate.

Example E54 includes the subject matter of any of Examples E31-53, and further specifies that the bridge component includes a transistor.

Example E55 includes the subject matter of any of Examples E31-54, and further specifies that a bottom of the cavity has an undulating surface.

Example E56 includes the subject matter of Example E55, and further specifies that the undulations have an amplitude between 1 micron and 10 microns.

Example E57 includes the subject matter of Example E55, and further specifies that the undulations have an amplitude that is less than 1 micron.

Example E58 includes the subject matter of any of Examples E31-57, and further specifies that surface insulation material at the face of the substrate has a thickness between 10 microns and 30 microns.

Example E59 includes the subject matter of any of Examples E31-58, and further specifies that the bridge component includes a semiconductor material.

Example E60 includes the subject matter of any of Examples E31-59, and further specifies that the bridge component has a thickness that is less than 100 microns.

Example E61 includes the subject matter of any of Examples E31-60, and further specifies that a pitch of conductive contacts of the substrate is greater than a pitch of conductive contacts of the bridge component.

Example E62 includes the subject matter of any of Examples E31-61, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example E63 includes the subject matter of any of Examples E31-62, and further specifies that the microelectronic component includes a die.

Example E64 includes the subject matter of any of Examples E31-63, and further includes: a fill compound between the microelectronic component and the substrate.

Example E65 includes the subject matter of Example E64, and further specifies that the fill compound extends between the microelectronic component and the bridge component.

Example E66 includes the subject matter of any of Examples E31-65, and further specifies that the microelectronic component includes a transistor.

Example E67 includes the subject matter of any of Examples E31-66, and further specifies that the microelectronic component includes a memory device.

Example E68 includes the subject matter of any of Examples E31-67, and further specifies that the microelectronic assembly has a footprint that is less than 100 square millimeters.

Example E69 includes the subject matter of any of Examples E31-68, and further specifies that conductive contacts of the substrate include a surface finish, and the surface finish includes nickel.

Example E70 includes the subject matter of Example E69, and further specifies that the surface finish further includes palladium and gold.

Example E71 is an electronic device, including: a circuit board; and a microelectronic assembly conductively coupled to the circuit board, wherein the microelectronic assembly includes: a substrate; a cavity at a face of the substrate; a first conductive contact in the cavity; a bridge component in the cavity, wherein the bridge component includes a second conductive contact that faces and is coupled to the first conductive contact, the first conductive contact has a surface, the surface faces the bridge component, and the surface is not flat; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are coupled by solder to conductive contacts of the substrate, and some of the conductive contacts of the microelectronic component are coupled by solder to conductive contacts of the bridge component.

Example E72 includes the subject matter of Example E71, and further specifies that the substrate includes an organic dielectric material.

Example E73 includes the subject matter of any of Examples E71-72, and further specifies that the substrate includes a third conductive contact outside the cavity at the face of the substrate, the substrate includes surface insulation material at the face of the substrate, the surface insulation material includes an opening, and the third conductive contact of the substrate is at a bottom of the opening.

Example E74 includes the subject matter of Example E73, and further includes: solder on the third conductive contact of the substrate.

Example E75 includes the subject matter of any of Examples E73-74, and further specifies that the face of the substrate is a first face of the substrate, the substrate further includes a second face of the substrate opposite to the first face of the substrate, and the substrate further includes a third conductive contact at the second face of the substrate.

Example E76 includes the subject matter of Example E75, and further specifies that the third conductive contact is a second-level interconnect contact.

Example E77 includes the subject matter of any of Examples E71-76, and further specifies that the cavity is tapered, narrowing towards a bottom of the cavity.

Example E78 includes the subject matter of any of Examples E71-77, and further specifies that the first conductive contact includes a wire.

Example E79 includes the subject matter of Example E78, and further specifies that the wire includes copper, silver, or gold.

Example E80 includes the subject matter of any of Examples E71-79, and further specifies that the surface includes a pointed shape.

Example E81 includes the subject matter of any of Examples E71-79, and further specifies that the surface includes an arc shape.

Example E82 includes the subject matter of Example E81, and further specifies that the first conductive contact includes a dome of multiple wires.

Example E83 includes the subject matter of any of Examples E71-79, and further specifies that the first conductive contact includes a cantilever.

Example E84 includes the subject matter of any of Examples E71-83, and further specifies that the first conductive contact includes a wire that is wirebonded to metal of a metal layer of the substrate.

Example E85 includes the subject matter of any of Examples E71-84, and further specifies that the substrate includes a surface insulation material at the face of the substrate, and the cavity extends at least through the surface insulation material.

Example E86 includes the subject matter of Example E85, and further specifies that the cavity extends past the surface insulation material into a dielectric material of the substrate.

Example E87 includes the subject matter of any of Examples E85-86, and further specifies that the first conductive contact does not extend past a plane of a lower surface of the surface insulation material.

Example E88 includes the subject matter of any of Examples E71-87, and further specifies that the first conductive contact is electrically coupled to the second conductive contact by solder.

Example E89 includes the subject matter of any of Examples E71-88, and further specifies that the first conductive contact is one of a plurality of first conductive contacts in a cavity of the substrate, and the plurality of first conductive contacts have non-planar contact surfaces.

Example E90 includes the subject matter of any of Examples E71-89, and further includes: an underfill material between the second face of the bridge component and the substrate.

Example E91 includes the subject matter of Example E90, and further specifies that the first conductive contact includes a wire, and the underfill material is around the wire.

Example E92 includes the subject matter of any of Examples E71-91, and further specifies that the bridge component includes a conductive pathway between the second conductive contact of the bridge component and a conductive contact on the first face of the bridge component.

Example E93 includes the subject matter of any of Examples E71-92, and further specifies that the bridge component does not contact a dielectric material of the substrate.

Example E94 includes the subject matter of any of Examples E71-93, and further specifies that the bridge component includes a transistor.

Example E95 includes the subject matter of any of Examples E71-94, and further specifies that a bottom of the cavity has an undulating surface.

Example E96 includes the subject matter of Example E95, and further specifies that the undulations have an amplitude between 1 micron and 10 microns.

Example E97 includes the subject matter of Example E95, and further specifies that the undulations have an amplitude that is less than 1 micron.

Example E98 includes the subject matter of any of Examples E71-97, and further specifies that surface insulation material at the face of the substrate has a thickness between 10 microns and 30 microns.

Example E99 includes the subject matter of any of Examples E71-98, and further specifies that the bridge component includes a semiconductor material.

Example E100 includes the subject matter of any of Examples E71-99, and further specifies that the bridge component has a thickness that is less than 100 microns.

Example E101 includes the subject matter of any of Examples E71-100, and further specifies that a pitch of conductive contacts of the substrate is greater than a pitch of conductive contacts of the bridge component.

Example E102 includes the subject matter of any of Examples E71-101, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example E103 includes the subject matter of any of Examples E71-102, and further specifies that the microelectronic component includes a die.

Example E104 includes the subject matter of any of Examples E71-103, and further includes: a fill compound between the microelectronic component and the substrate.

Example E105 includes the subject matter of Example E104, and further specifies that the fill compound extends between the microelectronic component and the bridge component.

Example E106 includes the subject matter of any of Examples E71-105, and further specifies that the microelectronic component includes a transistor.

Example E107 includes the subject matter of any of Examples E71-106, and further specifies that the microelectronic component includes a memory device.

Example E108 includes the subject matter of any of Examples E71-107, and further specifies that the microelectronic assembly has a footprint that is less than 100 square millimeters.

Example E109 includes the subject matter of any of Examples E71-108, and further specifies that conductive contacts of the substrate include a surface finish, and the surface finish includes nickel.

Example E110 includes the subject matter of Example E109, and further specifies that the surface finish further includes palladium and gold.

Example E111 includes the subject matter of any of Examples E71-110, and further specifies that the electronic device is a handheld computing device, a laptop computing device, a wearable computing device, or a server computing device.

Example E112 includes the subject matter of any of Examples E71-111, and further specifies that the circuit board is a motherboard.

Example E113 includes the subject matter of any of Examples E71-112, and further includes: a display communicatively coupled to the circuit board.

Example E114 includes the subject matter of Example E113, and further specifies that the display includes a touchscreen display.

Example E115 includes the subject matter of any of Examples E71-114, and further includes: a housing around the circuit board and the microelectronic assembly.

Example F1 is a microelectronic structure, including: a substrate; a cavity at a face of the substrate; and a bridge component in the cavity, wherein the bridge component includes a first face and an opposing second face, the second face of the bridge component is between the first face of the bridge component and the substrate, the bridge component includes a first interconnect material at the first face of the bridge component, the bridge component includes a second interconnect material at the second face of the bridge component, and the first interconnect material has a different material composition than the second interconnect material.

Example F2 includes the subject matter of Example F1, and further specifies that the first interconnect material includes solder.

Example F3 includes the subject matter of Example F2, and further specifies that the solder of the first interconnect material is a first solder, the second interconnect material includes a second solder, and the second solder has a different material composition than the first solder.

Example F4 includes the subject matter of Example F3, and further specifies that the first solder has a different melting point than the second solder.

Example F5 includes the subject matter of any of Examples F3-4, and further specifies that the first solder has a higher melting point than the second solder.

Example F6 includes the subject matter of any of Examples F3-5, and further specifies that the first solder has a melting point above 200 degrees Celsius, and the second solder has a melting point below 200 degrees Celsius.

Example F7 includes the subject matter of any of Examples F1-6, and further includes: a polymer material around the second interconnect material.

Example F8 includes the subject matter of any of Examples F1-7, and further includes: an epoxy material between the second face of the bridge component and the cavity.

Example F9 includes the subject matter of Example F8, and further specifies that the epoxy material includes an epoxy flux dot.

Example F10 includes the subject matter of Example F8, and further specifies that the epoxy material includes an epoxy flux film.

Example F11 includes the subject matter of any of Examples F1-2, and further specifies that the second interconnect material includes a conductive adhesive, and the conductive adhesive includes a polymer.

Example F12 includes the subject matter of any of Examples F1-2, and further specifies that the second interconnect material includes an intermetallic compound (IMC).

Example F13 includes the subject matter of Example F12, and further specifies that the IMC includes high-temperature solder particles and low-temperature solder particles.

Example F14 includes the subject matter of any of Examples F1-2, and further specifies that the second interconnect material includes a transient liquid phase sintering (TLPS) material.

Example F15 includes the subject matter of any of Examples F1-2 and 14, and further specifies that the second interconnect material includes a polymer, copper, and tin.

Example F16 includes the subject matter of any of Examples F1-15, and further specifies that the substrate includes an organic dielectric material.

Example F17 includes the subject matter of any of Examples F1-16, and further specifies that the substrate includes a conductive contact at the face of the substrate, the surface insulation material includes an opening, and the conductive contact of the substrate is at a bottom of the opening.

Example F18 includes the subject matter of Example F17, and further includes: solder on the conductive contact of the substrate.

Example F19 includes the subject matter of any of Examples F17-18, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example F20 includes the subject matter of Example F19, and further specifies that the second conductive contact is a second-level interconnect contact.

Example F21 includes the subject matter of any of Examples F1-20, and further specifies that the cavity is tapered, narrowing towards a bottom of the cavity.

Example F22 includes the subject matter of any of Examples F1-21, and further includes: a conductive contact at a bottom of the cavity, wherein the second conductive contact of the bridge component is coupled to the conductive contact by the second interconnect material.

Example F23 includes the subject matter of Example F22, and further specifies that the conductive contact is part of an N−1 metal layer of the substrate.

Example F24 includes the subject matter of any of Examples F1-23, and further specifies that the cavity extends past surface insulation material at the face of the substrate.

Example F25 includes the subject matter of any of Examples F1-24, and further specifies that a bottom of the cavity has an undulating surface.

Example F26 includes the subject matter of Example F25, and further specifies that the undulations have an amplitude between 1 micron and 10 microns.

Example F27 includes the subject matter of Example F25, and further specifies that the undulations have an amplitude that is less than 1 micron.

Example F28 includes the subject matter of any of Examples F1-27, and further specifies that the surface insulation material has a thickness between 10 microns and 30 microns.

Example F29 includes the subject matter of any of Examples F1-28, and further specifies that the bridge component includes a semiconductor material.

Example F30 includes the subject matter of any of Examples F1-29, and further specifies that the bridge component has a thickness that is less than 100 microns.

Example F31 is a microelectronic assembly, including: a substrate; a cavity at a face of the substrate; a bridge component in the cavity, wherein the bridge component includes a first face and an opposing second face, the second face of the bridge component is between the first face of the bridge component and the substrate, the bridge component includes a first conductive contact at the first face of the bridge component, the bridge component includes a second conductive contact at the second face of the bridge component, and the substrate includes a third conductive contact at a bottom of the cavity; and a microelectronic component having a first face and an opposing second face, the first face of the microelectronic component is between the second face of the microelectronic component and the substrate, the microelectronic component includes conductive contacts at the first face of the microelectronic component, a fourth conductive contact of the microelectronic component is conductively coupled to a fifth conductive contact of the substrate at the face of the substrate, and a sixth conductive contact of the microelectronic component is conductively coupled to the first conductive contact at the first face of the bridge component; a first interconnect material between the first conductive contact and the sixth conductive contact; and a second interconnect material between the second conductive contact and the third conductive contact, wherein the second interconnect material has a different melting point than the first interconnect material.

Example F32 includes the subject matter of Example F31, and further specifies that the first interconnect material includes solder.

Example F33 includes the subject matter of Example F32, and further specifies that the solder of the first interconnect material is a first solder, the second interconnect material includes a second solder, and the second solder has a different material composition than the first solder.

Example F34 includes the subject matter of Example F33, and further specifies that the first solder has a lower indium content than the second solder.

Example F35 includes the subject matter of any of Examples F33-34, and further specifies that the first solder has a higher melting point than the second solder.

Example F36 includes the subject matter of any of Examples F33-35, and further specifies that the first solder has a melting point above 200 degrees Celsius, and the second solder has a melting point below 200 degrees Celsius.

Example F37 includes the subject matter of any of Examples F31-36, and further includes: a polymer material around the second interconnect material.

Example F38 includes the subject matter of any of Examples F31-37, and further includes: an epoxy material between the second face of the bridge component and the cavity.

Example F39 includes the subject matter of Example F38, and further specifies that the epoxy material includes an epoxy flux dot.

Example F40 includes the subject matter of Example F38, and further specifies that the epoxy material includes an epoxy flux film.

Example F41 includes the subject matter of any of Examples F31-32, and further specifies that the second interconnect material includes a conductive adhesive, and the conductive adhesive includes a polymer.

Example F42 includes the subject matter of any of Examples F31-32, and further specifies that the second interconnect material includes an intermetallic compound (IMC).

Example F43 includes the subject matter of Example F42, and further specifies that the IMC includes high-temperature solder particles and low-temperature solder particles.

Example F44 includes the subject matter of any of Examples F31-32, and further specifies that the second interconnect material includes a transient liquid phase sintering (TLPS) material.

Example F45 includes the subject matter of any of Examples F31-32 and 44, and further specifies that the second interconnect material includes a polymer, copper, and tin.

Example F46 includes the subject matter of any of Examples F31-45, and further specifies that the substrate includes an organic dielectric material.

Example F47 includes the subject matter of any of Examples F31-46, and further specifies that the substrate includes a conductive contact at the face of the substrate, the surface insulation material includes an opening, and the conductive contact of the substrate is at a bottom of the opening.

Example F48 includes the subject matter of Example F47, and further includes: solder on the conductive contact of the substrate.

Example F49 includes the subject matter of any of Examples F47-48, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example F50 includes the subject matter of Example F49, and further specifies that the second conductive contact is a second-level interconnect contact.

Example F51 includes the subject matter of any of Examples F31-50, and further specifies that the cavity is tapered, narrowing towards a bottom of the cavity.

Example F52 includes the subject matter of any of Examples F31-51, and further includes: a conductive contact at a bottom of the cavity, wherein the second conductive contact of the bridge component is coupled to the conductive contact by the second interconnect material.

Example F53 includes the subject matter of Example F52, and further specifies that the conductive contact is part of an N−1 metal layer of the substrate.

Example F54 includes the subject matter of any of Examples F31-53, and further specifies that the cavity extends past surface insulation material at the face of the substrate.

Example F55 includes the subject matter of any of Examples F31-54, and further specifies that a bottom of the cavity has an undulating surface.

Example F56 includes the subject matter of Example F55, and further specifies that the undulations have an amplitude between 1 micron and 10 microns.

Example F57 includes the subject matter of Example F55, and further specifies that the undulations have an amplitude that is less than 1 micron.

Example F58 includes the subject matter of any of Examples F31-57, and further specifies that surface insulation material at the face of the substrate has a thickness between 10 microns and 30 microns.

Example F59 includes the subject matter of any of Examples F31-58, and further specifies that the bridge component includes a semiconductor material.

Example F60 includes the subject matter of any of Examples F31-59, and further specifies that the bridge component has a thickness that is less than 100 microns.

Example F61 includes the subject matter of any of Examples F31-60, and further specifies that a pitch of conductive contacts of the substrate is greater than a pitch of conductive contacts of the bridge component.

Example F62 includes the subject matter of any of Examples F31-61, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example F63 includes the subject matter of any of Examples F31-62, and further specifies that the microelectronic component includes a die.

Example F64 includes the subject matter of any of Examples F31-63, and further includes: a fill compound between the microelectronic component and the substrate.

Example F65 includes the subject matter of Example F64, and further specifies that the fill compound extends between the microelectronic component and the bridge component.

Example F66 includes the subject matter of any of Examples F31-65, and further specifies that the microelectronic component includes a transistor.

Example F67 includes the subject matter of any of Examples F31-66, and further specifies that the microelectronic component includes a memory device.

Example F68 includes the subject matter of any of Examples F31-67, and further specifies that the microelectronic assembly has a footprint that is less than 100 square millimeters.

Example F69 includes the subject matter of any of Examples F31-68, and further specifies that conductive contacts of the substrate include a surface finish, and the surface finish includes nickel.

Example F70 includes the subject matter of Example F69, and further specifies that the surface finish further includes palladium and gold.

Example F71 is an electronic device, including: a circuit board; and a microelectronic assembly conductively coupled to the circuit board, wherein the microelectronic assembly includes: a substrate; a cavity at a face of the substrate; a bridge component in the cavity, wherein some of the conductive contacts of the bridge component are coupled to conductive contacts of the substrate; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are coupled to conductive contacts of the substrate, and some of the conductive contacts of the microelectronic component are coupled to conductive contacts of the bridge component; wherein some of the conductive contacts of the bridge component are coupled to conductive contacts of the substrate by second interconnect material, and some of the conductive contacts of the microelectronic component are coupled to conductive contacts of the bridge component by first interconnect material.

Example F72 includes the subject matter of Example F71, and further specifies that the first interconnect material includes solder.

Example F73 includes the subject matter of Example F72, and further specifies that the solder of the first interconnect material is a first solder, the second interconnect material includes a second solder, and the second solder has a different material composition than the first solder.

Example F74 includes the subject matter of Example F73, and further specifies that the first solder has a different melting point than the second solder.

Example F75 includes the subject matter of any of Examples F73-74, and further specifies that the first solder has a higher melting point than the second solder.

Example F76 includes the subject matter of any of Examples F73-75, and further specifies that the first solder has a melting point above 200 degrees Celsius, and the second solder has a melting point below 200 degrees Celsius.

Example F77 includes the subject matter of any of Examples F71-76, and further includes: a polymer material around the second interconnect material.

Example F78 includes the subject matter of any of Examples F71-77, and further includes: an epoxy material between the second face of the bridge component and the cavity.

Example F79 includes the subject matter of Example F78, and further specifies that the epoxy material includes an epoxy flux dot.

Example F80 includes the subject matter of Example F78, and further specifies that the epoxy material includes an epoxy flux film.

Example F81 includes the subject matter of any of Examples F71-72, and further specifies that the second interconnect material includes a conductive adhesive, and the conductive adhesive includes a polymer.

Example F82 includes the subject matter of any of Examples F71-72, and further specifies that the second interconnect material includes an intermetallic compound (IMC).

Example F83 includes the subject matter of Example F82, and further specifies that the IMC includes high-temperature solder particles and low-temperature solder particles.

Example F84 includes the subject matter of any of Examples F71-72, and further specifies that the second interconnect material includes a transient liquid phase sintering (TLPS) material.

Example F85 includes the subject matter of any of Examples F71-72 and 84, and further specifies that the second interconnect material includes a polymer, copper, and tin.

Example F86 includes the subject matter of any of Examples F71-85, and further specifies that the substrate includes an organic dielectric material.

Example F87 includes the subject matter of any of Examples F71-86, and further specifies that the substrate includes a conductive contact at the face of the substrate, the surface insulation material includes an opening, and the conductive contact of the substrate is at a bottom of the opening.

Example F88 includes the subject matter of Example F87, and further includes: solder on the conductive contact of the substrate.

Example F89 includes the subject matter of any of Examples F87-88, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example F90 includes the subject matter of Example F89, and further specifies that the second conductive contact is a second-level interconnect contact.

Example F91 includes the subject matter of any of Examples F71-90, and further specifies that the cavity is tapered, narrowing towards a bottom of the cavity.

Example F92 includes the subject matter of any of Examples F71-91, and further includes: a conductive contact at a bottom of the cavity, wherein the second conductive contact of the bridge component is coupled to the conductive contact by the second interconnect material.

Example F93 includes the subject matter of Example F92, and further specifies that the conductive contact is part of an N−1 metal layer of the substrate.

Example F94 includes the subject matter of any of Examples F71-93, and further specifies that the cavity extends past surface insulation material at the face of the substrate.

Example F95 includes the subject matter of any of Examples F71-94, and further specifies that a bottom of the cavity has an undulating surface.

Example F96 includes the subject matter of Example F95, and further specifies that the undulations have an amplitude between 1 micron and 10 microns.

Example F97 includes the subject matter of Example F95, and further specifies that the undulations have an amplitude that is less than 1 micron.

Example F98 includes the subject matter of any of Examples F71-97, and further specifies that surface insulation material at the face of the substrate has a thickness between 10 microns and 30 microns.

Example F99 includes the subject matter of any of Examples F71-98, and further specifies that the bridge component includes a semiconductor material.

Example F100 includes the subject matter of any of Examples F71-99, and further specifies that the bridge component has a thickness that is less than 100 microns.

Example F101 includes the subject matter of any of Examples F71-100, and further specifies that a pitch of conductive contacts of the substrate is greater than a pitch of conductive contacts of the bridge component.

Example F102 includes the subject matter of any of Examples F71-101, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example F103 includes the subject matter of any of Examples F71-102, and further specifies that the microelectronic component includes a die.

Example F104 includes the subject matter of any of Examples F71-103, and further includes: a fill compound between the microelectronic component and the substrate.

Example F105 includes the subject matter of Example F104, and further specifies that the fill compound extends between the microelectronic component and the bridge component.

Example F106 includes the subject matter of any of Examples F71-105, and further specifies that the microelectronic component includes a transistor.

Example F107 includes the subject matter of any of Examples F71-106, and further specifies that the microelectronic component includes a memory device.

Example F108 includes the subject matter of any of Examples F71-107, and further specifies that the microelectronic assembly has a footprint that is less than 100 square millimeters.

Example F109 includes the subject matter of any of Examples F71-108, and further specifies that conductive contacts of the substrate include a surface finish, and the surface finish includes nickel.

Example F110 includes the subject matter of Example F109, and further specifies that the surface finish further includes palladium and gold.

Example F111 includes the subject matter of any of Examples F71-110, and further specifies that the electronic device is a handheld computing device, a laptop computing device, a wearable computing device, or a server computing device.

Example F112 includes the subject matter of any of Examples F71-111, and further specifies that the circuit board is a motherboard.

Example F113 includes the subject matter of any of Examples F71-112, and further includes: a display communicatively coupled to the circuit board.

Example F114 includes the subject matter of Example F113, and further specifies that the display includes a touchscreen display.

Example F115 includes the subject matter of any of Examples F71-114, and further includes: a housing around the circuit board and the microelectronic assembly.

Example G1 is a microelectronic structure, including: a substrate; a cavity in the substrate, wherein metal of a first metal layer in the substrate, and metal of a second metal layer in the substrate, are exposed in the cavity; and a bridge component in the cavity, wherein the bridge component includes a first face and an opposing second face, the second face of the bridge component is between the first face of the bridge component and the substrate, the bridge component includes a conductive contact at the first face of the bridge component, the bridge component includes a second conductive contact at the second face of the bridge component, the second conductive contact is electrically coupled to metal of the first metal layer or the first metal layer, and a portion of the first metal layer is between the bridge component and the second metal layer.

Example G2 includes the subject matter of Example G1, and further specifies that the second conductive contact is electrically coupled to metal of the first metal layer.

Example G3 includes the subject matter of Example G2, and further specifies that metal of the first metal layer and the second metal layer together provide a bottom of the cavity.

Example G4 includes the subject matter of Example G2, and further specifies that the substrate further includes a third metal layer, a portion of the second metal layer is between the bridge component and the third metal layer, and metal of the first metal layer, the second metal layer, and the third metal layer together provide a bottom of the cavity.

Example G5 includes the subject matter of Example G1, and further specifies that the second conductive contact is electrically coupled to metal of the second metal layer.

Example G6 includes the subject matter of Example G5, and further specifies that metal of the first metal layer and the second metal layer together provide a bottom of the cavity.

Example G7 includes the subject matter of any of Examples G1-6, and further specifies that the substrate includes an organic dielectric material.

Example G8 includes the subject matter of any of Examples G1-7, and further specifies that the substrate includes a conductive contact at the face of the substrate, a surface insulation material is at the face of the substrate, the surface insulation material includes an opening, and the conductive contact of the substrate is at a bottom of the opening.

Example G9 includes the subject matter of Example G8, and further includes: solder on the conductive contact of the substrate.

Example G10 includes the subject matter of any of Examples G8-9, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example G11 includes the subject matter of Example G10, and further specifies that the second conductive contact is a second-level interconnect contact.

Example G12 includes the subject matter of any of Examples G1-11, and further specifies that the cavity is tapered, narrowing towards a bottom of the cavity.

Example G13 includes the subject matter of any of Examples G1-12, and further specifies that a bottom of the cavity has an undulating surface.

Example G14 includes the subject matter of Example G13, and further specifies that the undulations have an amplitude between 1 micron and 10 microns.

Example G15 includes the subject matter of Example G13, and further specifies that the undulations have an amplitude that is less than 1 micron.

Example G16 includes the subject matter of any of Examples G1-15, and further specifies that a surface insulation material is at the face of the substrate, and the surface insulation material has a thickness between 10 microns and 30 microns.

Example G17 includes the subject matter of any of Examples G1-16, and further specifies that the bridge component includes a semiconductor material.

Example G18 includes the subject matter of any of Examples G1-17, and further specifies that the bridge component has a thickness that is less than 100 microns.

Example G19 is a microelectronic structure, including: a substrate; a cavity in the substrate, a bottom of the cavity includes dielectric material and metal; and a bridge component in the cavity, wherein the bridge component includes a first face and an opposing second face, the second face of the bridge component is between the first face of the bridge component and the substrate, the bridge component includes a conductive contact at the first face of the bridge component, the bridge component includes a second conductive contact at the second face of the bridge component, the second conductive contact is electrically coupled to metal at a bottom of the cavity.

Example G20 includes the subject matter of Example G19, and further specifies that a top surface of the metal at the bottom of the cavity is coplanar with a top surface of the dielectric material at the bottom of the cavity.

Example G21 includes the subject matter of Example G20, and further specifies that the substrate includes a metal ring at a perimeter of a bottom of the cavity.

Example G22 includes the subject matter of Example G21, and further specifies that the metal ring is coplanar with the metal at the bottom of the cavity.

Example G23 includes the subject matter of Example G19, and further specifies that a top surface of the metal at the bottom of the cavity is non-coplanar with a top surface of the dielectric material at the bottom of the cavity.

Example G24 includes the subject matter of Example G23, and further specifies that a bottom surface of the metal at the bottom of the cavity is coplanar with a top surface of the dielectric material at the bottom of the cavity.

Example G25 includes the subject matter of any of Examples G19-24, and further specifies that the second conductive contact is electrically coupled to metal at the bottom of the cavity by solder.

Example G26 includes the subject matter of any of Examples G19-25, and further specifies that the substrate includes an organic dielectric material.

Example G27 includes the subject matter of any of Examples G19-26, and further specifies that the substrate includes a conductive contact at the face of the substrate, the surface insulation material includes an opening, and the conductive contact of the substrate is at a bottom of the opening.

Example G28 includes the subject matter of Example G27, and further includes: solder on the conductive contact of the substrate.

Example G29 includes the subject matter of any of Examples G27-28, and further specifies that the conductive contact of the substrate is a first conductive contact of the substrate, the face of the substrate is a first face of the substrate, the substrate further includes a second face of the substrate opposite to the first face of the substrate, and the substrate further includes a second conductive contact at the second face of the substrate.

Example G30 includes the subject matter of Example G29, and further specifies that the second conductive contact is a second-level interconnect contact.

Example G31 includes the subject matter of any of Examples G19-30, and further specifies that the cavity is tapered, narrowing towards a bottom of the cavity.

Example G32 includes the subject matter of any of Examples G19-31, and further specifies that a bottom of the cavity has an undulating surface.

Example G33 includes the subject matter of Example G32, and further specifies that the undulations have an amplitude between 1 micron and 10 microns.

Example G34 includes the subject matter of Example G32, and further specifies that the undulations have an amplitude that is less than 1 micron.

Example G35 includes the subject matter of any of Examples G19-34, and further specifies that the surface insulation material has a thickness between 10 microns and 30 microns.

Example G36 includes the subject matter of any of Examples G19-35, and further specifies that the bridge component includes a semiconductor material.

Example G37 includes the subject matter of any of Examples G19-36, and further specifies that the bridge component has a thickness that is less than 100 microns.

Example G38 is a microelectronic assembly, including: a substrate; a microelectronic structure, including a bridge component in a cavity of a substrate, in accordance with any of Examples G1-37; and a microelectronic component having a first face and an opposing second face, the first face of the microelectronic component is between the second face of the microelectronic component and the substrate, the microelectronic component includes conductive contacts at the first face of the microelectronic component, some of the conductive contacts of the microelectronic component are conductively coupled to conductive contacts of the substrate at the face of the substrate, and some of the conductive contacts of the microelectronic component are conductively coupled to conductive contacts at the first face of the bridge component.

Example G39 includes the subject matter of Example G38, and further specifies that a pitch of conductive contacts of the substrate is greater than a pitch of conductive contacts of the bridge component.

Example G40 includes the subject matter of any of Examples G38-39, and further specifies that the microelectronic component is a first electronic component, and the microelectronic assembly further includes: a second electronic component having a first face and an opposing second face, the first face of the second electronic component is between the second face of the second electronic component and the substrate, the second electronic component includes conductive contacts at the first face of the second electronic component, some of the conductive contacts of the second electronic component are conductively coupled to conductive contacts of the substrate at the face of the substrate, and some of the conductive contacts of the second electronic component are conductively coupled to conductive contacts at the first face of the bridge component.

Example G41 includes the subject matter of any of Examples G38-40, and further specifies that the microelectronic component includes a die.

Example G42 includes the subject matter of any of Examples G38-41, and further includes: a fill compound between the microelectronic component and the substrate.

Example G43 includes the subject matter of Example G42, and further specifies that the fill compound extends between the microelectronic component and the bridge component.

Example G44 includes the subject matter of any of Examples G38-43, and further specifies that the microelectronic component includes a transistor.

Example G45 includes the subject matter of any of Examples G38-44, and further specifies that the microelectronic component includes a memory device.

Example G46 includes the subject matter of any of Examples G38-45, and further specifies that the microelectronic assembly has a footprint that is less than 100 square millimeters.

Example G47 includes the subject matter of any of Examples G38-46, and further specifies that conductive contacts of the substrate include a surface finish, and the surface finish includes nickel.

Example G48 includes the subject matter of Example G47, and further specifies that the surface finish further includes palladium and gold.

Example G49 includes the subject matter of any of Examples G38-48, and further specifies that the substrate includes one or more metal layers above the cavity.

Example G50 includes the subject matter of any of Examples G38-49, and further specifies that the bridge component is embedded in the substrate.

Example G51 is an electronic device, including: a circuit board; and a microelectronic assembly, in accordance with any of the microelectronic assemblies of any of Examples G38-48, conductively coupled to the circuit board.

Example G52 includes the subject matter of Example G51, and further specifies that the electronic device is a handheld computing device, a laptop computing device, a wearable computing device, or a server computing device.

Example G53 includes the subject matter of any of Examples G51-52, and further specifies that the circuit board is a motherboard.

Example G54 includes the subject matter of any of Examples G51-53, and further includes: a display communicatively coupled to the circuit board.

Example G55 includes the subject matter of Example G54, and further specifies that the display includes a touchscreen display.

Example G56 includes the subject matter of any of Examples G51-55, and further includes: a housing around the circuit board and the microelectronic assembly.

The invention claimed is:

1. A microelectronic structure, comprising:
a substrate;
a cavity at a face of the substrate;
a first conductive contact of the substrate at a bottom of the cavity;
a second conductive contact of the substrate outside the cavity;
first solder on the first conductive contact;
second solder on the second conductive contact, wherein the first solder and the second solder have different material compositions;
a bridge component in the cavity, wherein the bridge component includes a first face and an opposing second face, the second face of the bridge component is between the first face of the bridge component and the substrate, the bridge component includes a first conductive contact at the first face of the bridge component, the bridge component includes a second conductive contact at the second face of the bridge component, and the second conductive contact of the bridge component is coupled to the first conductive contact of the substrate by the first solder; and
a microelectronic component having a first face and an opposing second face, the first face of the microelectronic component is between the second face of the microelectronic component and the substrate, the microelectronic component includes conductive contacts at the first face of the microelectronic component, a first conductive contact of the conductive contacts of the microelectronic component is conductively coupled, by an interconnect, to the second conductive contact of the substrate, and a second conductive contact of the conductive contacts of the microelectronic component is conductively coupled to the first conductive contact of the bridge component;
wherein the interconnect includes a first layer having the first solder and a second layer having the second solder, and wherein the first layer is in contact with and in between the first conductive contact of the microelectronic component and the second layer.

2. The microelectronic structure of claim 1, wherein the first solder and the second solder have different melting temperatures.

3. The microelectronic structure of claim 1, wherein the first solder has a higher melting point than the second solder.

4. The microelectronic structure of claim 1, wherein the interconnect further includes a third layer having the first solder, wherein the second layer is in contact with and in between the first layer and the third layer.

5. A microelectronic assembly, comprising:
a substrate;
a cavity at a face of the substrate;
a first conductive contact of the substrate outside the cavity;
a bridge component in the cavity, wherein the bridge component includes a first face and an opposing second face, the second face of the bridge component is between the first face of the bridge component and the substrate, and the bridge component includes a second conductive contact at the first face of the bridge component; and
a microelectronic component having a first face and an opposing second face, the first face of the microelectronic component is between the second face of the microelectronic component and the substrate, the microelectronic component includes conductive contacts at the first face of the microelectronic component, a first conductive contact of the conductive contacts of the microelectronic component is conductively coupled to the first conductive contact of the substrate, and a second conductive contact of the conductive contacts of the microelectronic component is conductively coupled, by an interconnect, to the second conductive contact of the bridge component;
wherein the interconnect includes a first layer having a first solder material and a second layer having a second solder material different from the first solder material, and wherein the first layer is in direct contact with and in between the second conductive contact of the microelectronic component and the second layer.

6. The microelectronic assembly of claim 5, wherein the interconnect is a first interconnect, the first conductive contact of the microelectronic component is conductively coupled to the first conductive contact of the substrate by a second interconnect, and the second interconnect includes a third layer having a third solder material and a fourth layer having a fourth solder material different from the third solder material, and wherein the third layer is in contact with and in between the first conductive contact of the microelectronic component and the fourth layer.

7. The microelectronic assembly of claim 6, wherein the third solder material has a different melting point than the fourth solder material.

8. The microelectronic assembly of claim 6, wherein the third solder material has a higher melting point than the fourth solder material.

9. The microelectronic assembly of claim 6, wherein the second interconnect further includes a fifth layer having a fifth solder material different from the fourth solder material, wherein the fourth layer is in contact with and in between the third layer and the fifth layer.

10. The microelectronic assembly of claim 9, wherein the fourth solder material has a different melting point than the fifth solder material.

11. The microelectronic assembly of claim 9, wherein the fourth solder material has a lower melting point than the fifth solder material.

12. The microelectronic assembly of claim 9, wherein the fifth solder material has a same material composition as the third solder material.

13. The microelectronic assembly of claim 9, wherein the fifth solder material has a same material composition as the first solder material.

14. The microelectronic assembly of claim 6, wherein the fourth solder material has a same material composition as the second solder material.

15. The microelectronic assembly of claim 6, wherein the third solder material has a same material composition as the first solder material.

16. An electronic device, comprising:
a circuit board; and
a microelectronic assembly conductively coupled to the circuit board, wherein the microelectronic assembly includes:
a substrate including a first conductive contact on a face of the substrate;
a cavity at the face of the substrate;
a bridge component in the cavity, the bridge component including a second conductive contact at a first face; and
a microelectronic component having a first face and an opposing second face, the first face of the microelectronic component is between the second face of the microelectronic component and the substrate, the microelectronic component includes conductive contacts at the first face of the microelectronic component, a first conductive contact of the conductive contacts of the microelectronic component is conductively coupled to the first conductive contact of the substrate, and a second conductive contact of the conductive contacts of the microelectronic component is conductively coupled, by an interconnect, to the second conductive contact of the bridge component;
wherein the interconnect includes a first layer including a first solder material and a second layer including a second solder material different from the first solder material, and wherein the first layer is in direct contact with and in between the second conductive contact of the microelectronic component and the second layer.

17. The electronic device of claim 16, wherein the interconnect is a first interconnect, the first conductive contact of the microelectronic component is conductively coupled to the first conductive contact of the substrate by a second interconnect, and the second interconnect includes a third layer including a third solder material and a fourth layer including a fourth solder material different from the third solder material, and wherein the third layer is in contact with and in between the first conductive contact of the microelectronic component and the fourth layer.

18. The electronic device of claim 16, wherein the substrate further includes a second conductive contact in the cavity, the bridge component includes a third conductive contact at an opposing second face of the bridge component, and the second conductive contact of the substrate is coupled to the third conductive contact of the bridge component by solder.

* * * * *